US008008418B2

(12) United States Patent
Morishita et al.

(10) Patent No.: US 8,008,418 B2
(45) Date of Patent: *Aug. 30, 2011

(54) HIGH-MOLECULAR COPOLYMER CONTAINING METAL COORDINATION COMPOUND AND ORGANIC ELECTROLUMINESCENCE ELEMENT USING THE SAME

(75) Inventors: Yoshii Morishita, Tsukuba (JP); Satoyuki Nomura, Tsukuba (JP); Yoshihiro Tsuda, Tsukuba (JP)

(73) Assignee: Hitachi Chemical Co., Ltd., Tokyo (JP)

(*) Notice: Subject to any disclaimer, the term of this patent is extended or adjusted under 35 U.S.C. 154(b) by 1233 days.

This patent is subject to a terminal disclaimer.

(21) Appl. No.: 10/561,019

(22) PCT Filed: Jun. 18, 2004

(86) PCT No.: PCT/JP2004/008950
§ 371 (c)(1),
(2), (4) Date: Dec. 16, 2005

(87) PCT Pub. No.: WO2004/113421
PCT Pub. Date: Dec. 29, 2004

(65) Prior Publication Data
US 2006/0287498 A1 Dec. 21, 2006

(30) Foreign Application Priority Data

| Jun. 18, 2003 | (JP) | 2003-173799 |
|---|---|---|
| Jun. 18, 2003 | (JP) | 2003-173874 |
| Jun. 18, 2003 | (JP) | 2003-173933 |
| Jun. 18, 2003 | (JP) | 2003-173986 |

(51) Int. Cl.
*C08G 79/00* (2006.01)
*C08G 73/00* (2006.01)
*C08G 61/12* (2006.01)
*C09K 11/06* (2006.01)
*H01L 51/50* (2006.01)
*H05B 33/14* (2006.01)

(52) U.S. Cl. ............ 528/9; 528/422; 528/425; 528/485; 528/373; 528/391; 528/229

(58) Field of Classification Search .............. 528/9, 422, 528/425, 485, 373, 391, 220
See application file for complete search history.

(56) References Cited

U.S. PATENT DOCUMENTS

| 5,244,992 A | 9/1993 | Yamamoto et al. |
| 5,367,038 A | 11/1994 | Yamamoto et al. |
| 5,648,448 A | 7/1997 | Marrocco, III et al. |
| 5,786,071 A | 7/1998 | Marrocco, III et al. |
| 6,006,101 A | 12/1999 | Sakamoto |
| 6,451,056 B1 | 9/2002 | Cumming |
| 2002/0193532 A1 | 12/2002 | Ikehira et al. |
| 2003/0050696 A1 | 3/2003 | Cumming |
| 2003/0068535 A1* | 4/2003 | Takiguchi et al. ............ 428/704 |
| 2003/0129448 A1 | 7/2003 | Lin et al. |
| 2003/0224208 A1* | 12/2003 | Kamatani et al. ............ 428/690 |
| 2004/0243232 A1 | 12/2004 | Cumming |
| 2007/0003783 A1 | 1/2007 | Morishita et al. |
| 2007/0027299 A1 | 2/2007 | Morishita et al. |
| 2007/0128466 A1 | 6/2007 | Nomura et al. |

FOREIGN PATENT DOCUMENTS

| CN | 1374315 A | 10/2002 |
| JP | 4-302230 A | 10/1992 |
| JP | 5-70565 A | 3/1993 |
| JP | 8-319482 | 12/1996 |
| JP | 9-83427 A | 3/1997 |
| JP | 9-136954 A | 5/1997 |
| JP | 10-223372 A | 8/1998 |
| JP | 11-242994 A | 9/1999 |
| JP | 11-256148 | 9/1999 |
| JP | 11-313370 A | 11/1999 |
| JP | 11-329739 | 11/1999 |
| JP | 2002-134277 A | 5/2002 |
| JP | 2002-216956 A | 8/2002 |
| JP | 2002-317033 | 10/2002 |
| JP | 2002-332291 | 11/2002 |
| JP | 2002-359079 A | 12/2002 |
| JP | 2003-73480 A | 3/2003 |
| JP | 2003-734480 | 3/2003 |
| JP | 2003-171659 A | 6/2003 |
| JP | 2003-277444 A | 10/2003 |
| JP | 2003-332075 A | 11/2003 |
| JP | 2004-067658 A | 3/2004 |
| JP | 2005-023070 A | 1/2005 |
| JP | 2006-523231 A | 10/2006 |
| WO | WO 90/13148 | 11/1990 |
| WO | WO 02/44189 | 6/2002 |
| WO | 2004/085450 A2 | 10/2004 |
| WO | 2004/092245 A1 | 10/2004 |
| WO | 2004/092246 A1 | 10/2004 |
| WO | 2005/092245 A1 | 10/2005 |

OTHER PUBLICATIONS

Claims 1-12 of U.S. Appl. No. 10/559,774.*
Igor Sokolik et al.; "Blue light electroluminescence prom p-phenylene vinylene-based copolymers"; J. Appl. Phys, vol. 74, No. 5, Sep. 1, 1993, pp. 3584-3586.
M. A. Baldo et al.; "Very high-efficiency green organic light-emitting devices based on electrophosphorencence", Applied Physics Letters, vol. 75, No. 1, Jul. 5, 1999, pp. 4-6.
Taiwanese Office Action dated Apr. 30, 2009, issued in corresponding Taiwanese Patent Application No. 093117614.
Japanese Office Action dated May 19 2009, issued in corresponding Japanese Patent Application No. 2004-180126.
Japanese Office Action dated May 19 2009, issued in corresponding Japanese Patent Application No. 2004-180137.
Japanese Office Action dated May 19 2009, issued in corresponding Japanese Patent Application No. 2004-180147.
Japanese Office Action dated May 19 2009, issued in corresponding Japanese Patent Application No. 2004-180158.
Japanese Office Action dated Jan. 5, 2010, issued in corresponding Japanese Application No. 2004-171704.
Japanese Office Action dated Jan. 5, 2010, issued in corresponding Japanese Application No. 2004-171228.
Japanese Office Action dated Jun. 1, 2010, issued in corresponding Japanese patent Application No. 2004-171194.
Japanese Office Action dated Aug. 31, 2010, issued in corresponding Japanese Patent Application No. 2004-171194.
Chinese Office Action dated Jun. 8, 2007, issued in corresponding Chinese Application No. 200480015847.1.

* cited by examiner

*Primary Examiner* — Duc Truong

(74) *Attorney, Agent, or Firm* — Westerman, Hattori, Daniels & Adrian, LLP

(57) ABSTRACT

It is an object of the present invention to provide a copolymer containing a metal coordination compound that has blue phosphorescence emission with excellent color purity and, furthermore, to provide a copolymer containing a metal coordination compound that has luminescence of various colors from blue to red and a long operating life. The present invention relates to a metal coordination compound-containing copolymer that contains a metal coordination compound monomer unit represented by any one of Formulae (1) to (12):

(1)

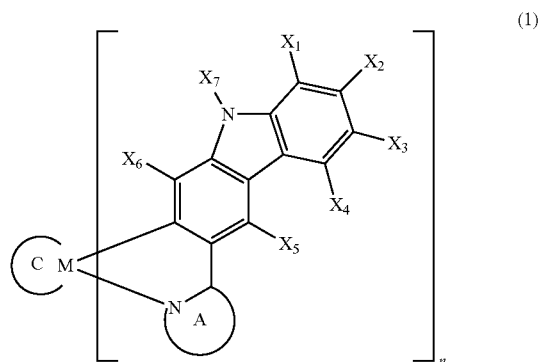

(2)

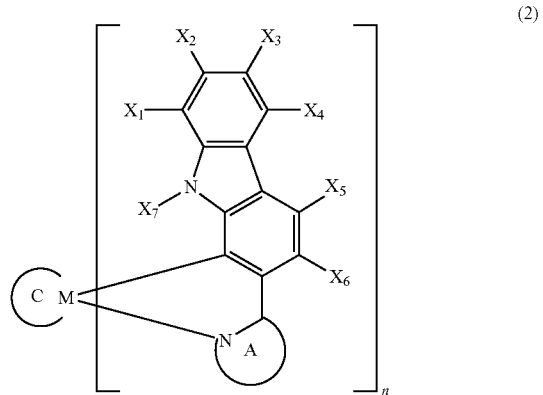

(3)

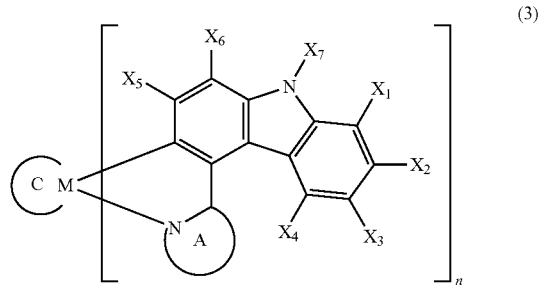

(4)

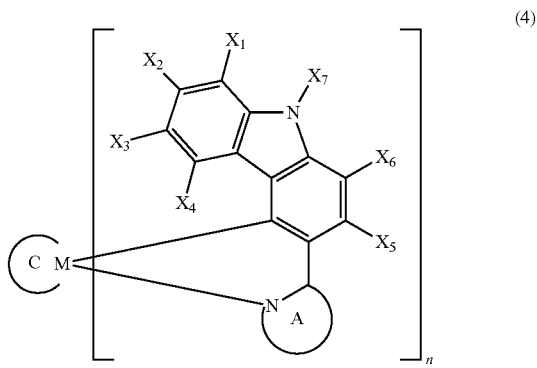

(5)

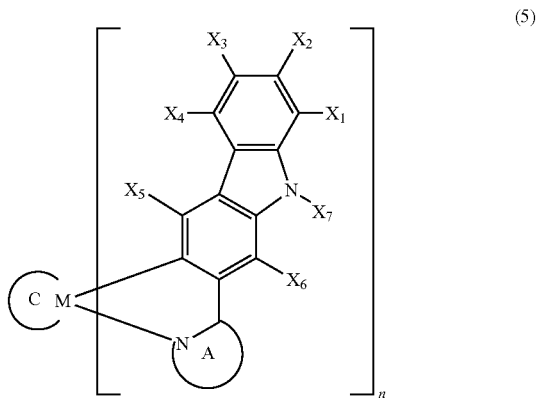

(6)

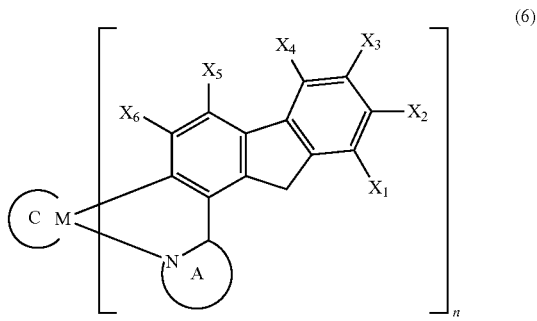

(7)

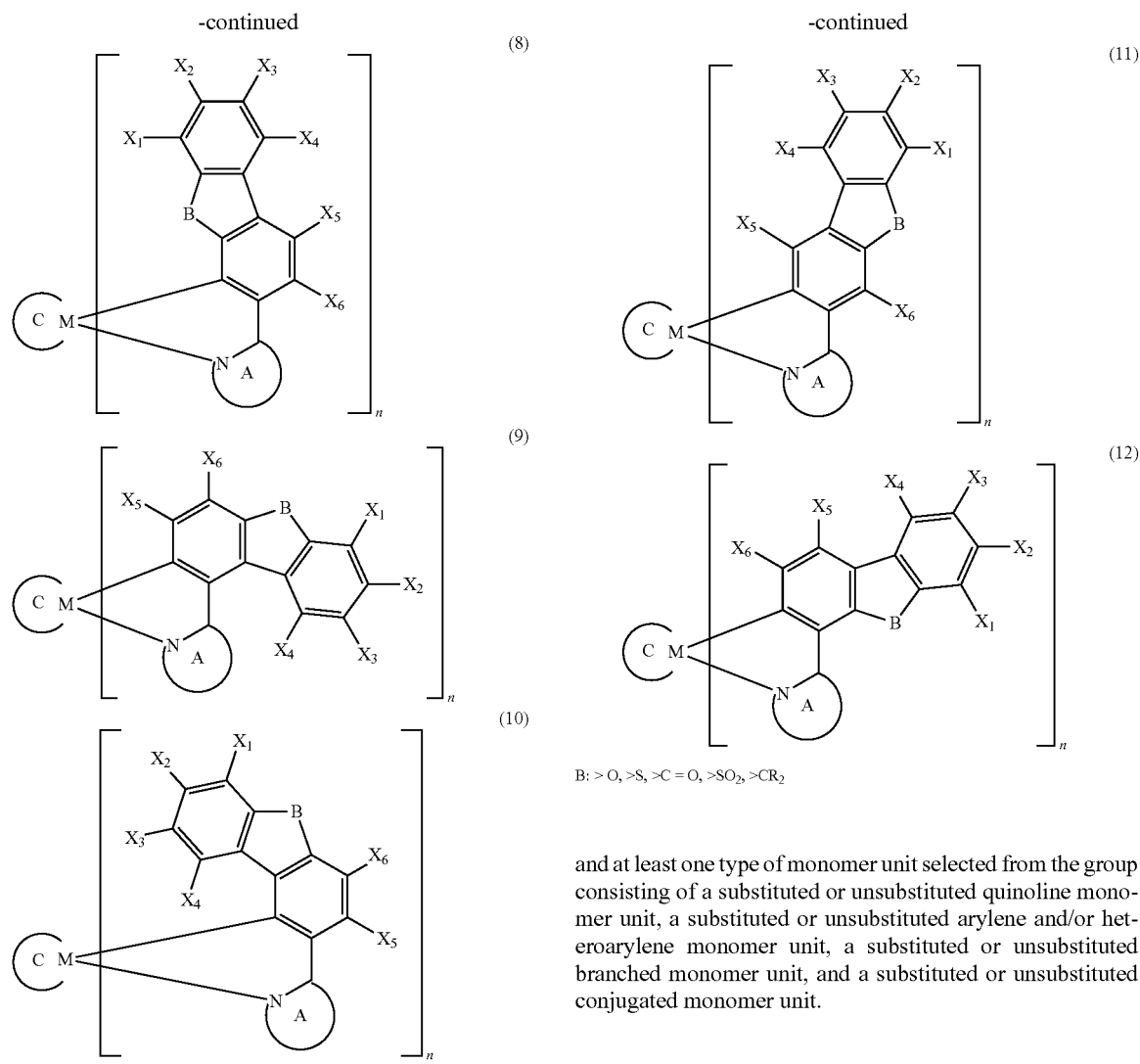

B: >O, >S, >C=O, >SO$_2$, >CR$_2$ and at least one type of monomer unit selected from the group consisting of a substituted or unsubstituted quinoline monomer unit, a substituted or unsubstituted arylene and/or heteroarylene monomer unit, a substituted or unsubstituted branched monomer unit, and a substituted or unsubstituted conjugated monomer unit.

12 Claims, No Drawings

HIGH-MOLECULAR COPOLYMER CONTAINING METAL COORDINATION COMPOUND AND ORGANIC ELECTROLUMINESCENCE ELEMENT USING THE SAME

TECHNICAL FIELD

The present invention relates to a novel metal coordination compound-containing copolymer and an organic electroluminescent (EL) device employing same.

BACKGROUND ART

In recent years, electroluminescent devices have been attracting attention as, for example, large-area solid-state light sources to replace incandescent lamps and gas-filled lamps. They have also been attracting attention as self-luminous displays, and are the most promising alternative to liquid crystal displays in the flat panel display (FPD) field. In particular, an organic electroluminescent (EL) device, in which the device material is formed from an organic material, is being commercialized as a low power consumption full-color FPD. Above all, polymer-based organic EL devices will be indispensable for future large-screen organic EL displays since the organic material of the polymer-based organic EL devices is formed from a polymer material for which film formation by printing, ink-jet, etc. is simple compared with low molecular weight-based organic EL devices, which require film formation in a vacuum system.

Conventionally, polymer-based organic EL devices employ either a conjugated polymer such as poly(p-phenylene-vinylene) (see e.g. International Publication WO90/13148) or a non-conjugated polymer (see e.g. I. Sokolik, et al., J. Appl. Phys. 1993. 74, 3584) as the polymer material. However, their luminescence lifetime when used in a device is short, which gives rise to problems when constructing a full-color display.

With the object of solving these problems, polymer-based organic EL devices employing various types of polyfluorene-based and poly(p-phenylene)-based conjugated polymers have been proposed in recent years, but they are not satisfactory in terms of stability.

As one means for solving this problem, a device utilizing phosphorescence from an excited triplet has been investigated. If phosphorescence from an excited triplet can be utilized, it can be expected that in principle the luminescence quantum yield would be at least three times that obtained when fluorescence from an excited singlet is utilized. Furthermore, while taking into consideration utilization of an exciton resulting from intersystem crossing from the singlet, which has high energy, to the triplet, it can be expected that in principle the luminescence quantum yield would be four times greater, that is, it would be 100%.

Examples of research that has been carried out so far include M. A. Baldo et al., Appl. Phys. Left. 1999, 75, 4. In this publication, the materials below are used. The materials are abbreviated as follows.

Alq$_3$: an aluminum-quinolinol complex (tris(8-quinolinolato)aluminum)
α-NPD: N,N'-Di-naphthalen-1-yl-N,N'-diphenyl-biphenyl-4,4'-diamine
CBP: 4,4'-N,N'-dicarbazole-biphenyl
BCP: 2,9-dimethyl-4,7-diphenyl-1,10-phenanthroline
Ir(ppy)$_3$: iridium-phenylpyridine complex (tris(2-phenylpyridine)iridium)

Examples in which luminescence from a triplet is utilized include Japanese Patent Application Laid-open Nos. 11-329739, 11-256148, and 8-319482.

DISCLOSURE OF INVENTION

While taking into consideration the above-mentioned conventional problems, it is an object of the present invention to provide a copolymer containing a metal coordination compound that has blue to red phosphorescence emission with excellent color purity and, furthermore, to provide a copolymer containing a metal coordination compound that has luminescence of various colors from blue to red and a long operating life.

Furthermore, it is another object of the present invention to provide a polymer composition that has blue to red phosphorescence emission with excellent color purity and, furthermore, to provide a polymer composition that has luminescence of various colors from blue to red and a long operating life.

Moreover, it is yet another object of the present invention to provide an organic electroluminescent device that has light emission of various colors from blue to red and excellent luminescence characteristics, reliability, etc.

As a result of an intensive investigation by the present inventors, it has been found that a copolymer containing a metal coordination compound having as ligands various substituents introduced thereinto is an excellent material that has blue to red luminescence and a long operating life, and the present invention has thus been accomplished.

That is, in accordance with the present invention, there is provided a metal coordination compound-containing copolymer comprising a metal coordination compound monomer unit represented by any one of Formulae (1) to (12):

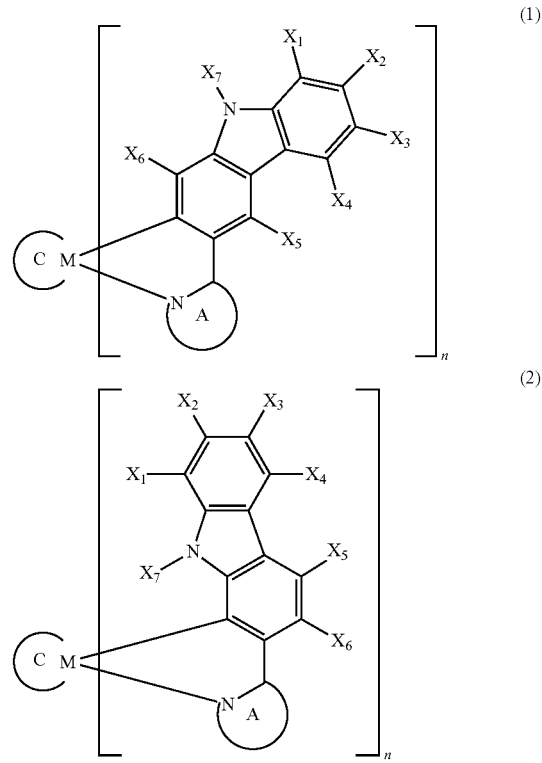

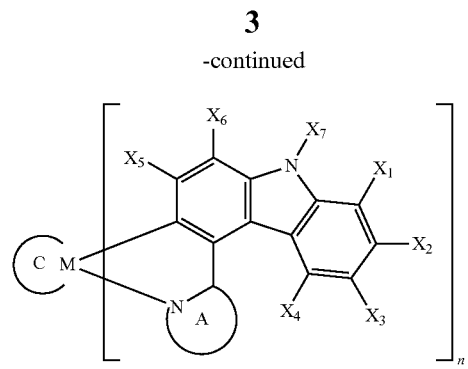 (3)
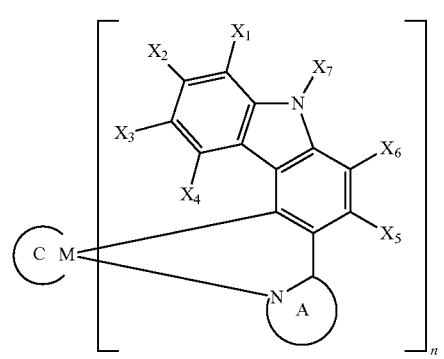 (4)
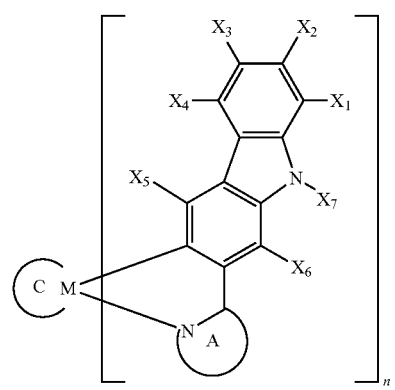 (5)
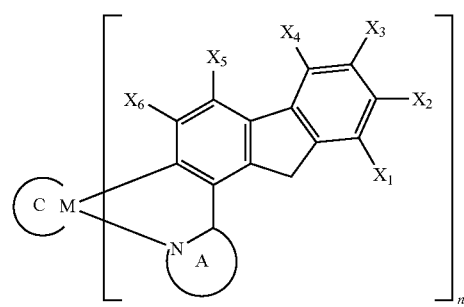 (6)
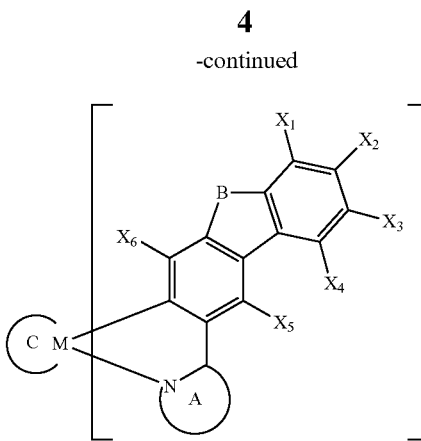 (7)
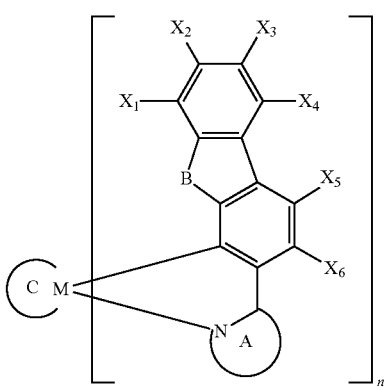 (8)
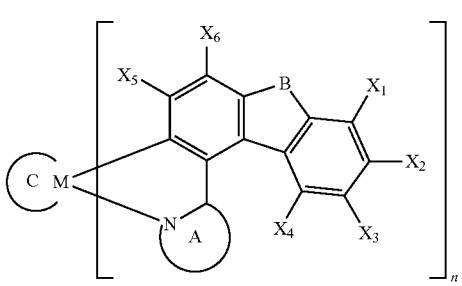 (9)
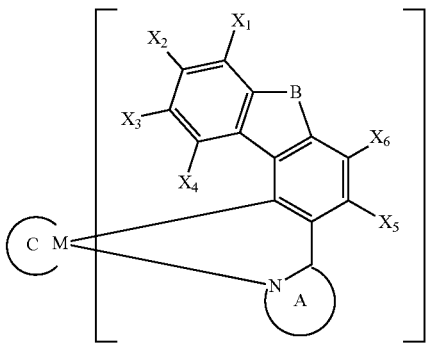 (10)

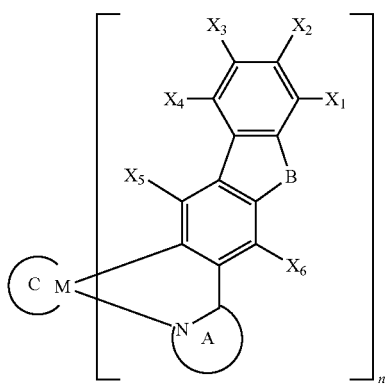

(11)

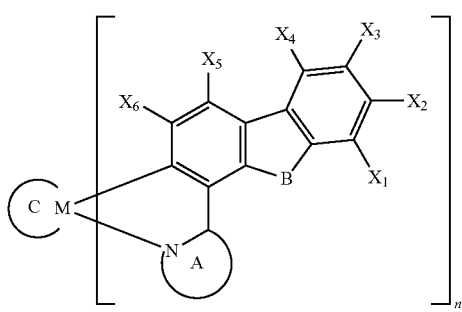

(12)

B: >O, >S, >C=O, >SO₂, >CR₂

(in the formulae, M is Ir, Rh, Ru, Os, Pd, or Pt, and n is 1 or 2; ring A is a cyclic compound containing a nitrogen atom bonded to M; $X_1$ to $X_7$ and R are independently substituents selected from the group consisting of —R¹, —OR², —SR³, —OCOR⁴, —COOR⁵, —SiR⁶R⁷R⁸, and —NR⁹R¹⁰ (here, R¹ to R¹⁰ are a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C30 aryl group, a C2 to C30 heteroaryl group, or a C7 to C30 aralkyl group, or a corresponding halogen-substituted aryl group, halogen-substituted heteroaryl group, or halogen-substituted aralkyl group, in which a part or all of the hydrogen atoms are substituted by a halogen atom, and R¹ to R¹⁰ may be identical to or different from each other), $X_1$ to $X_7$ may be identical to or different from each other, and ring A may have a substituent that is the same as the groups defined by $X_1$ to $X_7$; ring C is a compound that is bonded to M and that bonds to a linking group; and ring C may have a substituent that is the same as the groups defined by $X_1$ to $X_7$); and at least one type of monomer unit selected from the group consisting of a substituted or unsubstituted quinoline monomer unit, a substituted or unsubstituted arylene and/or heteroarylene monomer unit, a substituted or unsubstituted branched monomer unit, and a substituted or unsubstituted conjugated monomer unit.

Furthermore, preferably, there is provided a metal coordination compound-containing copolymer, wherein the copolymer comprises a metal coordination compound monomer unit represented by any one of the Formulae (1) to (12), a substituted or unsubstituted quinoline monomer unit represented by Formulae (13-1):

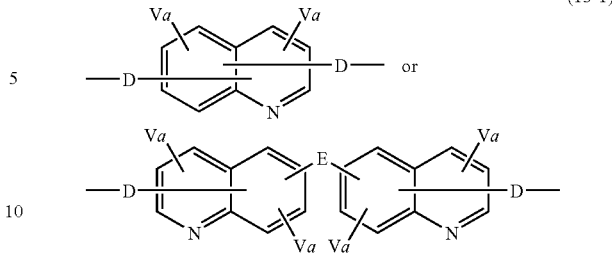

(13-1)

(in the formulae, a plurality of V are independently substituents selected from the group consisting of —R¹, —OR², —SR³, —OCOR⁴, —COOR⁵, and —SiR⁶R⁷R⁸ (here, R¹ to R⁸ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene; and E is a divalent linking group selected from the group consisting of a single bond, —O—, —S—, —C(O)—, —S(O)—, —S(O₂)—, —W—, —(—O—W—)m-O— (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra'C(O)—Ra—, —Ar'—C(O)—Ar'—, -Het'-, —Ar'—S—Ar'—, —Ar'—S(O)—Ar'—, —Ar'—S(O₂)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and a substituted or unsubstituted arylene and/or heteroarylene monomer unit, the monomer units each being bonded via a linking group represented by Formula (14):

-(G)b- (14)

(in the formula, G is a divalent group selected from the group consisting of —O—, —R—O—R—, —S—, —NR—, —CR₂—, —SiR₂—, —SiR₂—O—SiR₂—, and —SiR₂—O—SiR₂—O—SiR₂— (here, R is a C1 to C22 straight-chain, cyclic, or branched alkyl group, or a C2 to C30 aryl or heteroaryl group), and b is an integer of 0 or 1).

Moreover, preferably, there is provided a metal coordination compound-containing copolymer, wherein the copolymer comprises a metal coordination compound monomer unit represented by any one of the Formulae (1) to (12), a substituted or unsubstituted quinoline monomer unit represented by Formulae (13-1):

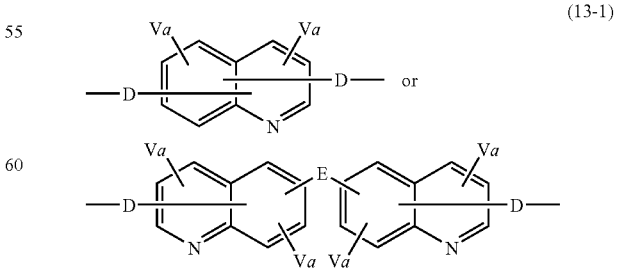

(13-1)

(in the formulae, a plurality of V are independently substituents selected from the group consisting of —R¹, —OR², —SR³, —OCOR⁴, —COOR⁵, and —SiR⁶R⁷R⁸ (here, R¹ to R⁸ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene; and E is a divalent linking group selected from the group consisting of a single bond, —O—, —S—, —C(O)—, —S(O)—, —S(O₂)—, —W—, —(—O—W—)m-O— (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'-, —Ar'—S—Ar'—, —Ar'—S(O)—Ar'—, —Ar'—S(O₂)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and a substituted or unsubstituted branched monomer unit, the monomer units each being bonded via a linking group represented by Formula (14):

-(G)b-  (14)

(in the formula, G is a divalent group selected from the group consisting of —O—, —R—O—R—, —S—, —NR—, —CR₂—, —SiR₂—, —SiR₂—O—SiR₂—, and —SiR₂—O—SiR₂—O—SiR₂— (here, R is a C1 to C22 straight-chain, cyclic, or branched alkyl group, or a C2 to C30 aryl or heteroaryl group), and b is an integer of 0 or 1).

Furthermore, preferably, there is provided a metal coordination compound-containing copolymer, wherein the copolymer comprises a metal coordination compound monomer unit represented by any one of the Formulae (1) to (12), and a substituted or unsubstituted conjugated monomer unit represented by Formula (13-2):

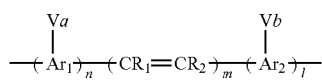
(13-2)

(in the formula, Ar₁ and Ar₂ are divalent arylene and/or heteroarylene; a plurality of V, and R₁ and R₂, are independently substituents selected from the group consisting of —R¹, —OR², —SR³, —OCOR⁴, —COOR⁵, and —SiR⁶R⁷R⁸ (here, R¹ to R⁸ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; R₁ and R₂ may independently be a hydrogen atom; n, m, and l are independently 0 or 1, and n, m, and l are not simultaneously 0), the monomer units each being bonded via a linking group represented by Formula (14):

-(G)b-  (14)

(in the formula, G is a divalent group selected from the group consisting of —O—, —R—O—R—, —S—, —NR—, —CR₂—, —SiR₂—, —SiR₂—O—SiR₂—, and —SiR₂—O—SiR₂—O—SiR₂— (here, R is a C1 to C22 straight-chain, cyclic, or branched alkyl group, or a C2 to C30 aryl or heteroaryl group), and b is an integer of 0 or 1).

Moreover, preferably, there is provided a metal coordination compound-containing copolymer, wherein the copolymer comprises a metal coordination compound monomer unit represented by any one of the Formulae (1) to (12), a substituted or unsubstituted conjugated monomer unit represented by Formula (13-2):

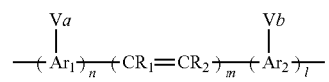
(13-2)

(in the formula, Ar₁ and Ar₂ are divalent arylene and/or heteroarylene; a plurality of V, and R₁ and R₂, are independently substituents selected from the group consisting of —R¹, —OR², —SR³, —OCOR⁴, —COOR⁵, and —SiR⁶R⁷R⁸ (here, R¹ to R⁸ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; R1 and R2 may independently be a hydrogen atom; n, m, and l are independently 0 or 1, and n, m, and l are not simultaneously 0), and a substituted or unsubstituted branched monomer unit, the monomer units each being bonded via a linking group represented by Formula (14):

-(G)b-  (14)

(in the formula, G is a divalent group selected from the group consisting of —O—, —R—O—R—, —S—, —NR—, —CR₂—, —SiR₂—, —SiR₂—O—SiR₂—, and —SiR₂—O—SiR₂—O—SiR₂— (here, R is a C1 to C22 straight-chain, cyclic, or branched alkyl group, or a C2 to C30 aryl or heteroaryl group), and b is an integer of 0 or 1).

Furthermore, preferably, there is provided the metal coordination compound-containing copolymer wherein the substituted or unsubstituted branched monomer unit is a branched monomer unit selected from the group consisting of Formulae (15):

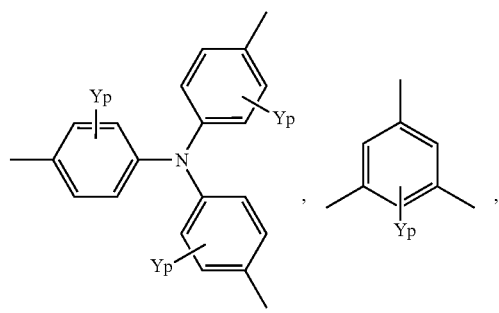

(15)
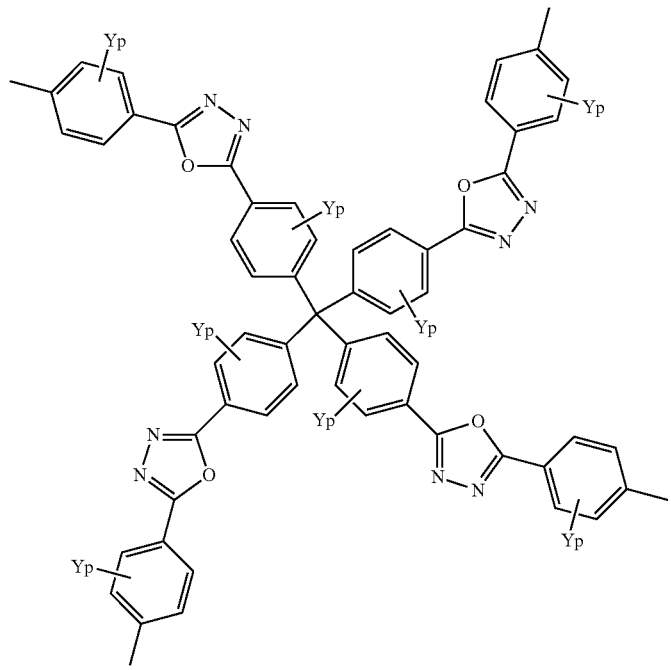
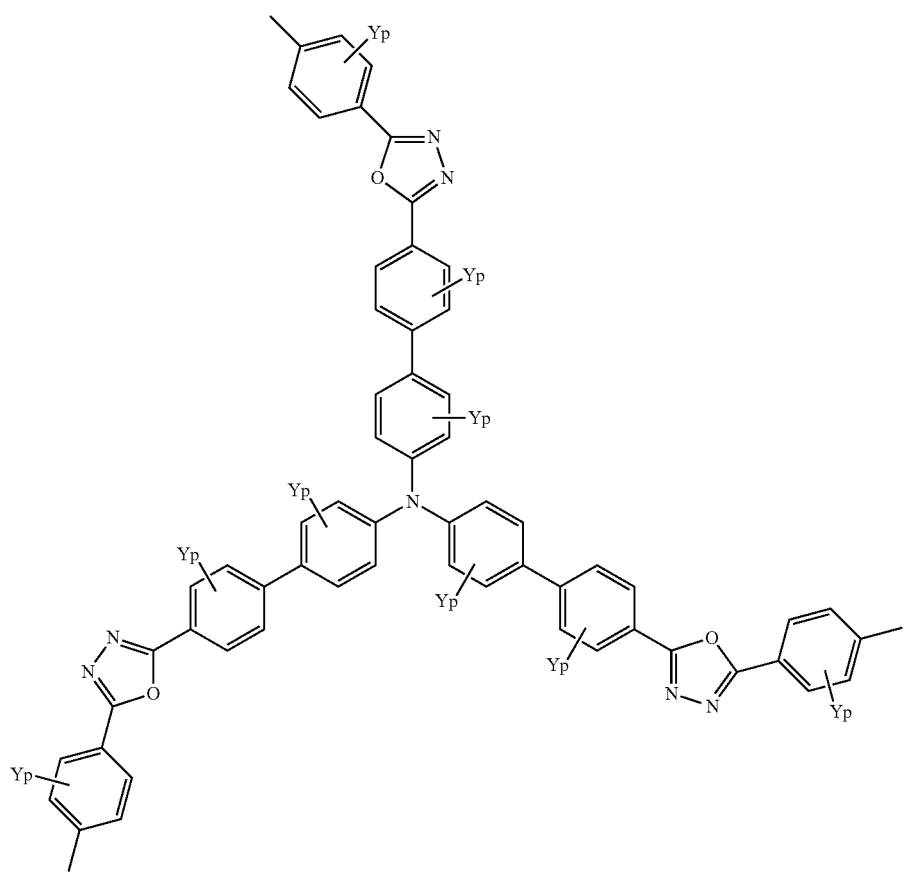
or

-continued

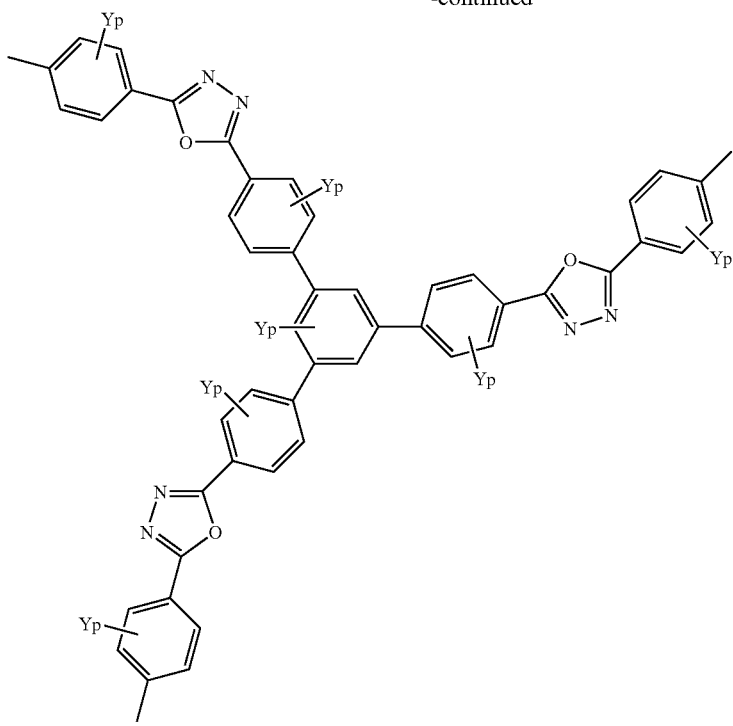

(in the formulae, a plurality of Y are substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of a benzene ring having a branched skeleton, and p is an integer of 0 to 4).

Moreover, there is provided a polymer composition comprising a mixture of the metal coordination compound-containing copolymer and a conjugated or non-conjugated polymer.

Furthermore, there is provided an organic electroluminescent device fabricated using the metal coordination compound-containing copolymer or the polymer composition.

The disclosures of the present invention relate to subject matter described in Japanese Patent Application Nos. 2003-173799, 2003-173874, 2003-173933, and 2003-173986 filed on Jun. 18, 2003, and the contents of the disclosures therein are incorporated herein by reference.

BEST MODE FOR CARRYING OUT THE INVENTION

With regard to organic EL, in order to obtain blue to red phosphorescence emission, it is necessary to change the energy level of the lowest excited state. It is surmised that, since the lifetime of an excited triplet state is generally longer than that of an excited singlet, and a molecule remains in the high energy state for a long period of time, a reaction with a surrounding material, a change in the structure of the molecule itself, a reaction between excitons themselves, etc. occurs, and the conventional phosphorescence emission device has a short operating life.

Under such circumstances, the present inventors have carried out various investigations, and as a result it has been found that a copolymer containing a metal coordination compound monomer unit represented by Formulae (1) to (12) below can serve as a phosphorescent light-emitting material that has a blue to red phosphorescence emission and a long operating life.

Formulae (1) to (12):

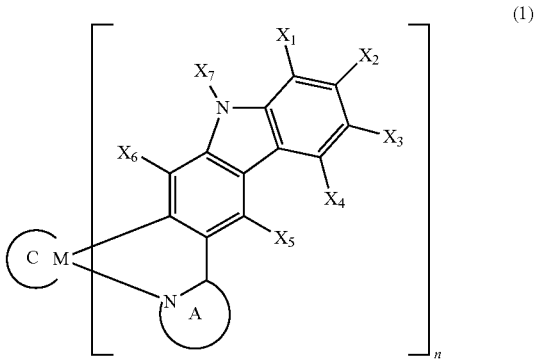

(1)

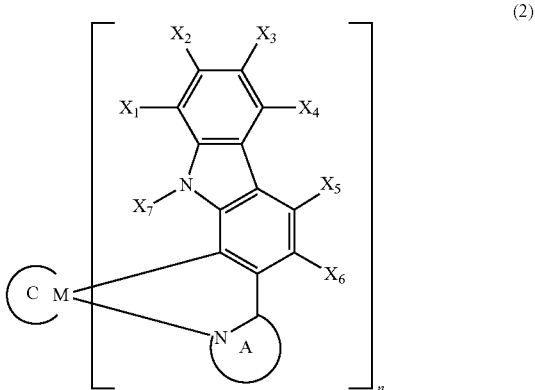

(2)

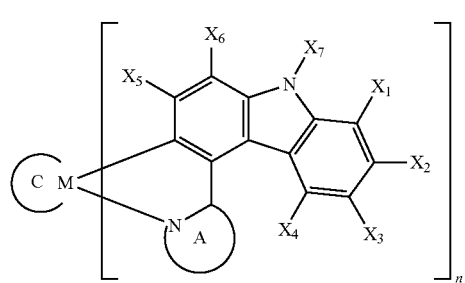
(3)
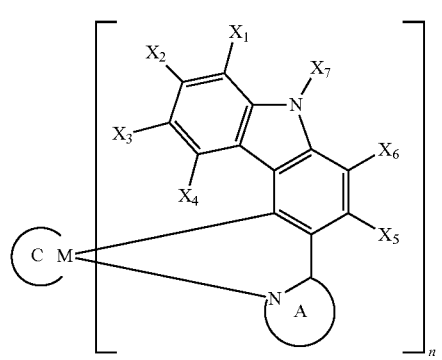
(4)
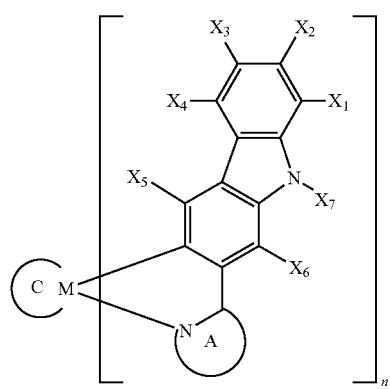
(5)
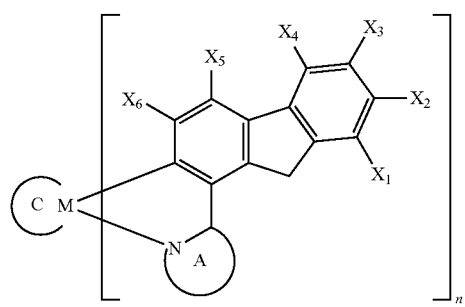
(6)
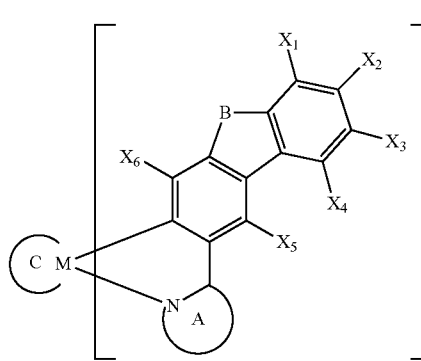
(7)
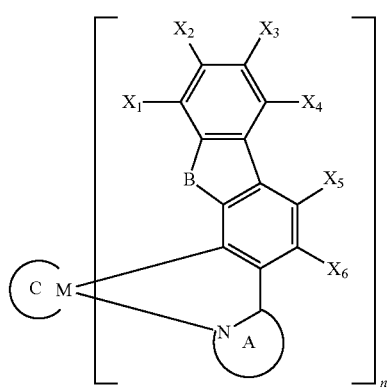
(8)
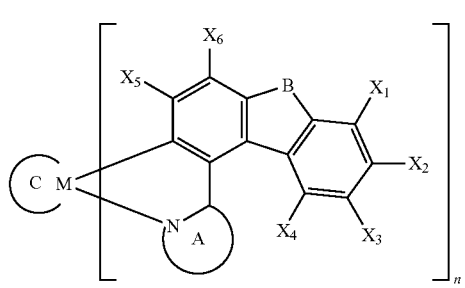
(9)
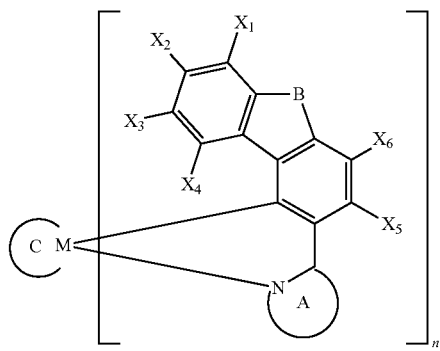
(10)

-continued

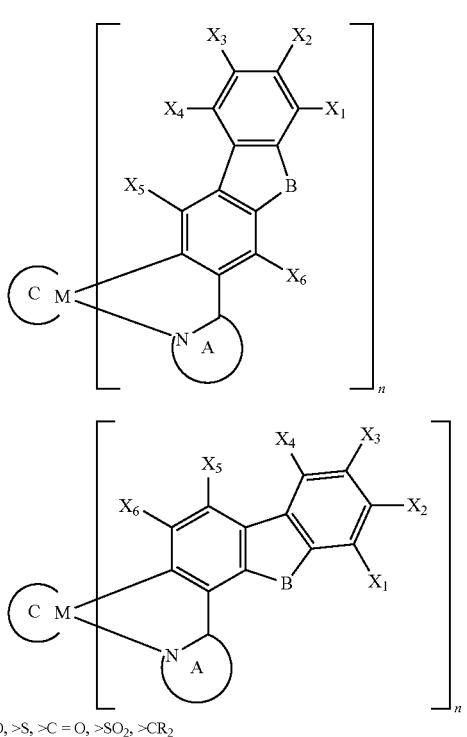

B: >O, >S, >C=O, >SO$_2$, >CR$_2$ (in the formulae, M is Ir, Rh, Ru, Os, Pd, or Pt, and n is 1 or 2; ring A is a cyclic compound containing a nitrogen atom bonded to M; $X_1$ to $X_7$ and R are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ are a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C30 aryl group, a C2 to C30 heteroaryl group, or a C7 to C30 aralkyl group, or a corresponding halogen-substituted aryl group, halogen-substituted heteroaryl group, or halogen-substituted aralkyl group, in which a part or all of the hydrogen atoms are substituted by a halogen atom, and $R^1$ to $R^{10}$ may be identical to or different from each other), $X_1$ to $X_7$ may be identical to or different from each other, and ring A may have a substituent that is the same as the groups defined by $X_1$ to $X_7$; ring C is a compound that is bonded to M and that bonds to a linking group; and ring C may have a substituent that is the same as the groups defined by $X_1$ to $X_7$). Here, $R^1$ to $R^{10}$ in $X_1$ to $X_7$ and R of the metal coordination compound monomer units may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may be further substituted with a halogen atom, a methyl group, etc.

Examples of the substituents $X_1$ to $X_7$ and R are listed below, but the present invention is not limited thereto.

Examples of —$R^1$ include a hydrogen atom, a halogen atom such as a fluorine atom, a chlorine atom, a bromine atom, or an iodine atom, a cyano group, a nitro group, a methyl group, an ethyl group, a propyl group, an isopropyl group, a cyclopropyl group, a butyl group, an isobutyl group, a tert-butyl group, a cyclobutyl group, a pentyl group, an isopentyl group, a neopentyl group, a cyclopentyl group, a hexyl group, a cyclohexyl group, a heptyl group, a cycloheptyl group, an octyl group, a nonyl group, a decyl group, a phenyl group, a tolyl group, a xylyl group, a mesityl group, a cumenyl group, a benzyl group, a phenethyl group, a methylbenzyl group, a diphenylmethyl group, a styryl group, a cinnamyl group, a biphenyl residue, a terphenyl residue, a naphthyl group, an anthryl group, a fluorenyl group, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, a quinoxaline residue, and derivatives thereof substituted with a halogen such as a fluorine atom, a chlorine atom, a bromine atom, or an iodine atom.

Examples of —$OR^2$ include a hydroxyl group, a methoxy group, an ethoxy group, a propoxy group, a butoxy group, a tert-butoxy group, an octyloxy group, a tert-octyloxy group, a phenoxy group, a 4-tert-butylphenoxy group, a 1-naphthyloxy group, a 2-naphthyloxy group, and a 9-anthryloxy group.

Examples of —$SR^3$ include a mercapto group, a methylthio group, an ethylthio group, a tert-butylthio group, a hexylthio group, an octylthio group, a phenylthio group, a 2-methylphenylthio group, and a 4-tert-butylphenylthio group.

Examples of —$OCOR^4$ include a formyloxy group, an acetoxy group, and an benzoyloxy group.

Examples of —$COOR^5$ include a carboxyl group, a methoxycarbonyl group, an ethoxycarbonyl group, a tert-butoxycarbonyl group, a phenoxycarbonyl group, and a naphthyloxycarbonyl group.

Examples of —$SiR^6R^7R^8$ include a silyl group, a trimethylsilyl group, a triethylsilyl group, and a triphenylsilyl group.

Examples of —$NR^9R^{10}$ include an amino group, an N-methylamino group, an N-ethylamino group, an N,N-dimethylamino group, an N,N-diethylamino group, an N,N-diisopropylamino group, an N,N-dibutylamino group, an N-benzylamino group, an N,N-dibenzylamino group, an N-phenylamino group, and an N,N-diphenylamino group.

The metal coordination compounds used in the present invention have phosphorescent light emission, and it is thought that the lowest excited state is either a triplet MLCT (Metal-to-Ligand charge transfer) excited state or a π-π* excited state. Phosphorescent light emission occurs when there is a transition from such a state to the ground state.

The phosphorescence quantum yield of light-emitting materials of the present invention is as high as 0.1 to 0.9, and the phosphorescence lifetime is 1 to 60 μs. Short phosphorescence lifetime is a requirement for achieving a high luminescence efficiency when used as an organic EL device. That is, if the phosphorescence lifetime is long, the proportion of molecules in an excited triplet state is high, and the luminescence efficiency decreases due to T-T annihilation when the current density is high. Since the metal coordination compound-containing copolymer of the present invention has high phosphorescence emission efficiency and a short luminescence lifetime, it is suitable as a light-emitting material for an organic EL device.

Furthermore, with regard to the metal coordination compound-containing copolymer, the energy level of its lowest excited state can be changed by variously changing the substituents on the metal coordination compound monomer units represented by Formulae (1) to (12), and it is suitable as an organic EL light-emitting material having blue to red light emission.

In the metal coordination compound monomer units represented by Formulae (1) to (12) above, M is preferably iridium.

Moreover, ring A is preferably any one of the cyclic compounds having the structures shown below, is more preferably pyridine, quinoline, benzoxazole, benzothiazole, benzimidazole, benzotriazole, imidazole, pyrazole, oxazole, thiazole, triazole, benzopyrazole, triazine, or isoquinoline, which may have a substituent that is the same as the groups defined by $X_1$ to $X_7$ (hereinafter collectively referred to as substituents Xn), and is yet more preferably pyridine, quinoline, or isoquinoline.

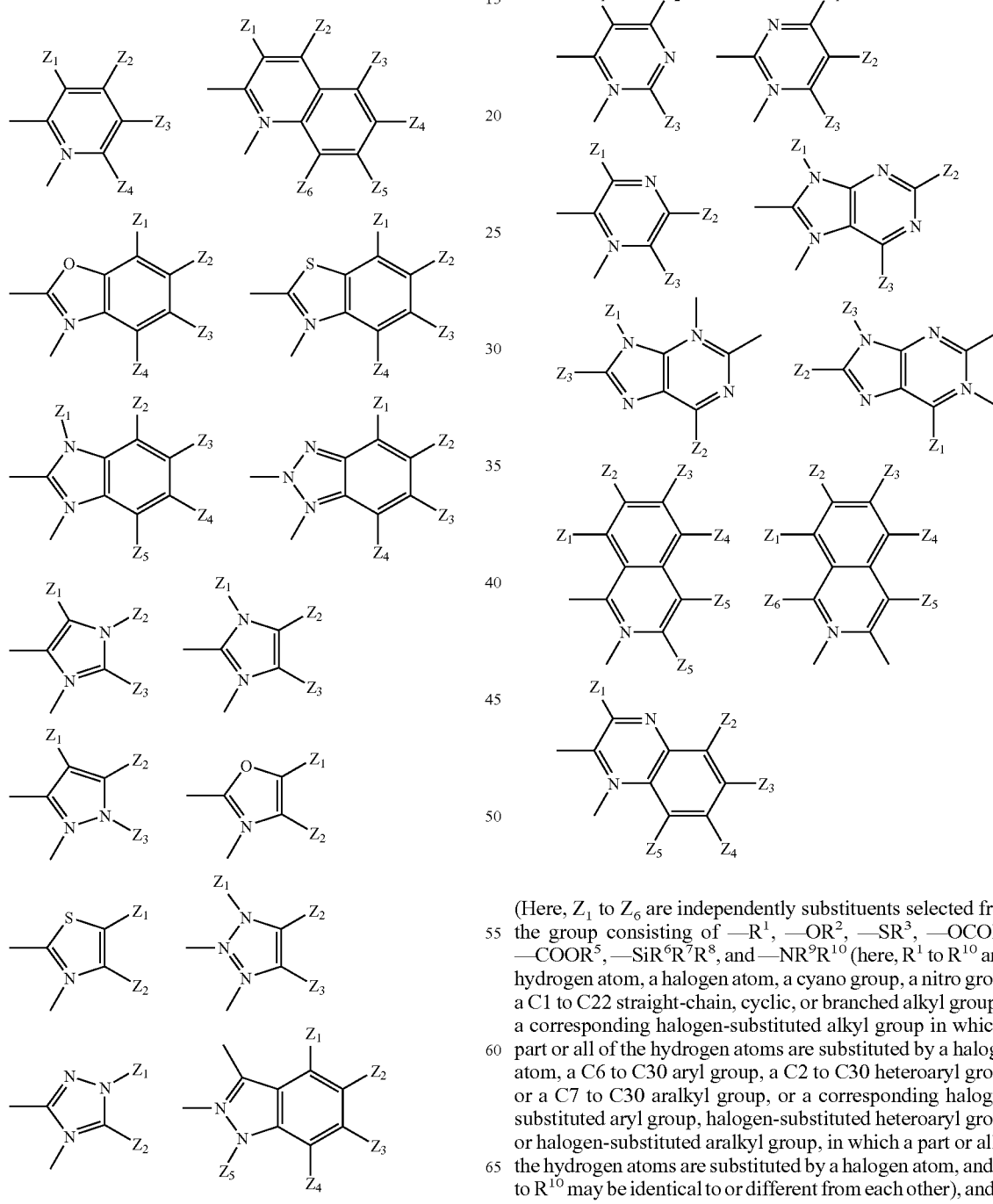

(Here, $Z_1$ to $Z_6$ are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ are a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C30 aryl group, a C2 to C30 heteroaryl group, or a C7 to C30 aralkyl group, or a corresponding halogen-substituted aryl group, halogen-substituted heteroaryl group, or halogen-substituted aralkyl group, in which a part or all of the hydrogen atoms are substituted by a halogen atom, and $R^1$ to $R^{10}$ may be identical to or different from each other), and $Z_1$ to $Z_6$ may be identical to or different from each other.) Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may be further substituted with a halogen atom, a methyl group, etc.

Furthermore, ring C, which is another ligand bonded to Metal M, is a bidentate ligand that may have a substituent that is the same as the group defined by $X_1$ to $X_7$, and is bonded to Metal M to form a ring. Ring C is preferably any of the compounds having the structures shown below.

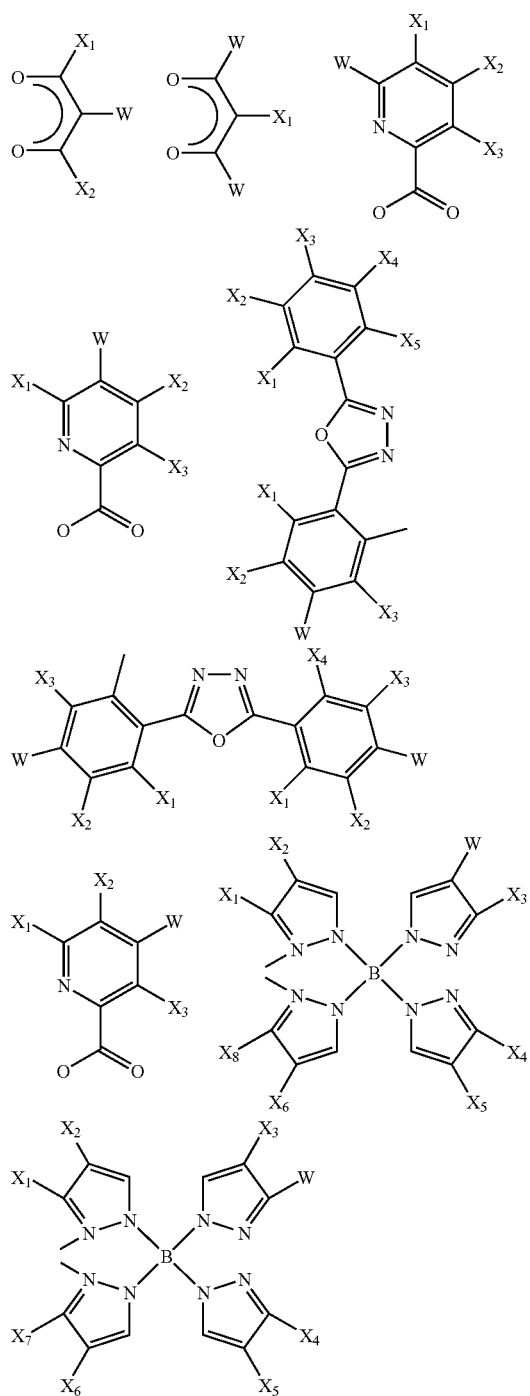

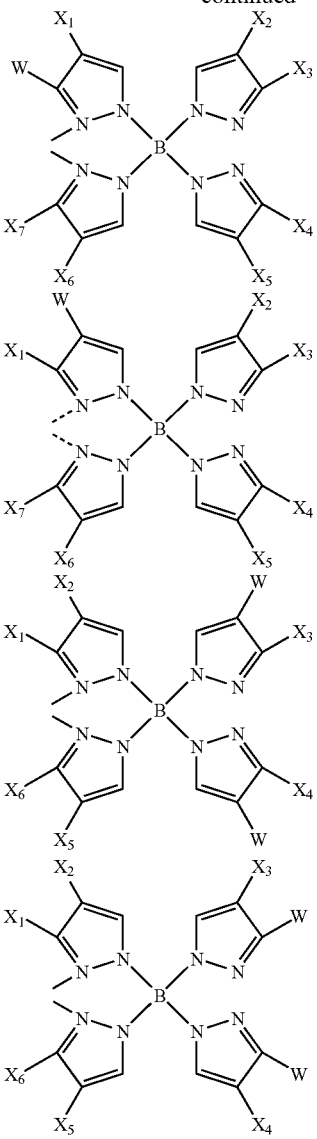

W is a divalent to hexavalent group that reacts with another monomer unit to form a copolymer, and is preferably divalent or trivalent. Examples of W include divalent to hexavalent groups that are the same substituents as $X_1$ to $X_8$ below and can be bonded to a linking group represented by Formula (14).

$X_1$ to $X_8$ are substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ are a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C30 aryl group, a C2 to C30 heteroaryl group, or a C7 to C30 aralkyl group, or a corresponding halogen-substituted aryl group, halogen-substituted heteroaryl group, or halogen-substituted aralkyl group, in which a part or all of the hydrogen atoms are substituted by a halogen atom, and $R^1$ to $R^{10}$ may be identical to or different from each other), and $X_1$ to $X_8$ may be identical to or different from each other). Here, $R^1$ to $R^{10}$ may have a substituent, and examples of the substituent include a halogen atom, a cyano group, an aldehyde group, an amino group, an alkyl group, an alkoxy group, an alkylthio group, a carboxyl group, a sulfonic acid group, and a nitro group. These substituents may be further substituted with a halogen atom, a methyl group, etc.

(Detailed Description of Method for Synthesizing Metal Coordination Compound Monomer Unit)

The method for synthesizing a monomer unit used in the present invention is explained in detail below with reference to specific examples.

The metal coordination compound monomer unit used for the metal coordination compound-containing copolymer of the present invention can be produced by various synthetic methods known to a person skilled in the art. For example, a method described in S. Lamansky et al., J. Am. Chem. Soc. 2001, 123 can be employed. One example of a synthetic route for a metal coordination compound monomer unit represented by Formulae (1) to (12) above (a case in which ring A is a substituted pyridine) is illustrated using an iridium coordination compound monomer unit as an example. The explanation below concerns (2) in Table 1 below, and other example compounds can also be synthesized by substantially the same method.

(Synthesis of Ligand $L_1$)

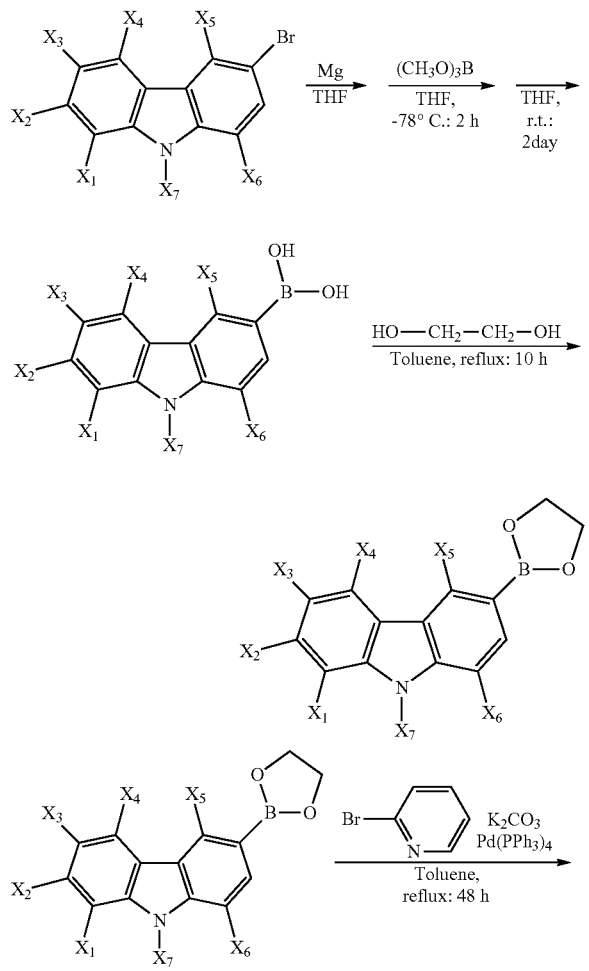

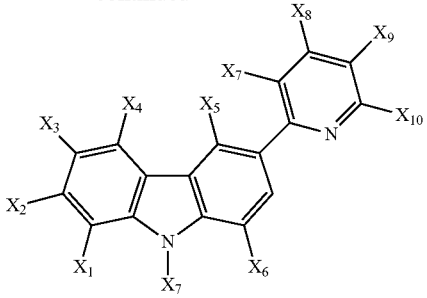

(Synthesis of Iridium Complex Monomer Unit)

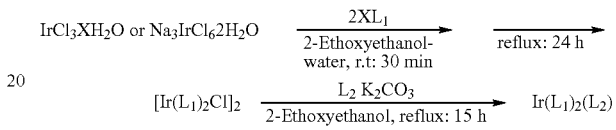

$$[\text{Ir}(L_1)_2\text{Cl}]_2 \xrightarrow[\text{2-Ethoxyethanol, reflux: 15 h}]{L_2 \; K_2CO_3} \text{Ir}(L_1)_2(L_2)$$

Here, $L_2$ is a ring C compound that is bonded to Metal M (iridium in the above-mentioned case) and is bonded to a linking group.

Preferred embodiments of the metal coordination compound monomer unit in the present invention are shown below.

For example, with regard to the metal coordination compound monomer units represented by Formulae (1) to (6) above, when a blue light-emitting material is to be obtained, at least one of the substituents Xn and the substituents of ring A defined as being the same as Xn is, from the viewpoint of it being effective in reducing the wavelength of light emission, preferably a halogen atom, a cyano group, or a halogen-substituted alkyl group, more preferably a fluorine atom, a chlorine atom, a cyano group, or a trifluoromethyl group, yet more preferably a fluorine atom or a trifluoromethyl group, and most preferably a fluorine atom. When at least one of the substituents Xn and the substituents of ring A defined as being the same as Xn is any one of the above-mentioned substituents, the other Xn are often hydrogen atoms, but may be another substituent. For example, $X_7$ is preferably an alkyl group or a halogen-substituted alkyl group.

Furthermore, for example, in the metal coordination compound monomer units represented by Formulae (1) to (6) above, when a green to red light-emitting material is to be obtained, at least one of the substituents Xn and the substituents of ring A defined as being the same as Xn is preferably —R, —OR, or —SR from the viewpoint of it being easy to control the emission color so that it is green to red. When at least one of the substituents Xn and the substituents of ring A defined as being the same as Xn is any one of the above-mentioned substituents, the other Xn are often hydrogen atoms, but may be another substituent. For example, $X_7$ is preferably an alkyl group, an aryl group, or a heteroaryl group.

Moreover, for example, in the metal coordination compound monomer units represented by Formulae (7) to (12) above, when a blue light-emitting material is to be obtained, it is preferable to use a compound in which B is >C=O or >SO$_2$. When a green to red emission wavelength is to be obtained, B is preferably >O, >S, or >CR$_2$. Furthermore, in Formulae (7) to (12) above, at least one of the substituents Xn and the substituents of ring A defined as being the same as Xn is, from the viewpoint of a blue emission color being obtained, preferably a halogen atom, a cyano group, or a halogen-substituted alkyl group, more preferably a fluorine atom, a chlorine atom, a cyano group, or a trifluoromethyl group, yet more preferably a fluorine atom or a trifluoromethyl group, and most preferably a fluorine atom. It is also preferably —R, —OR, or —SR from the viewpoint of it being easy to control the emission color so that it is blue to red. When at least one of the substituents Xn and the substituents of ring A defined as being the same as Xn is any one of the above-mentioned substituents, the other Xn are often hydrogen atoms, but may be another substituent.

Among the metal coordination compounds represented by Formulae (1) to (6) above, the metal coordination compounds represented by Formulae (1), or (4) are preferable from the viewpoint of ease of synthesis. Among the metal coordination compounds represented by Formulae (7) to (12) above, the metal coordination compounds represented by Formulae (8) or (11) are preferable from the viewpoint of ease of synthesis.

As specific examples of the metal coordination compound monomer unit, example compounds are shown below, but they should not be construed as being limited thereto.
(Examples of Metal Coordination Compounds)

TABLE 1
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (1) | Ir | 2 | 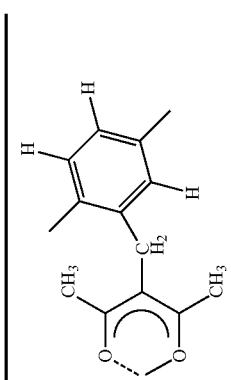 | $CH_3$ | 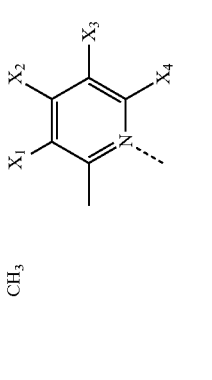 | H | H | H | H | 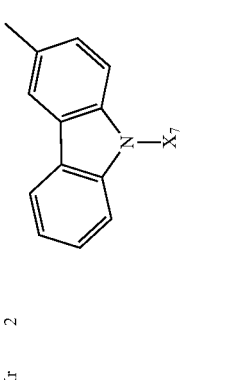 |
| (2) | Ir | 2 | 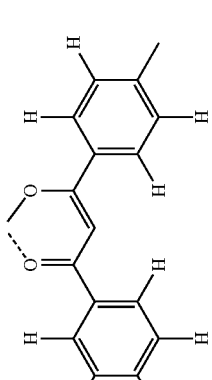 | $CH_3$ | 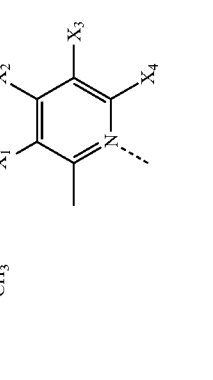 | H | H | H | H | 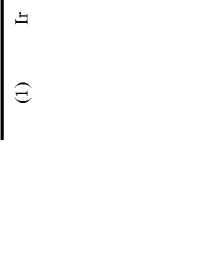 |
| (3) | Ir | 2 | 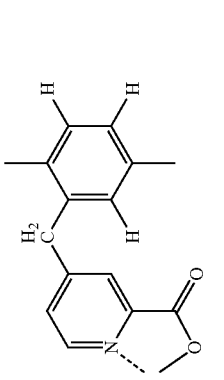 | $CH_3$ | 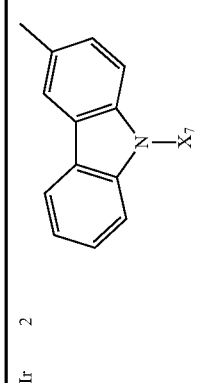 | H | H | H | H |  |
| (4) | Ir | 2 | 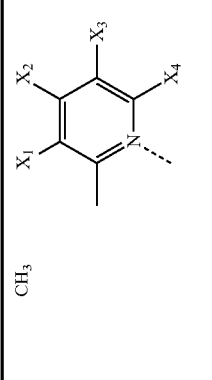 | $C_2H_5$ | 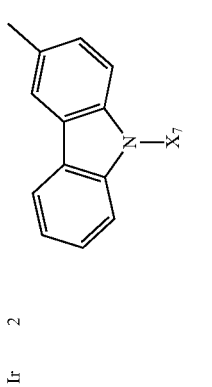 | H | $CF_3$ | H | H | 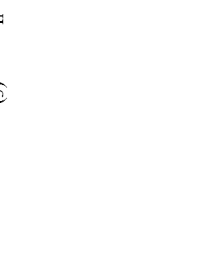 |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (5) | Ir | 2 | | $C_2H_5$ | | H | $CF_3$ | H | H | |
| (6) | Ir | 2 | | $C_2H_5$ | | H | $CF_3$ | H | H | |
| (7) | Ir | 2 | | $C_2H_5$ | | H | H | $CF_3$ | H | |
| (8) | Ir | 2 | | $C_2H_5$ | | H | H | $CF_3$ | H | |

TABLE 1-continued

| No | M | n | Carbazole unit | X$_7$ | Ring A | X$_1$ | X$_2$ | X$_3$ | X$_4$ | Ring C (L$_2$) |
|---|---|---|---|---|---|---|---|---|---|---|
| (9) | Ir | 2 | | C$_2$H$_5$ | | H | H | CF$_3$ | H | |
| (10) | Ir | 2 | | C$_2$H$_5$ | | H | H | NO$_2$ | H | |
| (11) | Ir | 2 | | C$_2$H$_5$ | | H | H | NO$_2$ | H | |
| (12) | Ir | 2 | | C$_2$H$_5$ | | H | H | NO$_2$ | H | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (13) | Ir | 2 | 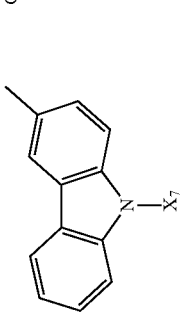 | $C_2H_5$ | 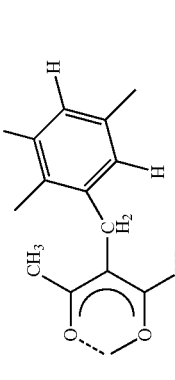 | H | H | F | H | 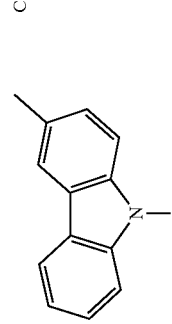 |
| (14) | Ir | 2 | 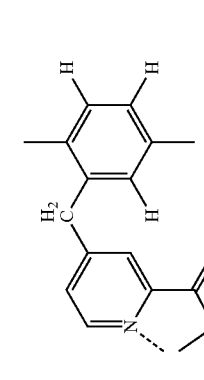 | $C_2H_5$ | 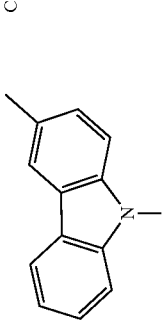 | H | H | F | H | 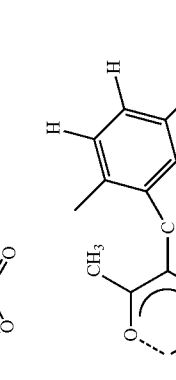 |
| (15) | Ir | 2 | 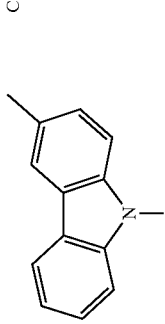 | $C_2H_5$ | | H | H | F | H |  |
| (16) | Ir | 2 | | $C_2H_5$ | | H | H | CN | H | |

TABLE 1-continued

| No | M | n | Carbazole unit | X₇ | Ring A | X₁ | X₂ | X₃ | X₄ | Ring C (L₂) |
|---|---|---|---|---|---|---|---|---|---|---|
| (17) | Ir | 2 | [carbazole with methyl] | C₂H₅ | [pyridyl ring with X₁–X₄, methyl] | H | H | CN | H | [dibenzoylmethane-type with methyl groups] |
| (18) | Ir | 2 | [carbazole with methyl] | C₂H₅ | [pyridyl ring with X₁–X₄, methyl] | H | H | CN | H | [methyl benzoate with CH₂ linker] |
| (19) | Ir | 2 | [carbazole with methyl] | CH₂CF₃ | [pyridyl ring with X₁–X₄, methyl] | H | H | H | H | [xylyl-CH₂-acac] |
| (20) | Ir | 2 | [carbazole with methyl] | CH₂CF₃ | [acac with CH₂-xylyl] | H | H | H | H | [dibenzoylmethane-type with methyl groups] |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (21) | Ir | 2 | | $CH_2CF_3$ | | H | H | H | H | |
| (22) | Ir | 2 | | $CH_2CF_3$ | | H | $CF_3$ | H | H | |
| (23) | Ir | 2 | | $CH_2CF_3$ | | H | $CF_3$ | H | H | |
| (24) | Ir | 2 | | $CH_2CF_3$ | | H | $CF_3$ | H | H | |

TABLE 1-continued

| No | M | n | Carbazole unit | X₇ | Ring A | $X_1$ | $X_2$ | $X_3$ | $X_4$ | Ring C (L₂) |
|---|---|---|---|---|---|---|---|---|---|---|
| (25) | Ir | 2 | [carbazole structure] | CH₂CF₃ | [Ring A structure] | H | H | CF₃ | H | [Ring C structure] |
| (26) | Ir | 2 | [carbazole structure] | CH₂CF₃ | [Ring A structure] | H | H | CF₃ | H | [Ring C structure] |
| (27) | Ir | 2 | [carbazole structure] | CH₂CF₃ | [Ring A structure] | H | H | CF₃ | H | [Ring C structure] |
| (28) | Ir | 2 | [carbazole structure] | CH₂CF₃ | [Ring A structure] | H | H | NO₂ | H | [Ring C structure] |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (29) | Ir | 2 | | $CH_2CF_3$ | | H | H | $NO_2$ | H | |
| (30) | Ir | 2 | | $CH_2CF_3$ | | H | H | $NO_2$ | H | |
| (31) | Ir | 2 | | $CH_2CF_3$ | | H | H | F | H | |
| (32) | Ir | 2 | | $CH_2CF_3$ | | H | H | F | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (33) | Ir | 2 | | $CH_2CF_3$ | | H | H | F | H | |
| (34) | Ir | 2 | | $CH_2CF_3$ | | H | H | CN | H | |
| (35) | Ir | 2 | | $CH_2CF_3$ | | H | H | CN | H | |
| (36) | Ir | 2 | | $CH_2CF_3$ | | H | H | CN | H | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (37) | Ir | 2 | 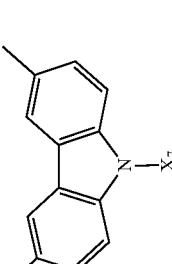 | $CH_3$ | 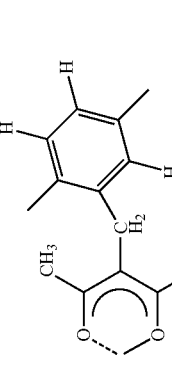 | H | H | H | H | 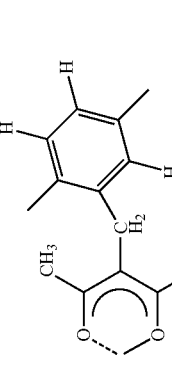 |
| (38) | Ir | 2 | 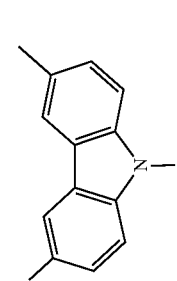 | $CH_3$ | 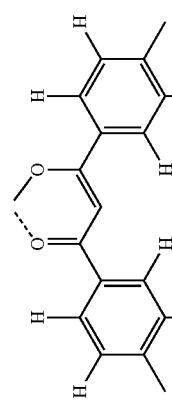 | H | H | H | H | 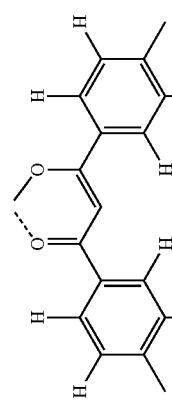 |
| (39) | Ir | 2 | 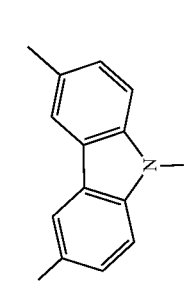 | $CH_3$ | 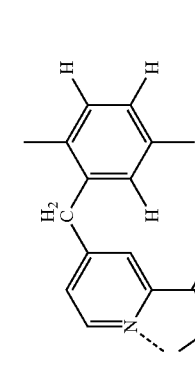 | H | H | H | H | 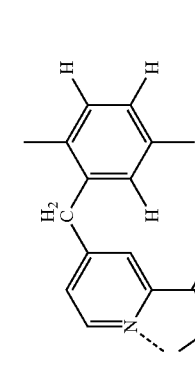 |
| (40) | Ir | 2 | 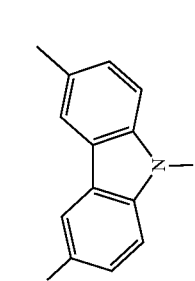 | $CH_3$ | 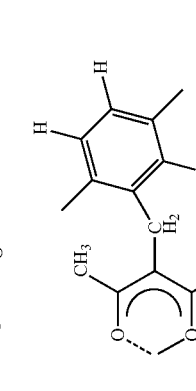 | H | $CF_3$ | H | H | 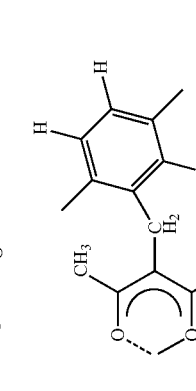 |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (41) | Ir | 2 | 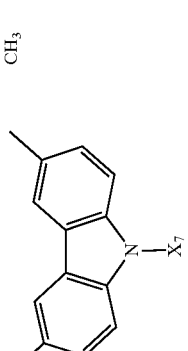 | $CH_3$ | 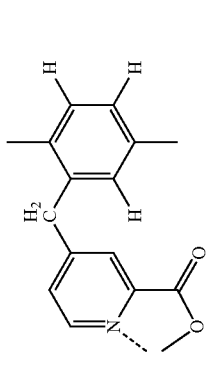 | H | $CF_3$ | H | H | 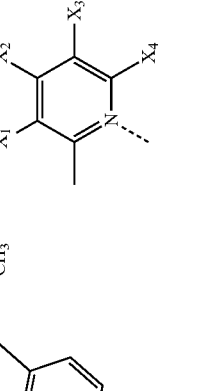 |
| (42) | Ir | 2 | 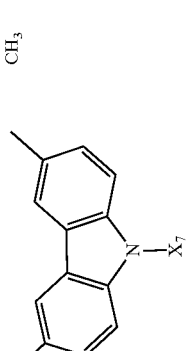 | $CH_3$ | 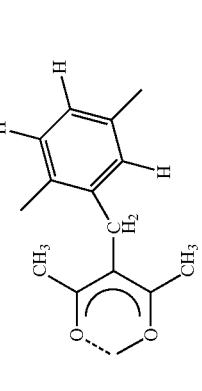 | H | $CF_3$ | H | H | 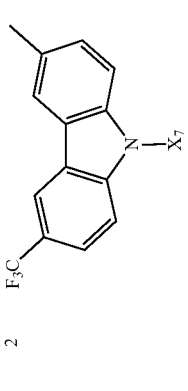 |
| (43) | Ir | 2 | 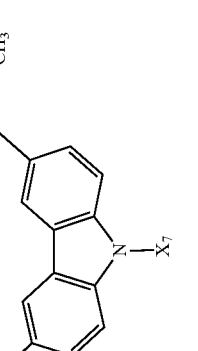 | $CH_3$ | 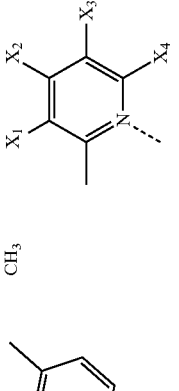 | H | H | $CF_3$ | H | 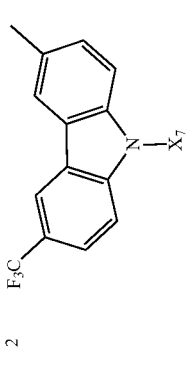 |
| (44) | Ir | 2 | 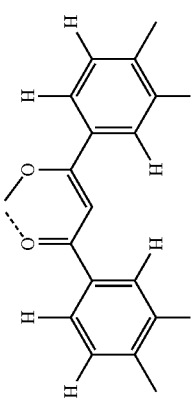 | $CH_3$ | 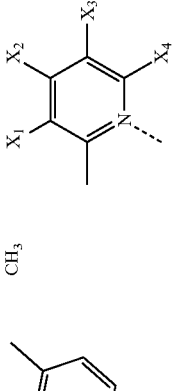 | H | H | $CF_3$ | H | 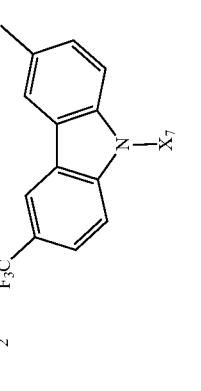 |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (45) | Ir | 2 | | $CH_3$ | | H | H | $CF_3$ | H | |
| (46) | Ir | 2 | | $CH_3$ | | H | H | $NO_2$ | H | |
| (47) | Ir | 2 | | $CH_3$ | | H | H | $NO_2$ | H | |
| (48) | Ir | 2 | | $CH_3$ | | H | H | F | H | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (49) | Ir | 2 | 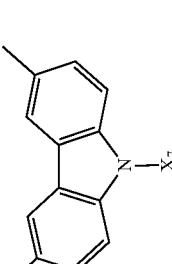 | $CH_3$ | 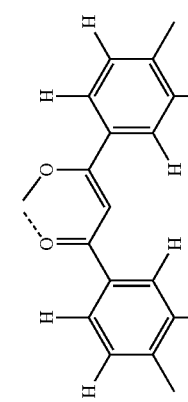 | H | H | F | H | 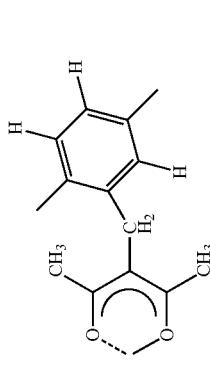 |
| (50) | Ir | 2 | 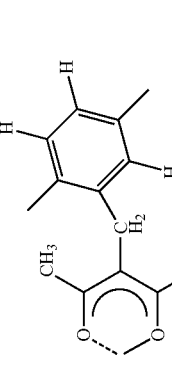 | $CH_3$ | 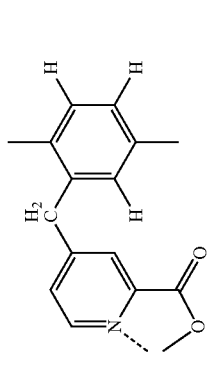 | H | H | F | H | 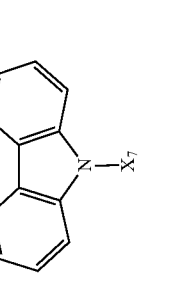 |
| (51) | Ir | 2 | 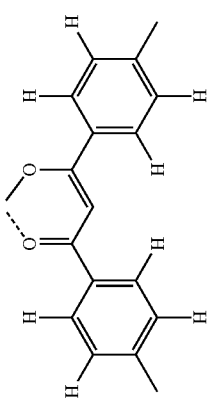 | $CH_3$ | 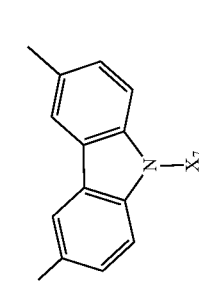 | H | H | F | H | 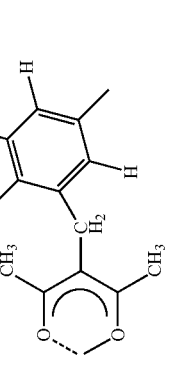 |
| (52) | Ir | 2 | 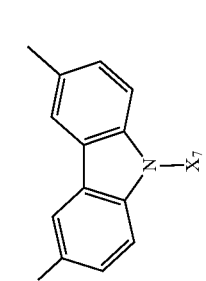 | $CH_3$ | 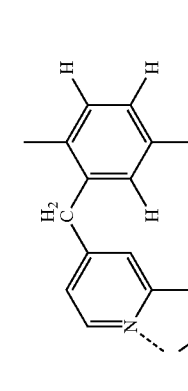 | H | H | CN | H |  |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (53) | Ir | 2 | | $CH_3$ | | H | H | CN | H | |
| (54) | Ir | 2 | | $CH_3$ | | H | H | CN | H | |
| (55) | Ir | 2 | | $CH_2CF_3$ | | H | H | H | H | |
| (56) | Ir | 2 | | $CH_2CF_3$ | | H | H | H | H | |

TABLE 1-continued

| No | M | n | Carbazole unit | X₇ | Ring A | X₁ | X₂ | X₃ | X₄ | Ring C (L₂) |
|---|---|---|---|---|---|---|---|---|---|---|
| (57) | Ir | 2 | 3,6-di-substituted carbazole (F₃C-, CH₃-) | CH₂CF₃ | phenyl with X₁–X₄ | H | H | H | H | methyl pyridinecarboxylate via CH₂–O linkage |
| (58) | Ir | 2 | 3,6-di-substituted carbazole (F₃C-, CH₃-) | CH₂CF₃ | phenyl with X₁–X₄ | H | CF₃ | H | H | 2,2,6,6-tetramethyl-3,5-heptanedionate |
| (59) | Ir | 2 | 3,6-di-substituted carbazole (F₃C-, CH₃-) | CH₂CF₃ | phenyl with X₁–X₄ | H | CF₃ | H | H | dibenzoylmethanate |
| (60) | Ir | 2 | 3,6-di-substituted carbazole (F₃C-, CH₃-) | CH₂CF₃ | phenyl with X₁–X₄ | H | CF₃ | H | H | methyl pyridinecarboxylate via CH₂–O linkage |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (61) | Ir | 2 | 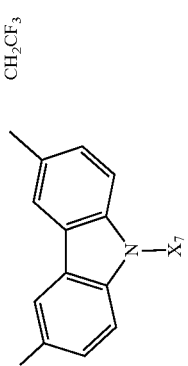 | $CH_2CF_3$ | 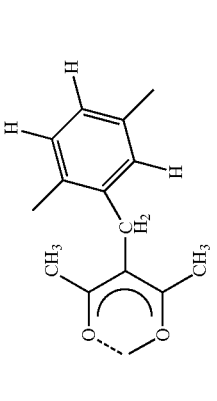 | H | H | $CF_3$ | H | 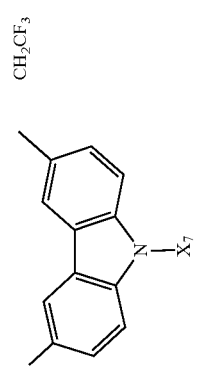 |
| (62) | Ir | 2 | 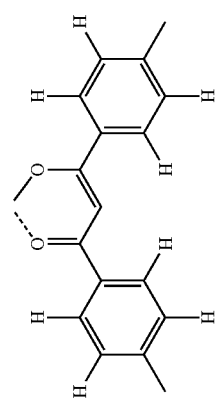 | $CH_2CF_3$ | 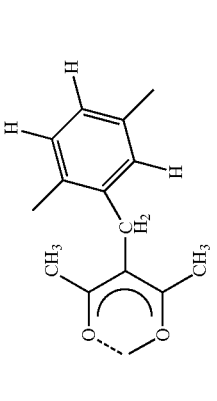 | H | H | $CF_3$ | H | 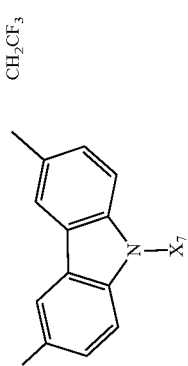 |
| (63) | Ir | 2 | 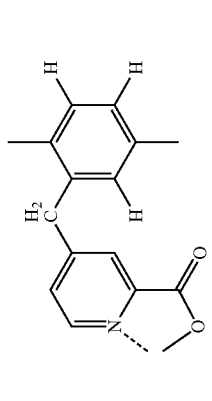 | $CH_2CF_3$ | 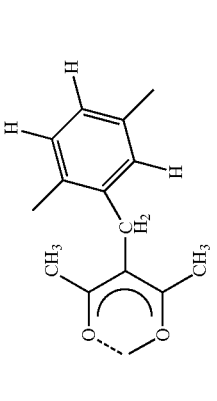 | H | H | $CF_3$ | H | 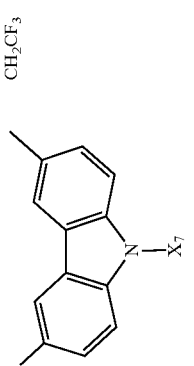 |
| (64) | Ir | 2 | 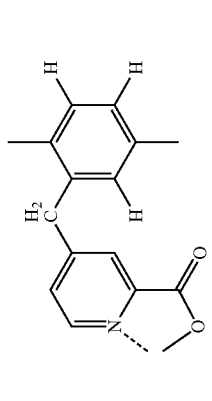 | $CH_2CF_3$ | 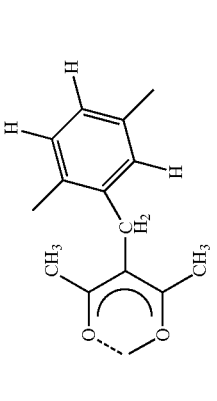 | H | H | $NO_2$ | H | 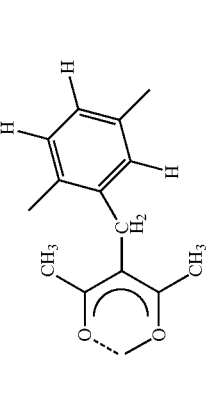 |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (65) | Ir | 2 | | $CH_2CF_3$ | | H | H | $NO_2$ | H | |
| (66) | Ir | 2 | | $CH_2CF_3$ | | H | H | $NO_2$ | H | |
| (67) | Ir | 2 | | $CH_2CF_3$ | | H | H | F | H | |
| (68) | Ir | 2 | | $CH_2CF_3$ | | H | H | F | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (69) | Ir | 2 | | $CH_2CF_3$ | | H | H | F | H | |
| (70) | Ir | 2 | | $CH_2CF_3$ | | H | H | CN | H | |
| (71) | Ir | 2 | | $CH_2CF_3$ | | H | H | CN | H | |
| (72) | Ir | 2 | | $CH_2CF_3$ | | H | H | CN | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (73) | Ir | 2 | | t-$C_4H_9$ | | H | H | H | H | |
| (74) | Ir | 2 | | t-$C_4H_9$ | | H | H | H | H | |
| (75) | Ir | 2 | | t-$C_4H_9$ | | H | H | H | H | |
| (76) | Ir | 2 | | t-$C_4H_9$ | | H | $CF_3$ | H | H | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (77) | Ir | 2 | 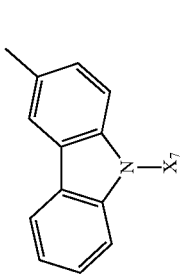 | t-$C_4H_9$ | 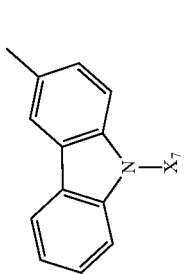 | H | $CF_3$ | H | H | 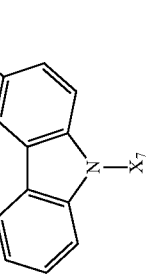 |
| (78) | Ir | 2 | 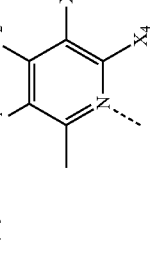 | t-$C_4H_9$ | 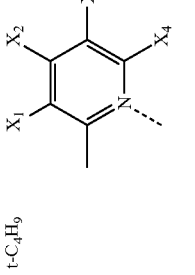 | H | $CF_3$ | H | H | 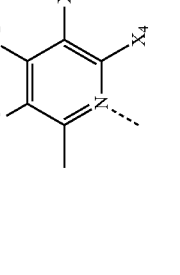 |
| (79) | Ir | 2 | 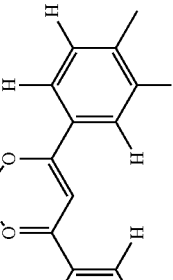 | t-$C_4H_9$ | 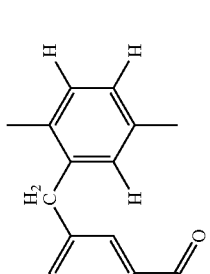 | H | H | $CF_3$ | H | 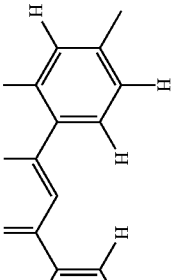 |
| (80) | Ir | 2 | 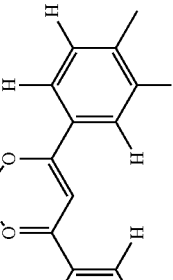 | t-$C_4H_9$ | 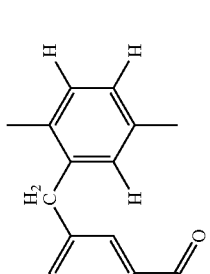 | H | H | $CF_3$ | H | 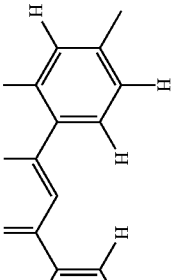 |

TABLE 1-continued

| No | M | n | Carbazole unit | X₇ | Ring A | X₁ | X₂ | X₃ | X₄ | Ring C (L₂) |
|---|---|---|---|---|---|---|---|---|---|---|
| (81) | Ir | 2 | | t-C₄H₉ | | H | H | CF₃ | H | |
| (82) | Ir | 2 | | t-C₄H₉ | | H | H | NO₂ | H | |
| (83) | Ir | 2 | | t-C₄H₉ | | H | H | NO₂ | H | |
| (84) | Ir | 2 | | t-C₄H₉ | | H | H | NO₂ | H | |

TABLE 1-continued

| No | M | n | Carbazole unit | X₇ | Ring A | X₁ | X₂ | X₃ | X₄ | Ring C (L₂) |
|---|---|---|---|---|---|---|---|---|---|---|
| (85) | Ir | 2 | (3-methyl-N-carbazolyl) | t-C₄H₉ | (pyridyl with X₁–X₄, methyl) | H | H | F | H | (CH₂-linked xylyl / acac) |
| (86) | Ir | 2 | (3-methyl-N-carbazolyl) | t-C₄H₉ | (pyridyl with X₁–X₄, methyl) | H | H | F | H | (dibenzoylmethane-type) |
| (87) | Ir | 2 | (3-methyl-N-carbazolyl) | t-C₄H₉ | (pyridyl with X₁–X₄, methyl) | H | H | F | H | (CH₂-linked phenyl picolinate) |
| (88) | Ir | 2 | (3-methyl-N-carbazolyl) | t-C₄H₉ | (pyridyl with X₁–X₄, methyl) | H | H | CN | H | (CH₂-linked xylyl / acac) |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (89) | Ir | 2 | | t-$C_4H_9$ | | H | H | CN | H | |
| (90) | Ir | 2 | | t-$C_4H_9$ | | H | H | CN | H | |
| (91) | Rh | 2 | | $C_2H_5$ | | H | $CF_3$ | H | H | |
| (92) | Rh | 2 | | $C_2H_5$ | | H | $CF_3$ | H | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (93) | Rh | 2 | | $C_2H_5$ | | H | $CF_3$ | H | H | |
| (94) | Ru | 2 | | $C_2H_5$ | | H | $CF_3$ | H | H | |
| (95) | Ru | 2 | | $C_2H_5$ | | H | $CF_3$ | H | H | |
| (96) | Ru | 2 | | $C_2H_5$ | | H | | H | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (97) | Os | 2 | | $C_2H_5$ | | H | $CF_3$ | H | H | |
| (98) | Os | 2 | | $C_2H_5$ | | H | $CF_3$ | H | H | |
| (99) | Os | 2 | | $C_2H_5$ | | H | $CF_3$ | H | H | |
| (100) | Pd | 1 | | $C_2H_5$ | | H | | H | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (101) | Pd | 1 | | $C_2H_5$ | | H | $CF_3$ | H | H | |
| (102) | Pt | 1 | | $C_2H_5$ | | H | $CF_3$ | H | H | |
| (103) | Pt | 1 | | $C_2H_5$ | | H | $CF_3$ | H | H | |
| (104) | Ir | 2 | | $C_2H_5$ | | H | H | | H | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (105) | Ir | 2 | 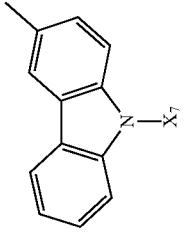 | $C_2H_5$ | 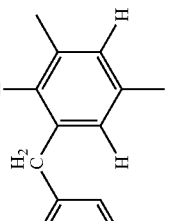 | H | H | H | H | 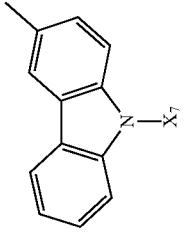 |
| (106) | Ir | 2 | 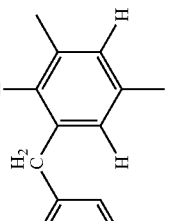 | $C_2H_5$ | | H | H | H | H | 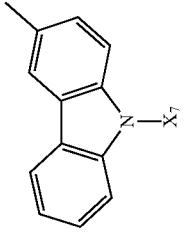 |
| (107) | Ir | 2 | 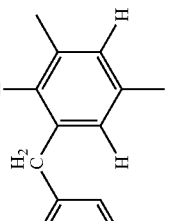 | $C_2H_5$ | | H | H | $CF_3$ | H | |

TABLE 1-continued

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (111) | Ir | 2 | | $C_2H_5$ | | H | H | H | H | |
| (112) | Ir | 2 | | $C_2H_5$ | | H | H | H | H | |
| (113) | Ir | 2 | | $C_2H_5$ | | H | | — | — | |

TABLE 1-continued
| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (114) | Ir | 2 | 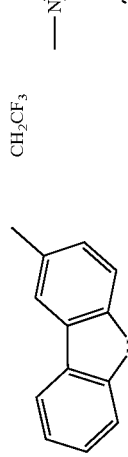 | $CH_2CF_3$ | 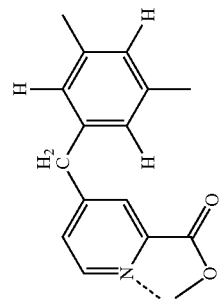 | H | H | H | H | 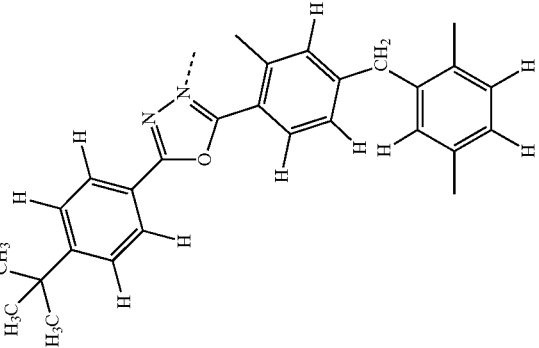 |
| (116) | Ir | 2 | 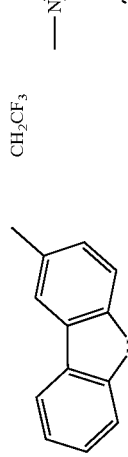 | $C_2H_5$ | 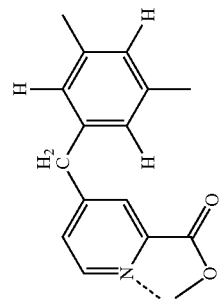 | H | H | H | H | 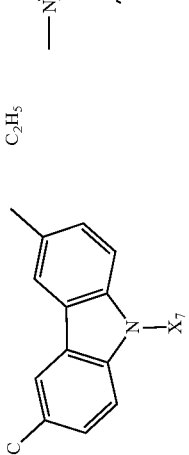 |

TABLE 1-continued

| No | M | n | Carbazole unit | X₇ | Ring A | X₁ | X₂ | X₃ | X₄ | Ring C (L₂) |
|---|---|---|---|---|---|---|---|---|---|---|
| (117) | Ir | 2 | (3-methyl-9-carbazolyl, N–X₇) | C₂H₅ | (2-methylbenzoxazol-3-yl) | H | H | H | H | (phenyl-oxazole-phenyl-CH₂-mesityl structure with t-Bu) |
| (118) | Ir | 2 | (3-methyl-9-carbazolyl, N–X₇) | C₂H₅ | (2-methylbenzothiazol-3-yl) | H | H | H | H | (dimethyl-dioxine-CH₂-trimethylphenyl structure) |
| (119) | Ir | 2 | (3-methyl-9-carbazolyl, N–X₇) | C₂H₅ | (2-methylbenzimidazol-1-yl) | H | H | H | H | (bis(dimethylphenyl)-acetylacetonate structure) |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (120) | Ir | 2 | | $C_2H_5$ | | H | | — | — | |
| (121) | Ir | 2 | | $CH_2CF_3$ | | H | H | H | H | |
| (122) | Ir | 2 | | $C_2H_5$ | | H | H | H | H | |
| (123) | Ir | 2 | | $C_2H_5$ | | H | H | H | H | |

TABLE 1-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (124) | Ir | 2 | | $C_2H_5$ | | H | H | H | H | |
| (125) | Ir | 2 | | $C_2H_5$ | | H | H | H | H | |

TABLE 2

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (125) | Ir | 2 | | $CH_3$ | | H | H | H | H | |
| (126) | Ir | 2 | | $CH_3$ | | H | H | H | H | |
| (127) | Ir | 2 | | $CH_3$ | | H | H | H | H | |
| (128) | Ir | 2 | | $C_2H_5$ | | H | $CH_3$ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (129) | Ir | 2 | | $C_2H_5$ | | H | $CH_3$ | H | H | |
| (130) | Ir | 2 | | $C_2H_5$ | | H | $CH_3$ | H | H | |
| (131) | Ir | 2 | | $C_2H_5$ | | H | H | $CH_3$ | H | |
| (132) | Ir | 2 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (133) | Ir | 2 | | $C_2H_5$ | | H | H | $CH_3$ | H | |
| (134) | Ir | 2 | | $C_2H_5$ | | H | H | H | $OCH_3$ | |
| (135) | Ir | 2 | | $C_2H_5$ | | H | H | H | $OCH_3$ | |
| (136) | Ir | 2 | | $C_2H_5$ | | H | H | H | $OCH_3$ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (137) | Ir | 2 | | $C_2H_5$ | | H | H | $N(CH_3)_2$ | H | |
| (138) | Ir | 2 | | $C_2H_5$ | | H | H | $N(CH_3)_2$ | H | |
| (139) | Ir | 2 | | $C_2H_5$ | | H | H | $N(CH_3)_2$ | H | |
| (140) | Ir | 2 | | $C_2H_5$ | | H | $CH_3$ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (141) | Ir | 2 | | $C_2H_5$ | | H | $CH_3$ | H | H | |
| (142) | Ir | 2 | | $C_2H_5$ | | H | $CH_3$ | H | H | |
| (143) | Ir | 2 | | $C_2H_5$ | | H | H | $CH_3$ | H | |
| (144) | Ir | 2 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (145) | Ir | 2 | | $C_2H_5$ | | H | H | $CH_3$ | H | |
| (146) | Ir | 2 | | $C_2H_5$ | | H | H | H | $OCH_3$ | |
| (147) | Ir | 2 | | $C_2H_5$ | | H | H | H | $OCH_3$ | |
| (148) | Ir | 2 | | $C_2H_5$ | | H | H | H | $OCH_3$ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (149) | Ir | 2 | | $C_2H_5$ | | H | H | $N(CH_3)_2$ | H | |
| (150) | Ir | 2 | | $C_2H_5$ | | H | H | $N(CH_3)_2$ | H | |
| (151) | Ir | 2 | | $C_2H_5$ | | H | H | $N(CH_3)_2$ | H | |
| (152) | Ir | 2 | | $t\text{-}C_4H_9$ | | H | $CH_3$ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (153) | Ir | 2 | | t-C$_4$H$_9$ | | H | CH$_3$ | H | H | |
| (154) | Ir | 2 | | t-C$_4$H$_9$ | | H | CH$_3$ | H | H | |
| (155) | Ir | 2 | | t-C$_4$H$_9$ | | H | H | CH$_3$ | H | |
| (156) | Ir | 2 | | t-C$_4$H$_9$ | | H | H | CH$_3$ | H | |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (157) | Ir | 2 | | t-C₄H₉ | | H | H | CH₃ | H | |
| (158) | Ir | 2 | | t-C₄H₉ | | H | H | H | OCH₃ | |
| (159) | Ir | 2 | | t-C₄H₉ | | H | H | H | OCH₃ | |
| (160) | Ir | 2 | | t-C₄H₉ | | H | H | H | OCH₃ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (161) | Ir | 2 | | $t\text{-}C_4H_9$ | | H | H | $N(CH_3)_2$ | H | |
| (162) | Ir | 2 | | $t\text{-}C_4H_9$ | | H | H | $N(CH_3)_2$ | H | |
| (163) | Ir | 2 | | $t\text{-}C_4H_9$ | | H | H | $N(CH_3)_2$ | H | |
| (164) | Ir | 2 | | $C_2H_5$ | | H | H | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (165) | Ir | 2 | | $C_2H_5$ | | H | H | H | H | |
| (166) | Ir | 2 | | $C_2H_5$ | | H | H | H | H | |
| (167) | Ir | 2 | | $C_2H_5$ | | H | $CH_3$ | H | H | |
| (168) | Ir | 2 | | $C_2H_5$ | | H | $CH_3$ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (169) | Ir | 2 | | $C_2H_5$ | | H | $CH_3$ | H | H | |
| (170) | Ir | 2 | | $C_2H_5$ | | H | H | $CH_3$ | H | |
| (171) | Ir | 2 | | $C_2H_5$ | | H | H | $CH_3$ | H | |
| (172) | Ir | 2 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (173) | Ir | 2 | | $C_2H_5$ | | H | H | H | $OCH_3$ | |
| (174) | Ir | 2 | | $C_2H_5$ | | H | H | H | $OCH_3$ | |
| (175) | Ir | 2 | | $C_2H_5$ | | H | H | H | $OCH_3$ | |
| (176) | Ir | 2 | | $C_2H_5$ | | H | H | $N(CH_3)_2$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (177) | Ir | 2 | | $C_2H_5$ | | H | H | $N(CH_3)_2$ | H | |
| (178) | Ir | 2 | | $C_2H_5$ | | H | H | $N(CH_3)_2$ | H | |
| (179) | Ir | 2 | | | | H | H | H | H | |
| (180) | Ir | 2 | | | | H | H | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (181) | Ir | 2 | | | | H | H | H | H | |
| (182) | Ir | 2 | | | | H | $CH_3$ | H | H | |
| (183) | Ir | 2 | | | | H | $CH_3$ | H | H | |
| (184) | Ir | 2 | | | | H | $CH_3$ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (185) | Ir | 2 | | | | H | H | CH$_3$ | H | |
| (186) | Ir | 2 | | | | H | H | CH$_3$ | H | |
| (187) | Ir | 2 | | | | H | H | CH$_3$ | H | |
| (188) | Ir | 2 | | | | H | H | H | OCH$_3$ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (189) | Ir | 2 | | | | H | H | H | OCH$_3$ | |
| (190) | Ir | 2 | | | | H | H | H | OCH$_3$ | |
| (191) | Ir | 2 | | | | H | H | N(CH$_3$)$_2$ | H | |
| (192) | Ir | 2 | | | | H | H | N(CH$_3$)$_2$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (193) | Ir | 2 | | | | H | H | $N(CH_3)_2$ | H | |
| (194) | Ir | 2 | | | | H | H | H | H | |
| (195) | Ir | 2 | | | | H | H | H | H | |
| (196) | Ir | 2 | | | | H | H | H | H | |

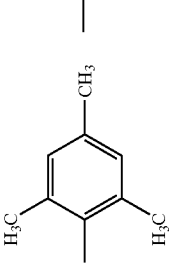

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (201) | Ir | 2 | | | | H | H | $CH_3$ | H | |
| (202) | Ir | 2 | | | | H | H | $CH_3$ | H | |
| (203) | Ir | 2 | | | | H | H | H | $OCH_3$ | |
| (204) | Ir | 2 | | | | H | H | H | $OCH_3$ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (205) | Ir | 2 | | | | H | H | H | OCH$_3$ | |
| (206) | Ir | 2 | | | | H | H | N(CH$_3$)$_2$ | H | |
| (207) | Ir | 2 | | | | H | H | N(CH$_3$)$_2$ | H | |
| (208) | Ir | 2 | | | | H | H | N(CH$_3$)$_2$ | H | |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (209) | Ir | 2 | | | | H | H | H | H | |
| (210) | Ir | 2 | | | | H | H | H | H | |
| (211) | Ir | 2 | | | | H | H | H | H | |
| (212) | Ir | 2 | | | | H | CH₃ | H | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (213) | Ir | 2 | | | | H | CH$_3$ | H | H | |
| (214) | Ir | 2 | | | | H | CH$_3$ | H | H | |
| (215) | Ir | 2 | | | | H | H | CH$_3$ | H | |
| (216) | Ir | 2 | | | | H | H | CH$_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (217) | Ir | 2 | | | | H | H | $CH_3$ | H | |
| (218) | Ir | 2 | | | | H | H | H | $OCH_3$ | |
| (219) | Ir | 2 | | | | H | H | H | $OCH_3$ | |
| (220) | Ir | 2 | | | | H | H | H | $OCH_3$ | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (221) | Ir | 2 | carbazole | 2,5-dimethylthiophene | pyridine | H | H | $N(CH_3)_2$ | H | |
| (222) | Ir | 2 | carbazole | 2,5-dimethylthiophene | pyridine | H | H | $N(CH_3)_2$ | H | |
| (223) | Ir | 2 | carbazole | 2,5-dimethylthiophene | pyridine | H | H | $N(CH_3)_2$ | H | |
| (224) | Rh | 2 | carbazole | $C_2H_5$ | pyridine | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (225) | Rh | 2 | | $C_2H_5$ | | H | H | $CH_3$ | H | |
| (226) | Rh | 2 | | $C_2H_5$ | | H | H | $CH_3$ | H | |
| (227) | Ru | 2 | | $C_2H_5$ | | H | H | $CH_3$ | H | |
| (228) | Ru | 2 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (229) | Ru | 2 | | $C_2H_5$ | | H | H | $CH_3$ | H | |
| (230) | Os | 2 | | $C_2H_5$ | | H | H | $CH_3$ | H | |
| (231) | Os | 2 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (232) | Os | 2 | | $C_2H_5$ | | H | H | $CH_3$ | H | |
| (233) | Pd | 1 | | $C_2H_5$ | | H | H | $CH_3$ | H | |
| (234) | Pd | 1 | | $C_2H_5$ | | H | H | $CH_3$ | H | |

TABLE 2-continued

| No | M | n | Carbazole unit | $X_7$ | Ring A | $X_1$ | $X_2$ | $X_3$ | $X_4$ | Ring C ($L_2$) |
|---|---|---|---|---|---|---|---|---|---|---|
| (235) | Pt | 1 | | $C_2H_5$ | | H | H | $CH_3$ | H | |
| (236) | Pt | 1 | | $C_2H_5$ | | H | H | $CH_3$ | H | |
| (237) | Ir | 2 | | $C_2H_5$ | | H | $CH_3$ | H | H | |
| (238) | Ir | 2 | | $C_2H_5$ | | H | $CH_3$ | H | H | |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (239) | Ir | 2 | [3-methyl-9-X₇-carbazole] | C₂H₅ | [pyridine with X₁–X₄ and methyl] | H | CH₃ | H | H | [oxadiazole-linked aryl structure] |

TABLE 2-continued
| No | M | n | Carbazole unit | X₇ | Ring A | X₁ | X₂ | X₃ | X₄ | Ring C (L₂) |
|---|---|---|---|---|---|---|---|---|---|---|
| (240) | Ir | 2 | 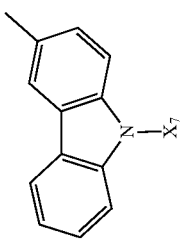 | C₂H₅ | 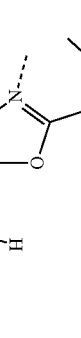 | H | H | CH₃ | H | 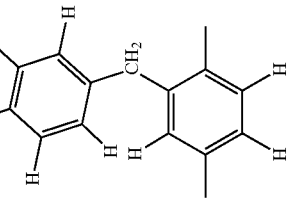 |
| (241) | Ir | 2 | 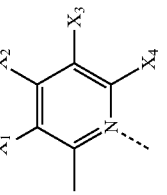 | C₂H₅ | 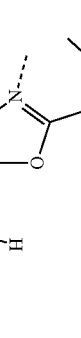 | H | H | CH₃ | H | 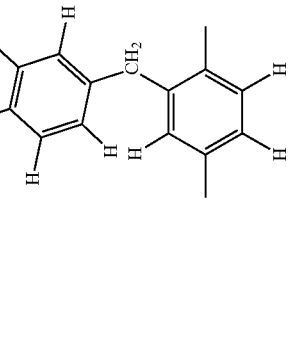 |
| (242) | Ir | 2 | 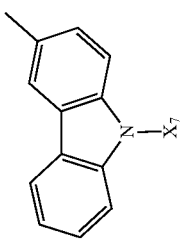 | C₂H₅ | 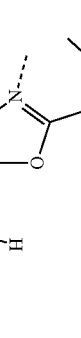 | H | H | CH₃ | H | 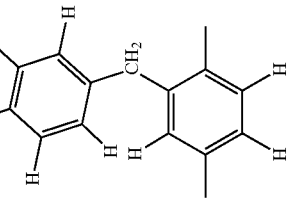 |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (243) | Ir | 2 | 3-methylcarbazole-N-X₇ | mesityl | 2-methylbenzoxazole | H | H | H | H | methyl 4-(2,6-dimethylbenzyloxy)picolinate |
| (244) | Ir | 2 | 3-methylcarbazole-N-X₇ | mesityl | 2-methylbenzothiazole | H | H | H | H | 3,5-dimethyl-4-(2,3-dimethylbenzyloxy) acac |
| (245) | Ir | 2 | 3-methylcarbazole-N-X₇ | mesityl | 1-methylbenzimidazole | H | H | H | H | methyl 4-(2,6-dimethylbenzyloxy)picolinate |
| (246) | Ir | 2 | 3-methylcarbazole-N-X₇ | mesityl | 2-methyloxazole | H | phenyl | — | — | 1,3-bis(3,5-dimethylphenyl)-1,3-propanedionate |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (247) | Ir | 2 | | | | H | H | H | H | |
| (248) | Ir | 2 | | | | H | H | H | H | |
| (249) | Ir | 2 | | | | H | H | H | H | |
| (250) | Ir | 2 | | | | H | H | H | H | |

TABLE 2-continued

| No | M | n | Carbazole unit | X₇ | Ring A | X₁ | X₂ | X₃ | X₄ | Ring C (L₂) |
|---|---|---|---|---|---|---|---|---|---|---|
| (251) | Ir | 2 | 3-methyl-9-X₇-carbazole | mesityl | benzotriazole (N,N-linked) | H | H | H | H | 4,6-dimethyl-2-(benzyl-oxy-3,5-dimethylphenyl)-1,3-dioxine-type acac |
| (252) | Ir | 2 | 3-methyl-9-X₇-carbazole | mesityl | 2-methyloxazole with X₁, X₂ | H | phenyl | — | — | 4,6-dimethyl-2-(benzyl-oxy-3,5-dimethylphenyl)-1,3-dioxine-type acac |

TABLE 3

| No | M | n | Condensed ring unit | Ring A | $X_1$ | $X_2$ | $X_3$ | $X_4$ | Ring C ($L_2$) |
|---|---|---|---|---|---|---|---|---|---|
| (253) | Ir | 2 | | | H | H | H | H | |
| (254) | Ir | 2 | | | H | H | H | H | |
| (255) | Ir | 2 | | | H | H | H | H | |
| (256) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (257) | Ir | 2 | | | H | CH$_3$ | H | H | |
| (258) | Ir | 2 | | | H | CH$_3$ | H | H | |
| (259) | Ir | 2 | | | H | H | CH$_3$ | H | |
| (260) | Ir | 2 | | | H | H | CH$_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (261) | Ir | 2 | | | H | H | $CH_3$ | H | |
| (262) | Ir | 2 | | | H | H | H | $OCH_3$ | |
| (263) | Ir | 2 | | | H | H | H | $OCH_3$ | |
| (264) | Ir | 2 | | | H | H | H | $OCH_3$ | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (265) | Ir | 2 | | | H | H | N(CH$_3$)$_2$ | H | |
| (266) | Ir | 2 | | | H | H | N(CH$_3$)$_2$ | H | |
| (267) | Ir | 2 | | | H | H | N(CH$_3$)$_2$ | H | |
| (268) | Ir | 2 | | | H | CF$_3$ | H | H | |

TABLE 3-continued

| No | M | n | Condensed ring unit | Ring A | X₁ | X₂ | X₃ | X₄ | Ring C (L₂) |
|---|---|---|---|---|---|---|---|---|---|
| (269) | Ir | 2 | | | H | CF₃ | H | H | |
| (270) | Ir | 2 | | | H | CF₃ | H | H | |
| (271) | Ir | 2 | | | H | H | CF₃ | H | |
| (272) | Ir | 2 | | | H | H | CF₃ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (273) | Ir | 2 | | | H | H | $CF_3$ | H | |
| (274) | Ir | 2 | | | H | H | $NO_2$ | H | |
| (275) | Ir | 2 | | | H | H | $NO_2$ | H | |
| (276) | Ir | 2 | | | H | H | $NO_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (277) | Ir | 2 | | | H | H | F | H | |
| (278) | Ir | 2 | | | H | H | F | H | |
| (279) | Ir | 2 | | | H | H | F | H | |
| (280) | Ir | 2 | | | H | H | CN | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (281) | Ir | 2 | [dibenzofuranone with methyl] | [pyridyl with X1-X4] | H | H | CN | H | [acac with dimethylphenyl groups] |
| (282) | Ir | 2 | [dibenzofuranone with methyl] | [pyridyl with X1-X4] | H | H | CN | H | [picolinate with dimethylphenyl-OCH2] |
| (283) | Ir | 2 | [9,9-diethylfluorene with methyl] | [pyridyl with X1-X4] | H | H | H | H | [dimethyl-acac] |
| (284) | Ir | 2 | [9,9-diethylfluorene with methyl] | [pyridyl with X1-X4] | H | H | H | H | [acac with dimethylphenyl groups] |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (285) | Ir | 2 | | | H | H | H | H | |
| (286) | Ir | 2 | | | H | $CH_3$ | H | H | |
| (287) | Ir | 2 | | | H | $CH_3$ | H | H | |
| (288) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (289) | Ir | 2 | | | H | H | $CH_3$ | H | |
| (290) | Ir | 2 | | | H | H | $CH_3$ | H | |
| (291) | Ir | 2 | | | H | H | $CH_3$ | H | |
| (292) | Ir | 2 | | | H | H | H | $OCH_3$ | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (293) | Ir | 2 | | | H | H | H | $OCH_3$ | |
| (294) | Ir | 2 | | | H | H | H | $OCH_3$ | |
| (295) | Ir | 2 | | | H | H | $N(CH_3)_2$ | H | |
| (296) | Ir | 2 | | | H | H | $N(CH_3)_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (297) | Ir | 2 | | | H | H | N(CH$_3$)$_2$ | H | |
| (298) | Ir | 2 | | | H | CF$_3$ | H | H | |
| (299) | Ir | 2 | | | H | CF$_3$ | H | H | |
| (300) | Ir | 2 | | | H | CF$_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (301) | Ir | 2 | | | H | H | $CF_3$ | H | |
| (302) | Ir | 2 | | | H | H | $CF_3$ | H | |
| (303) | Ir | 2 | | | H | H | $CF_3$ | H | |
| (304) | Ir | 2 | | | H | H | $NO_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (305) | Ir | 3 | | | H | H | $NO_2$ | H | |
| (306) | Ir | 2 | | | H | H | $NO_2$ | H | |
| (307) | Ir | 2 | | | H | H | F | H | |
| (308) | Ir | 2 | | | H | H | F | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (309) | Ir | 2 | | | H | H | F | H | |
| (310) | Ir | 2 | | | H | H | CN | H | |
| (311) | Ir | 2 | | | H | H | CN | H | |
| (312) | Ir | 2 | | | H | H | CN | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (313) | Ir | 2 | | | H | H | H | H | |
| (314) | Ir | 2 | | | H | H | H | H | |
| (315) | Ir | 2 | | | H | H | H | H | |
| (316) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (317) | Ir | 2 | | | H | $CH_3$ | H | H | |
| (318) | Ir | 2 | | | H | $CH_3$ | H | H | |
| (319) | Ir | 2 | | | H | H | $CH_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (320) | Ir | 2 | | | H | H | CH$_3$ | H | |
| (321) | Ir | 2 | | | H | H | CH$_3$ | H | |
| (322) | Ir | 2 | | | H | H | H | OCH$_3$ | |
| (323) | Ir | 2 | | | H | H | H | OCH$_3$ | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (324) | Ir | 2 | | | H | H | H | OCH$_3$ | |
| (325) | Ir | 2 | | | H | H | N(CH$_3$)$_2$ | H | |
| (326) | Ir | 2 | | | H | H | N(CH$_3$)$_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (327) | Ir | 2 | | | H | H | $N(CH_3)_2$ | H | |
| (328) | Ir | 2 | | | H | $CF_3$ | H | H | |
| (329) | Ir | 2 | | | H | $CF_3$ | H | H | |
| (330) | Ir | 2 | | | H | $CF_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (331) | Ir | 2 | | | H | H | $CF_3$ | H | |
| (332) | Ir | 2 | | | H | H | $CF_3$ | H | |
| (333) | Ir | 2 | | | H | H | $CF_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (334) | Ir | 2 | | | H | H | $NO_2$ | H | |
| (335) | Ir | 2 | | | H | H | $NO_2$ | H | |
| (336) | Ir | 2 | | | H | H | $NO_2$ | H | |
| (337) | Ir | 2 | | | H | H | F | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (338) | Ir | 2 | | | H | H | F | H | |
| (339) | Ir | 2 | | | H | H | F | H | |
| (340) | Ir | 2 | | | H | H | CN | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (341) | Ir | 2 | | | H | H | CN | H | |
| (342) | Ir | 2 | | | H | H | CN | H | |
| (343) | Ir | 2 | | | H | H | H | H | |
| (344) | Ir | 2 | | | H | H | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (345) | Ir | 2 | | | H | H | H | H | |
| (346) | Ir | 2 | | | H | $CH_3$ | H | H | |
| (347) | Ir | 2 | | | H | $CH_3$ | H | H | |
| (348) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (349) | Ir | 2 | | | H | H | CH$_3$ | H | |
| (350) | Ir | 2 | | | H | H | CH$_3$ | H | |
| (351) | Ir | 2 | | | H | H | CH$_3$ | H | |
| (352) | Ir | 2 | | | H | H | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (353) | Ir | 2 | | | H | H | H | H | |
| (354) | Ir | 2 | | | H | H | H | H | |
| (355) | Ir | 2 | | | H | $CH_3$ | H | H | |
| (356) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (357) | Ir | 2 | | | H | $CH_3$ | H | H | |
| (358) | Ir | 2 | | | H | H | $CH_3$ | H | |
| (359) | Ir | 2 | | | H | H | $CH_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (360) | Ir | 2 | | | H | H | CH$_3$ | H | |
| (361) | Ir | 2 | | | H | H | H | OCH$_3$ | |
| (362) | Ir | 2 | | | H | H | H | OCH$_3$ | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (363) | Ir | 2 | | | H | H | H | $OCH_3$ | |
| (364) | Ir | 2 | | | H | H | $N(CH_3)_2$ | H | |
| (365) | Ir | 2 | | | H | H | $N(CH_3)_2$ | H | |
| (366) | Ir | 2 | | | H | H | $N(CH_3)_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (367) | Ir | 2 | [4-methyldibenzofuran] | [pyridyl with $X_1$–$X_4$ and methyl] | H | CF$_3$ | H | H | [oxadiazole-phenyl-CH$_2$-O-phenyl structure with tert-butyl and methyl substituents] |
| (368) | Ir | 3 | [4-methyldibenzofuran] | [pyridyl with $X_1$–$X_4$ and methyl] | H | CF$_3$ | H | H | [dimethylphenyl-CH$_2$-O-acetylacetonate] |
| (369) | Ir | 2 | [4-methyldibenzofuran] | [pyridyl with $X_1$–$X_4$ and methyl] | H | CF$_3$ | H | H | [dimethylphenyl-CH$_2$-pyridyl-carboxylate methyl ester] |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (370) | Ir | 2 | | | H | H | $CF_3$ | H | |
| (371) | Ir | 2 | | | H | H | $CF_3$ | H | |
| (372) | Ir | 2 | | | H | H | $CF_3$ | H | |
| (373) | Ir | 2 | | | H | H | $NO_2$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (374) | Ir | 2 | dibenzofuran | | H | H | $NO_2$ | H | pyridyl-CH2-xylyl / methyl ester |
| (375) | Ir | 2 | dibenzofuran | | H | H | $NO_2$ | H | acac-diphenyl |
| (376) | Ir | 2 | dibenzofuran | | H | H | F | H | dimethyl-acac-phenyl-O-CH |
| (377) | Ir | 2 | dibenzofuran | | H | H | F | H | pyridyl-CH2-xylyl / methyl ester |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (378) | Ir | 2 | | | H | H | F | H | |
| (379) | Ir | 2 | | | H | H | CN | H | |
| (380) | Ir | 2 | | | H | H | CN | H | |
| (381) | Ir | 2 | | | H | H | CN | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (382) | Ir | 2 | | | H | H | H | H | |
| (383) | Ir | 2 | | | H | H | H | H | |
| (384) | Ir | 2 | | | H | H | H | H | |
| (385) | Ir | 2 | | | H | $CH_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (386) | Ir | 2 | | | H | CH$_3$ | H | H | |
| (387) | Ir | 2 | | | H | CH$_3$ | H | H | |
| (388) | Ir | 2 | | | H | H | CH$_3$ | H | |
| (389) | Ir | 2 | | | H | H | CH$_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (390) | Ir | 2 | | | H | H | $CH_3$ | H | |
| (391) | Ir | 2 | | | H | H | H | $OCH_3$ | |
| (392) | Ir | 2 | | | H | H | H | $OCH_3$ | |
| (393) | Ir | 2 | | | H | H | H | $OCH_3$ | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (394) | Ir | 2 | | | H | H | N(CH$_3$)$_2$ | H | |
| (395) | Ir | 2 | | | H | H | N(CH$_3$)$_2$ | H | |
| (396) | Ir | 2 | | | H | H | N(CH$_3$)$_2$ | H | |
| (397) | Ir | 2 | | | H | CF$_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (398) | Ir | 2 | dibenzothiophene (methyl-substituted) | pyridine with $X_1$–$X_4$ and methyl | H | $CF_3$ | H | H | methylene-linked pyridine-2-carboxylate with xylyl |
| (399) | Ir | 2 | dibenzothiophene (methyl-substituted) | pyridine with $X_1$–$X_4$ and methyl | H | $CF_3$ | H | H | acac with two tolyl substituents |
| (400) | Ir | 2 | dibenzothiophene (methyl-substituted) | pyridine with $X_1$–$X_4$ and methyl | H | H | $CF_3$ | H | acac with xylyl–O–CH and dimethyl |
| (401) | Ir | 3 | dibenzothiophene (methyl-substituted) | pyridine with $X_1$–$X_4$ and methyl | H | H | $CF_3$ | H | methylene-linked pyridine-2-carboxylate with xylyl |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (402) | Ir | 2 | dibenzothiophene | pyridine with $X_1$-$X_4$ | H | H | $CF_3$ | H | bis(xylyl) acac |
| (403) | Ir | 2 | dibenzothiophene | pyridine with $X_1$-$X_4$ | H | H | $NO_2$ | H | dimethyl acac with xylyl-OCH$_2$ |
| (404) | Ir | 2 | dibenzothiophene | pyridine with $X_1$-$X_4$ | H | H | $NO_2$ | H | xylylmethyl picolinate |
| (405) | Ir | 2 | dibenzothiophene | pyridine with $X_1$-$X_4$ | H | H | $NO_2$ | H | bis(xylyl) acac |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (406) | Ir | 2 | | | H | H | F | H | |
| (407) | Ir | 2 | | | H | H | F | H | |
| (408) | Ir | 2 | | | H | H | F | H | |
| (409) | Ir | 2 | | | H | H | CN | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (410) | Ir | 2 | | | H | H | CN | H | |
| (411) | Ir | 2 | | | H | H | CN | H | |
| (412) | Ir | 2 | | | H | H | H | H | |
| (413) | Ir | 2 | | | H | H | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (414) | Ir | 2 | | | H | H | H | H | |
| (415) | Rh | 2 | | | H | H | $CH_3$ | H | |
| (416) | Rh | 2 | | | H | H | $CH_3$ | H | |
| (417) | Rh | 2 | | | H | H | $CH_3$ | H | |

TABLE 3-continued
| No | M | n | Condensed ring unit | Ring A | $X_1$ | $X_2$ | $X_3$ | $X_4$ | Ring C ($L_2$) |
|---|---|---|---|---|---|---|---|---|---|
| (418) | Ru | 2 | 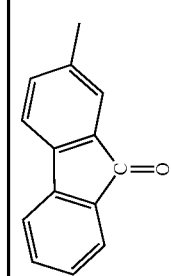 | 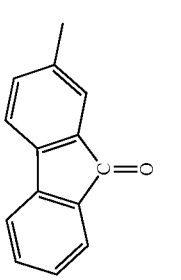 | H | H | $CH_3$ | H | 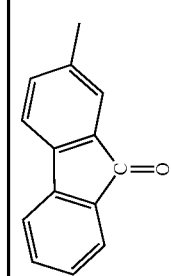 |
| (419) | Ru | 2 | 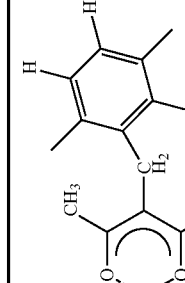 | 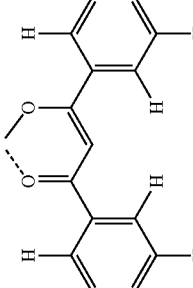 | H | H | $CH_3$ | H | 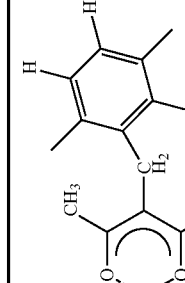 |
| (420) | Ru | 2 | 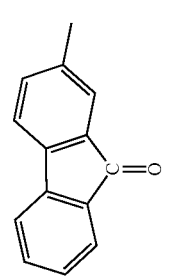 | 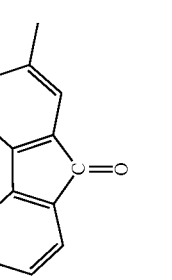 | H | H | $CH_3$ | H | 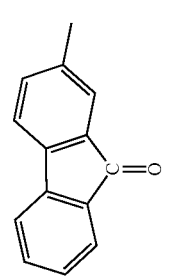 |
| (421) | Os | 2 | 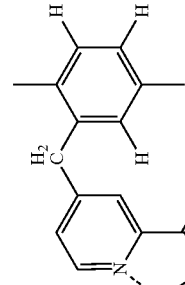 | 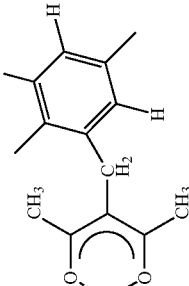 | H | H | $CH_3$ | H | 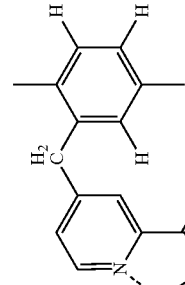 |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (422) | Os | 2 | | | H | H | CH$_3$ | H | |
| (423) | Os | 2 | | | H | H | CH$_3$ | H | |
| (424) | Pd | 1 | | | H | H | CH$_3$ | H | |
| (425) | Pd | 1 | | | H | H | CH$_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (426) | Pt | 1 | | | H | H | CH$_3$ | H | |
| (427) | Pt | 1 | | | H | H | CH$_3$ | H | |
| (428) | Ir | 2 | | | H | CH$_3$ | H | H | |
| (429) | Ir | 2 | | | H | CH$_3$ | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (430) | Ir | 2 | | | H | CH$_3$ | H | H | |
| (431) | Ir | 2 | | | H | H | CH$_3$ | H | |
| (432) | Ir | 2 | | | H | H | CH$_3$ | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (433) | Ir | 2 | | | H | H | CH$_3$ | H | |
| (434) | Ir | 2 | | | H | H | H | H | |
| (435) | Ir | 3 | | | H | H | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (436) | Ir | 3 | | | H | H | H | H | |
| (437) | Ir | 2 | | | H | | — | — | |
| (438) | Ir | 2 | | | H | H | H | H | |
| (439) | Ir | 2 | | | H | H | H | H | |

TABLE 3-continued

| No | M | n | Condensed ring unit | Ring A | $X_1$ | $X_2$ | $X_3$ | $X_4$ | Ring C ($L_2$) |
|---|---|---|---|---|---|---|---|---|---|
| (440) | Ir | 2 | | | H | H | H | H | |
| (441) | Ir | 2 | | | H | H | H | H | |
| (442) | Ir | 2 | | | H | H | H | H | |

TABLE 3-continued
| No | M | n | Condensed ring unit | Ring A | $X_1$ | $X_2$ | $X_3$ | $X_4$ | Ring C ($L_2$) |
|---|---|---|---|---|---|---|---|---|---|
| (443) | Ir | 2 | 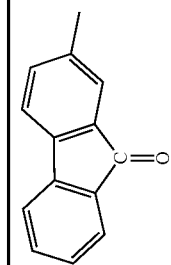 |  | H | 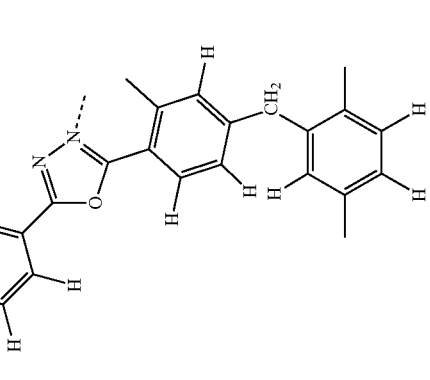 | — | — | 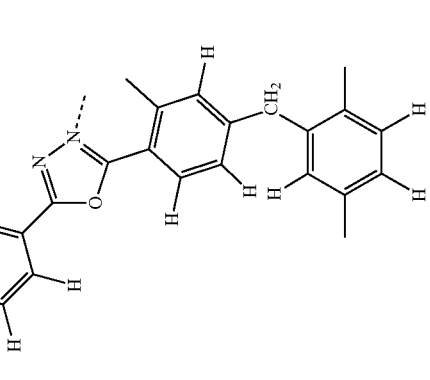 |

Furthermore, as specific examples of the metal coordination compound monomer unit of the present invention, compounds obtained by replacing ring C of the compounds shown in Tables 1 to 3 above with the following ligands can be cited.

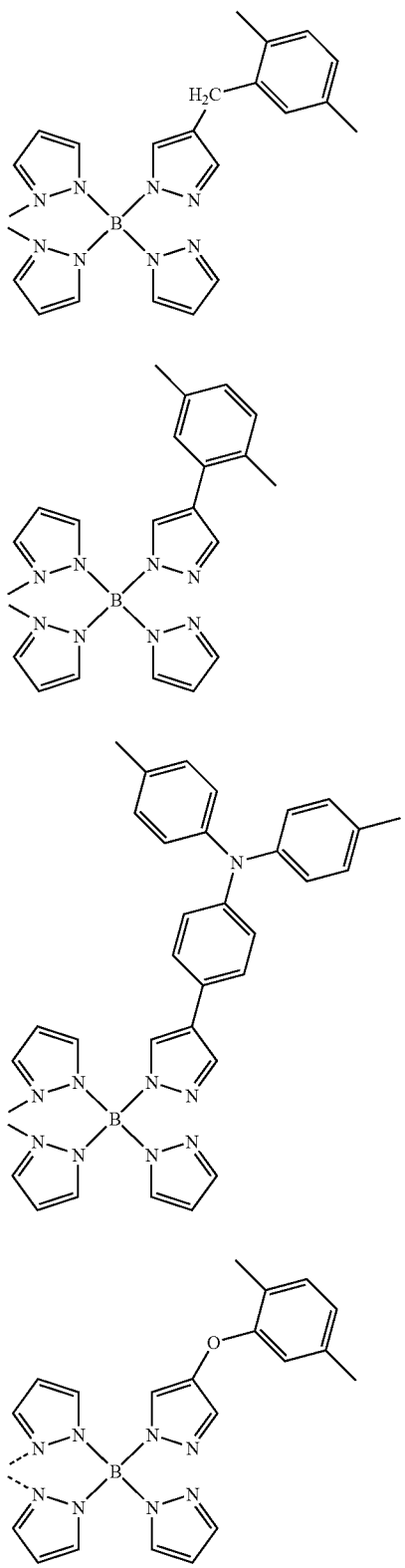

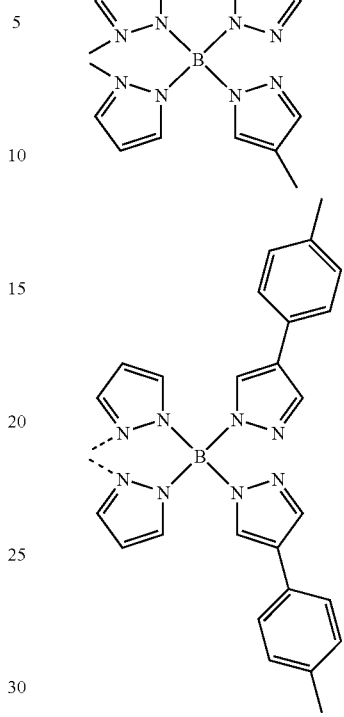

The metal coordination compound-containing copolymer of the present invention is a copolymer comprising any one of the metal coordination compound monomer units represented by Formulae (1) to (12) above, and at least one type of monomer unit selected from the group consisting of a substituted or unsubstituted quinoline monomer unit, a substituted or unsubstituted arylene and/or heteroarylene monomer unit, a substituted or unsubstituted branched monomer unit, and a substituted or unsubstituted conjugated monomer unit.

With regard to the substituted or unsubstituted quinoline monomer unit, the substituted or unsubstituted arylene and/or heteroarylene monomer unit, the substituted or unsubstituted branched monomer unit, and the substituted or unsubstituted conjugated monomer unit, monomer units that are explained in preferred embodiments shown in [1] to [4] below can be used.

In the metal coordination compound-containing copolymer of the present invention, as a group linking each monomer unit, linking groups explained in [1] below can be used.

The metal coordination compound-containing copolymer of the present invention may contain at least each of the above-mentioned monomer components, and each of the monomer units may be contained randomly in the copolymer as in a so-called random copolymer, or it may be a copolymer in which certain monomer units are localized as in a block copolymer or a graft copolymer. Each of the monomer units forming the above-mentioned copolymer may be a single type of monomer or a combination of two or more types of monomers.

Preferred embodiments of the metal coordination compound-containing copolymer of the present invention are shown below.

[I] A metal coordination compound-containing copolymer comprising a metal coordination compound monomer unit represented by any one of the Formulae (1) to (12), a substituted or unsubstituted quinoline monomer unit represented by Formulae (13-1):

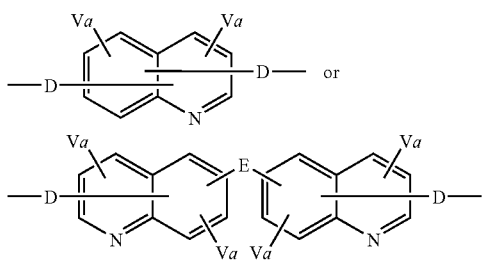

(in the formulae, a plurality of V are independently substituents selected from the group consisting of —R$^1$, —OR$^2$, —SR$^3$, —OCOR$^4$, —COOR$^5$, and —SiR$^6$R$^7$R$^8$ (here, R$^1$ to R$^8$ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene, and E is a divalent linking group selected from the group consisting of a single bond, —O—, —S—, —C(O)—, —S(O)—, —S(O$_2$)—, —W—, —(—O—W—)m-O— (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'—, —Ar'—S—Ar'—, —Ar'—S(O)—Ar'—, —Ar'—S(O$_2$)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and a substituted or unsubstituted arylene and/or heteroarylene monomer unit.

It is preferable that the group linking the monomer units is a linking group represented by Formula (14):

-(G)b-    (14)

(in the formula, G is a divalent group selected from the group consisting of —O—, —R—O—R—, —S—, —NR—, —CR$_2$—, —SiR$_2$—, —SiR$_2$—O—SiR$_2$—, and —SiR$_2$—O—SiR$_2$—O—SiR$_2$— (here, R is a C1 to C22 straight-chain, cyclic, or branched alkyl group, or a C2 to C30 aryl or heteroaryl group), and b is an integer of 0 or 1).

The quinoline monomer unit used in the present invention and represented by Formulae (13-1):

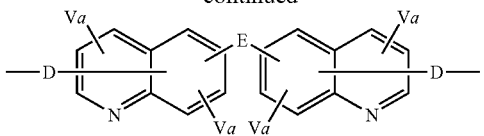

can be used singly or in a combination of two or more types.

Among the quinoline monomer units of Formulae (13-1) of the present invention, a plurality of V are represented by —R$^1$, —OR$^2$, —SR$^3$, —OCOR$^4$, —COOR$^5$, or —SiR$^6$R$^7$R$^8$, and when there is a plurality of substituents V, they may be identical to or different from each other. Each a is independently an integer of 0 to 3.

Furthermore, R$^1$ to R$^8$ of the substituent V are independently a C1 to C22 straight-chain alkyl, cyclic alkyl, or branched alkyl group, or a C2 to C30 aryl or heteroaryl group. Examples of such groups include C1 to C22 straight-chain alkyl, cyclic alkyl, or branched alkyl groups such as methyl, ethyl, propyl, cyclopropyl, butyl, isobutyl, cyclobutyl, pentyl, isopentyl, neopentyl, cyclopentyl, hexyl, cyclohexyl, heptyl, cycloheptyl, octyl, nonyl, and decyl, and C2 to C30 aryl or heteroaryl groups such as phenyl, naphthyl, anthracenyl, a biphenyl residue, a terphenyl residue, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, and a quinoxaline residue.

The substituent V may further have a substituent. Examples of the substituent on V include a substituent represented by the above-mentioned —R$^1$, —OR$^2$, —SR$^3$, —OCOR$^4$, —COOR$^5$, or —SiR$^6$R$^7$R$^8$, and a substituent represented by —NR$^9$R$^{10}$ (here, R$^9$ and R$^{10}$ are independently a C1 to C22 straight-chain, cyclic, or branched alkyl group, or a C2 to C20 aryl or heteroaryl group). When there is a plurality of substituents, the plurality of substituents may be identical to or different from each other.

Among the quinoline monomer units of Formulae (13-1) in the present invention, with regard to each Va independently, it is preferable, from the viewpoint of solubility and heat resistance, for a to be 0, that is, the monomer unit is unsubstituted, or for V to be an alkyl or aryl group substituent represented by —R$^1$. With regard to the number of substituents, including a case in which a is 0, that is, the monomer unit is unsubstituted, a is preferably 1 or 2 from the viewpoint of polymerization reactivity. Furthermore, as the aryl group phenyl is preferable.

In the quinoline monomer units of Formulae (13-1), each D is independently a single bond or arylene, preferably arylene, and preferably, from the viewpoint of polymerization reactivity, ortho-phenylene, meta-phenylene, or para-phenylene.

E is a divalent linking group selected from the group consisting of a single bond, —O—, —S—, —C(O)—, —S(O)—, —S(O$_2$)—, —W—, —(—O—W—)$_m$—O— (m is an integer of 1 to 3), and -Q-. The above-mentioned W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'-, —Ar'—S—Ar'—, —Ar'—S(O)—Ar'—, —Ar'—S(O$_2$)—Ar'—, and —Ar'-Q-Ar'—, Ra is an alkylene group, Ar' is an arylene group, each Ra' is independently a group selected from the group consisting of alkylene, arylene, and a mixed alkylene/arylene group, Het' is a heteroarylene group, and Q is a divalent group containing a quaternary carbon. E is preferably a single bond, —O—, —Ar'—, or —Ra'—O—Ra'— and, from the viewpoint of polymerization reactivity, is preferably a phenyl residue, a

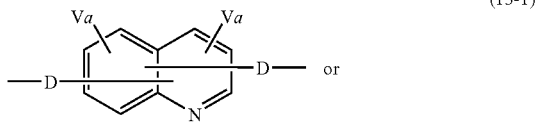

phenanthrene residue, a fluorene residue, a carbazole residue, a biphenyl residue, or a diphenyl ether residue.

Other than these, with regard to alkylene, arylene, heteroarylene, and Q as divalent groups D or E, there can be cited as examples divalent groups obtained by removing one hydrogen atom from the substituents cited as examples of $R^1$ to $R^8$ in the above-mentioned substituent V.

In Formulae (13-1), the divalent group represented by D or E may have a substituent. Examples of the substituent possessed by D or E include substituents such as the above-mentioned —$R^1$, —$OR^2$, —$SR^3$, —$OCOR^4$, —$COOR^5$, —$SiR^6R^7R^8$, or —$NR^9R^{10}$. When there is a plurality of substituents, the plurality of substituents may be identical to or different from each other.

As specific examples of the quinoline monomer units of Formulae (13-1), example compounds are listed below, but they should not be construed as being limited thereto.

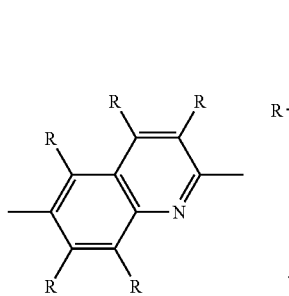
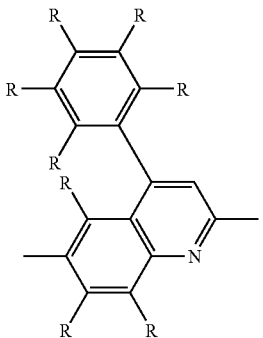
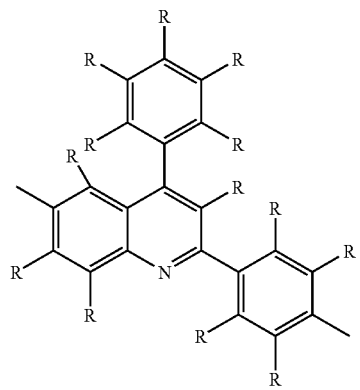
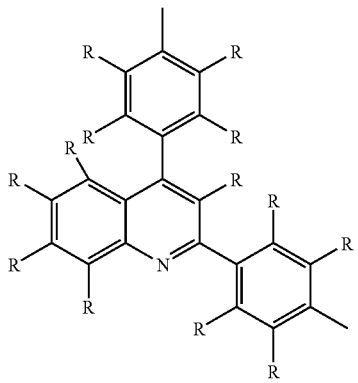
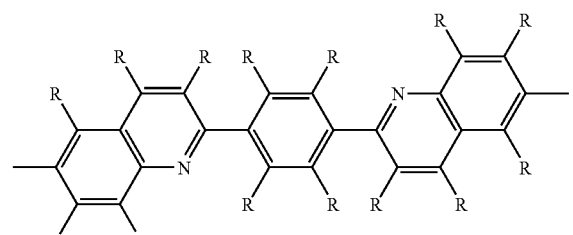
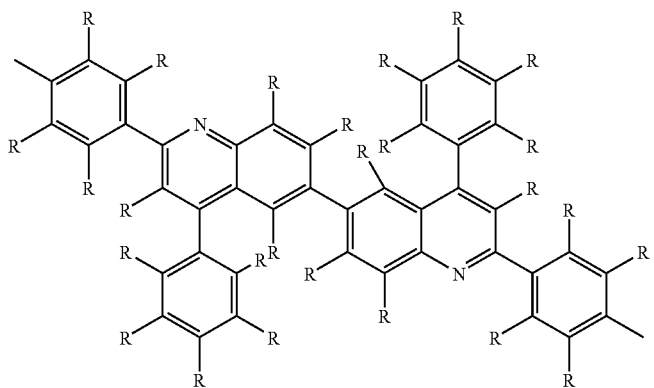

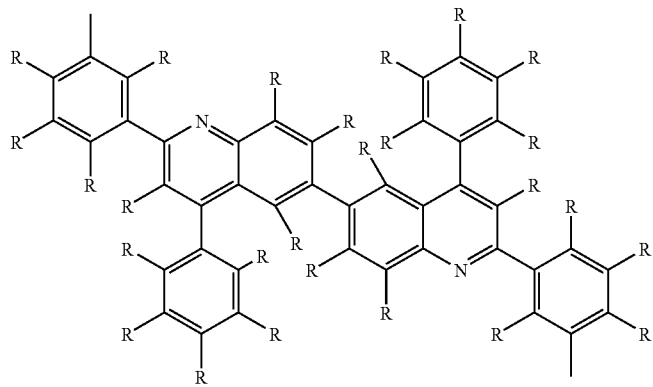
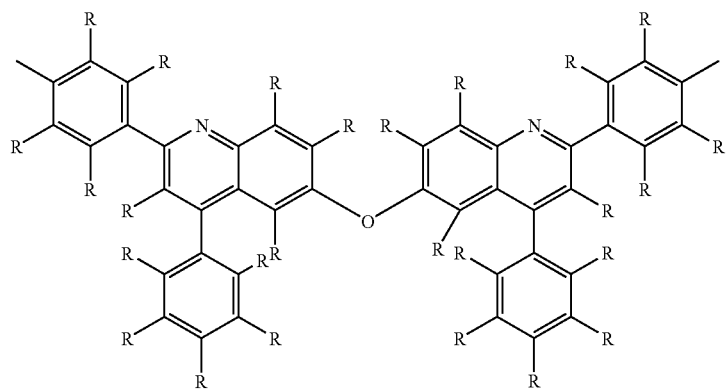
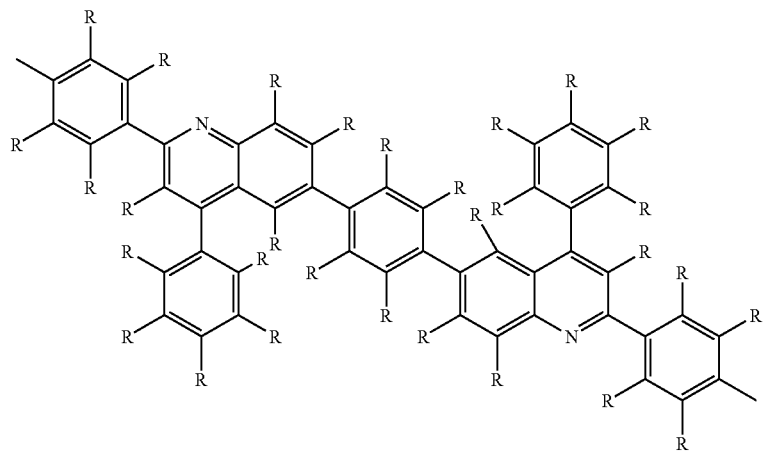
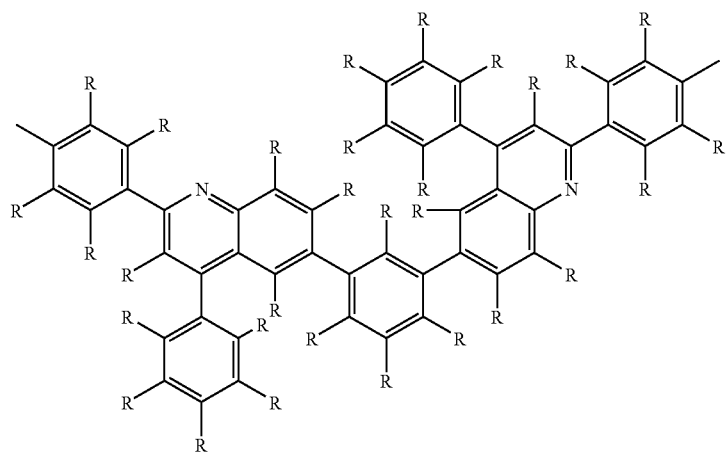

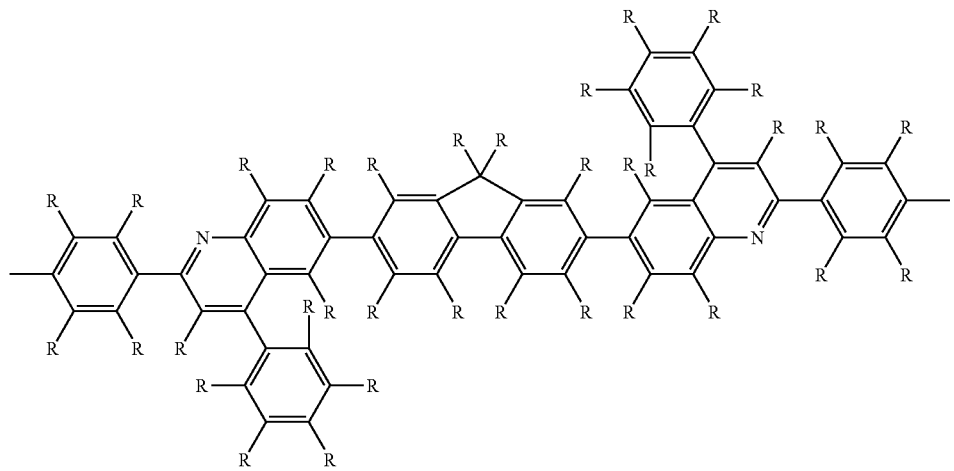
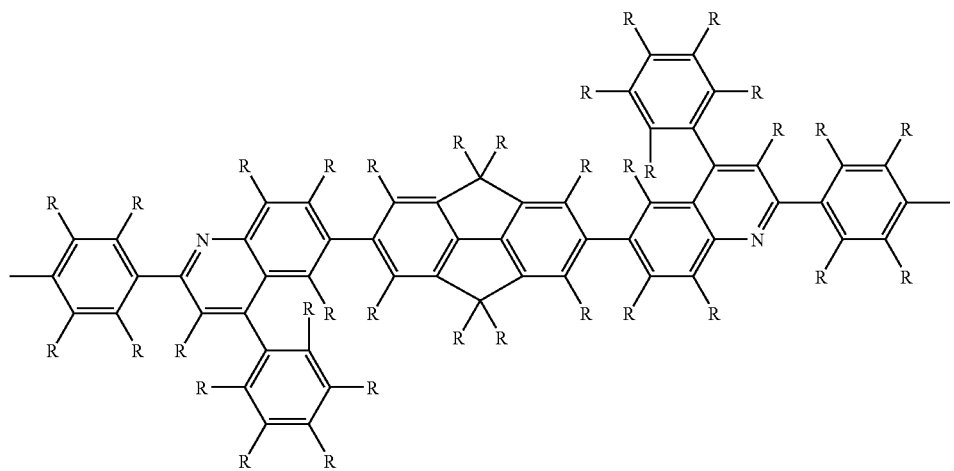
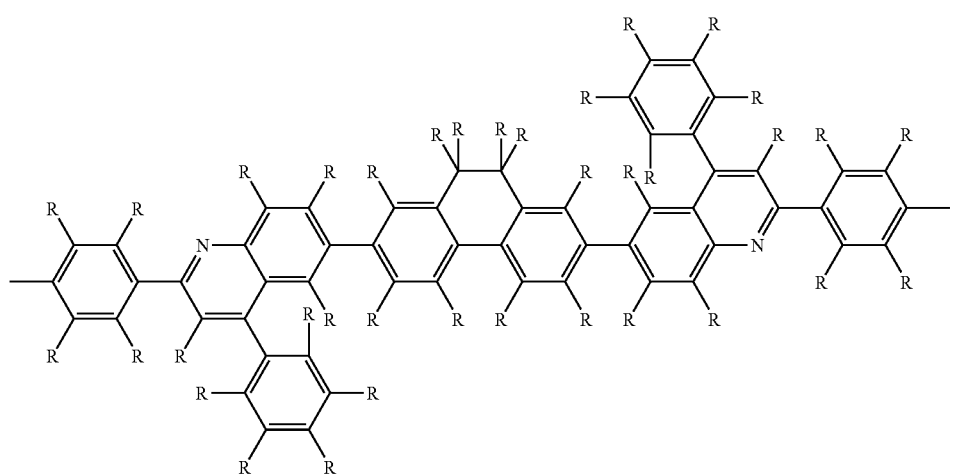

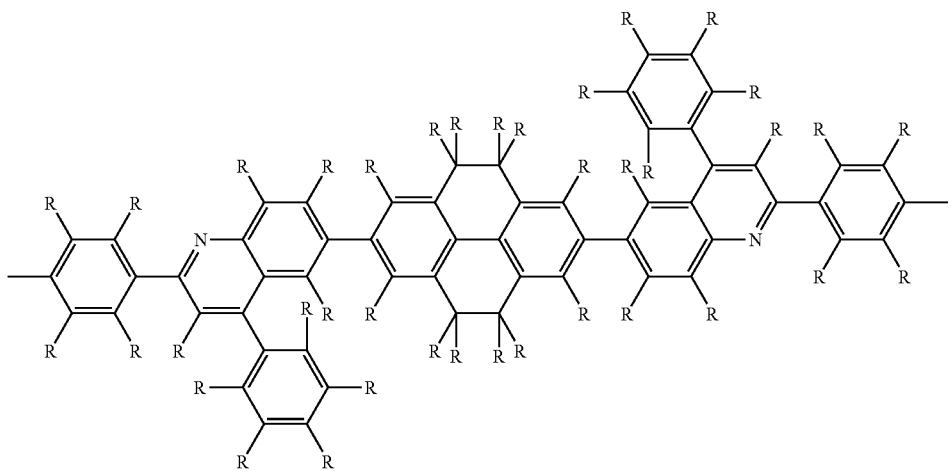
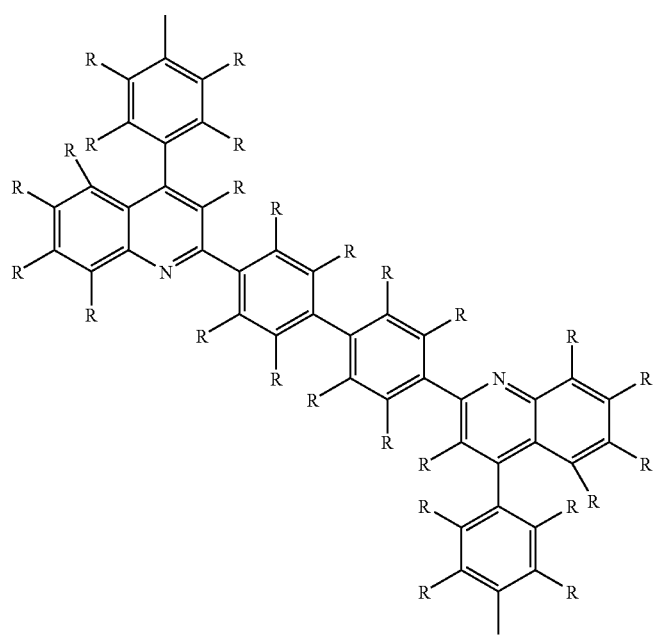

-continued
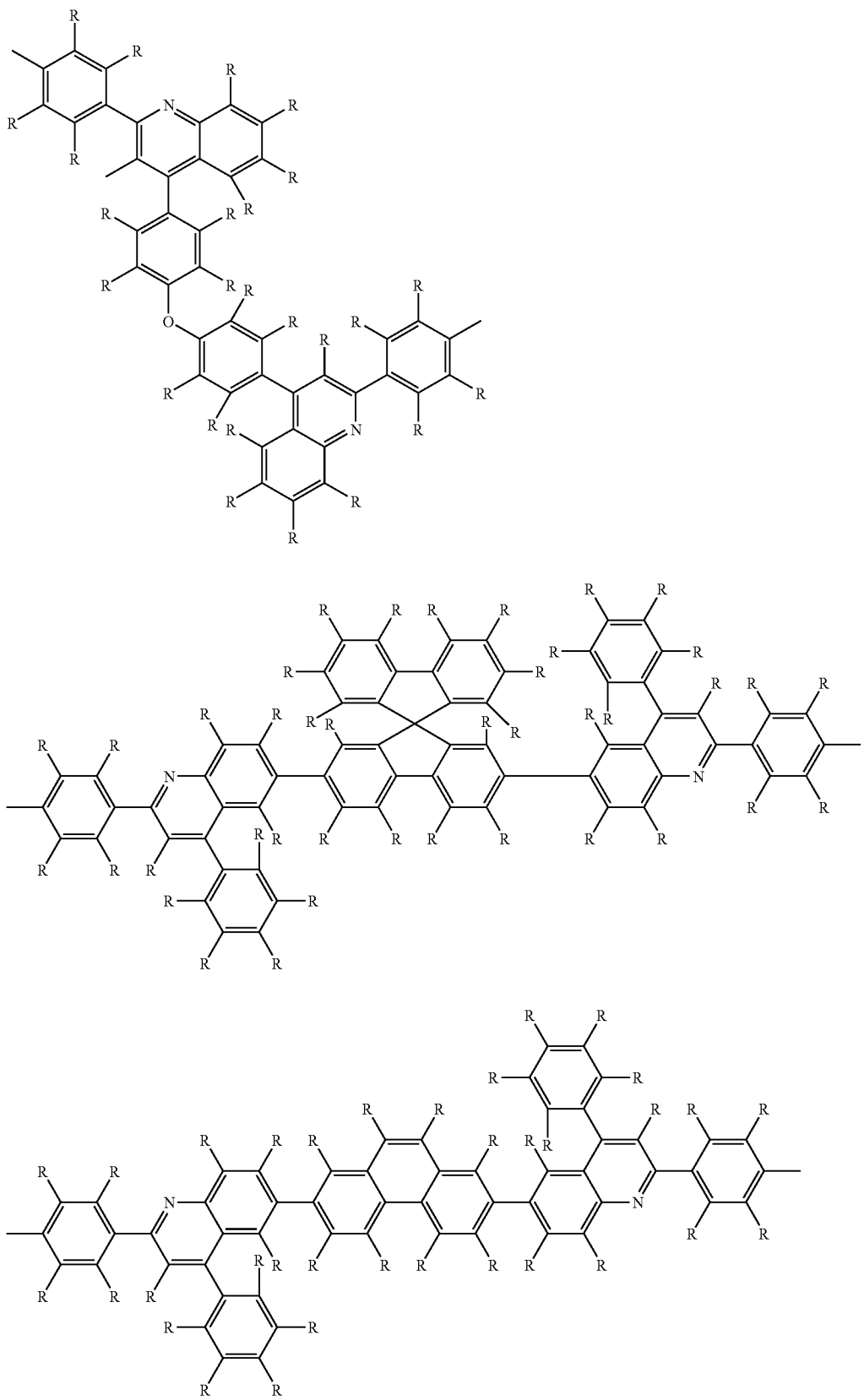

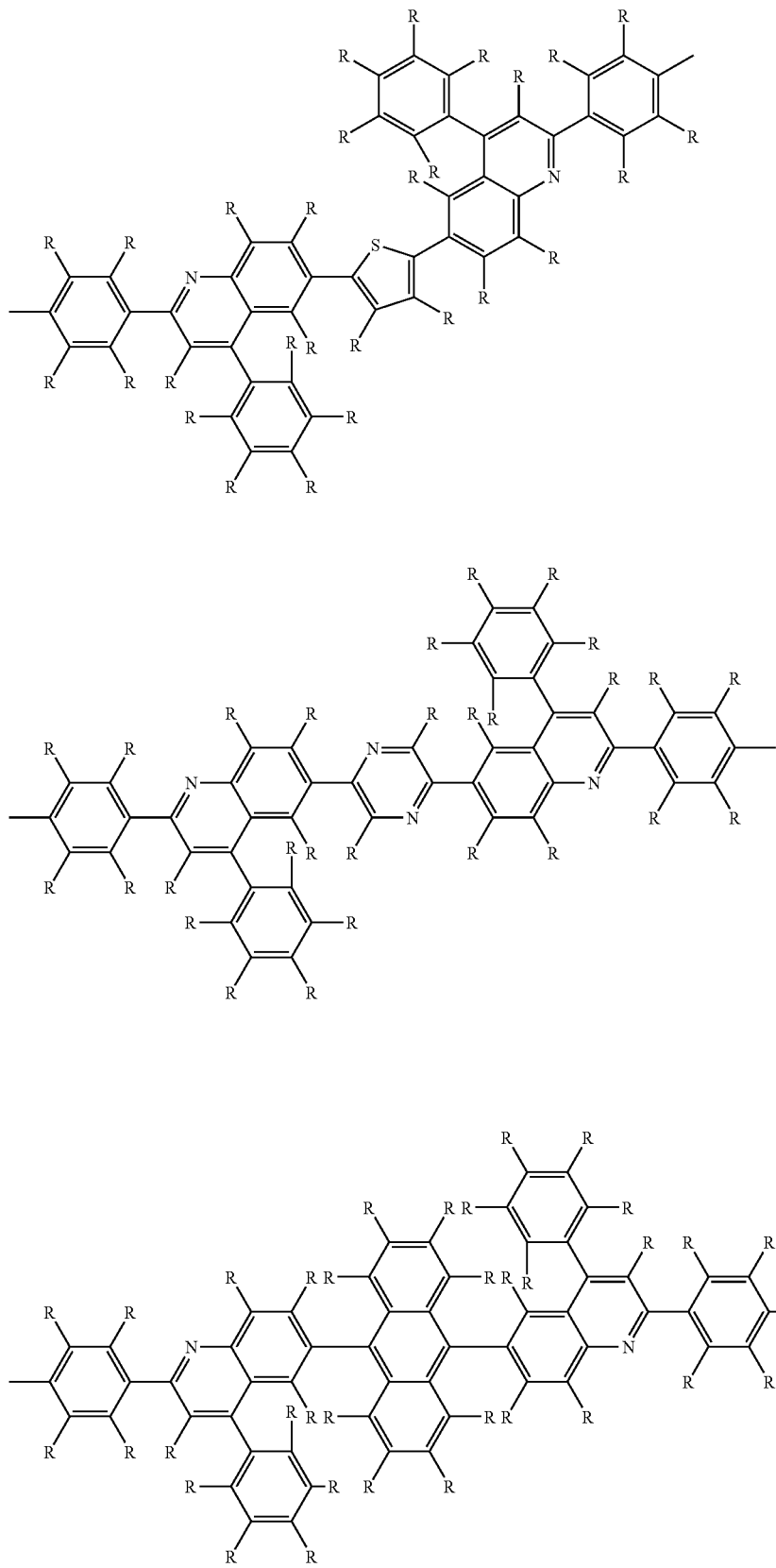

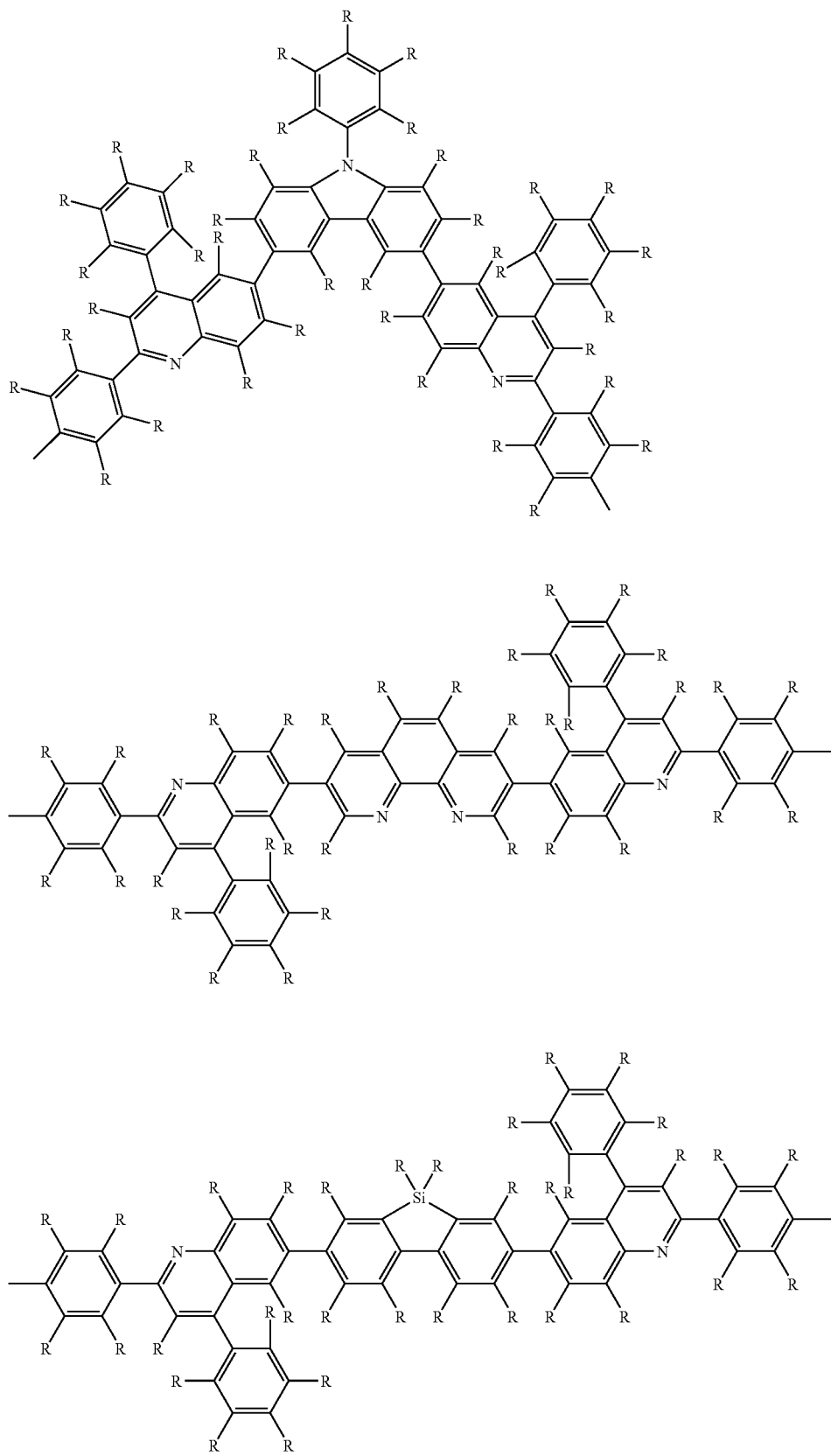

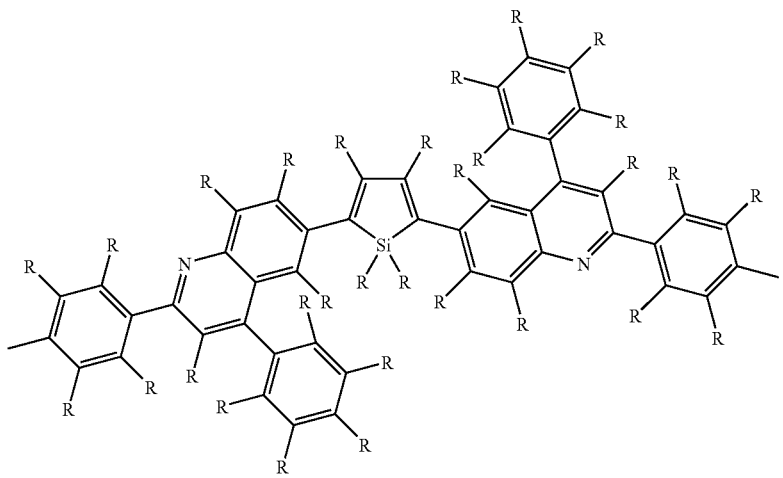

Here, in the above-mentioned quinoline monomer units, examples of the substituent R include substituents represented by the above-mentioned —$R^1$, —$OR^2$, —$SR^3$, —$OCOR^4$, —$COOR^5$, —$SiR^6R^7R^8$, or —$NR^9R^{10}$. R may be a hydrogen atom. The substituents R may be identical to or different from each other.

With regard to the substituted or unsubstituted arylene and/or heteroarylene monomer unit used in the present invention, a divalent group is preferable; examples thereof include benzene, biphenyl, terphenyl, naphthalene, anthracene, tetracene, fluorene, phenanthrene, pyrene, chrysene, pyridine, pyrazine, isoquinoline, acridine, phenanthroline, furan, pyrrole, thiophene, oxazole, oxadiazole, thiadiazole, triazole, benzoxazole, benzoxadiazole, benzothiadiazole, benzothiophene, diphenyloxadiazole, benzothiadiazole, diphenyldiazole, and diphenylthiadiazole, and they are used as the arylene and/or heteroarylene monomer unit either singly or in a manner in which a plurality thereof are bonded. The arylene and/or heteroarylene monomer units may be used singly or in a combination of two or more types.

The arylene and/or heteroarylene monomer unit may have a substituent, and examples of the substituent include substituents represented by —$R^1$, —$OR^2$, —$SR^3$, —$OCOR^4$, —$COOR^5$, —$SiR^6R^7R^8$, or —$NR^9R^{10}$. When there is a plurality of substituents, the plurality of substituents may be identical to or different from each other.

The above-mentioned $R^1$ to $R^8$ are independently a C1 to C22 straight-chain, cyclic, or a branched alkyl group or a C2 to C30 aryl or heteroaryl group. Examples of these groups include C1 to C22 straight-chain alkyl, cyclic alkyl, or branched alkyl groups such as a methyl group, an ethyl group, a propyl group, a cyclopropyl group, a butyl group, an isobutyl group, a cyclobutyl group, a pentyl group, an isopentyl group, a neopentyl group, a cyclopentyl group, a hexyl group, a cyclohexyl group, a heptyl group, a cycloheptyl group, an octyl group, a nonyl group, and a decyl group, and C2 to C30 aryl or heteroaryl groups such as a phenyl group, a naphthyl group, an anthracenyl group, a biphenyl residue, a terphenyl residue, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, and a quinoxaline residue. The substituent possessed by the arylene and/or heteroarylene monomer unit may further have a substituent.

It is preferable from the viewpoint of solubility and heat resistance that the substituents possessed by the arylene and/or heteroarylene monomer unit of the present invention are independently a hydrogen atom, that is, the monomer unit is unsubstituted, —$R^1$ in which the monomer unit is substituted with an alkyl group, an aryl group, or a heteroaryl group, or —$OR^2$ in which the monomer unit is substituted with an alkoxy group, an aryloxy group, or a heteroaryloxy group. From the viewpoint of polymerization reactivity the number of substituents, including a case in which the substituent is a hydrogen atom, that is, the monomer unit is unsubstituted, is preferably 1 to 3. Furthermore, the aryl group is preferably a substituted or unsubstituted phenyl group, a substituted or unsubstituted fluorene group, etc. Moreover, the heteroaryl group is preferably an oxadiazole group, a phenyloxadiazole group, a phenylthiadiazole group, a benzothiadiazole group, etc.

As representative examples, those represented by the structural formulae below can be cited.

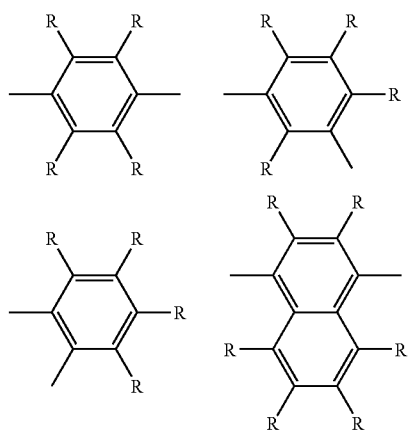

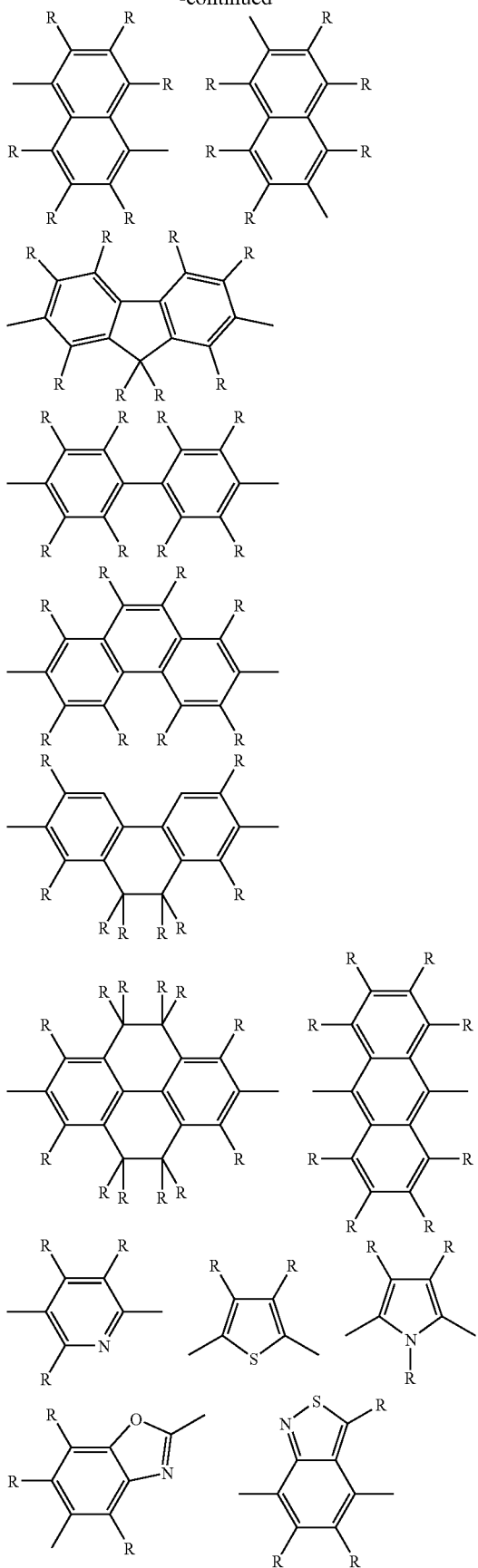
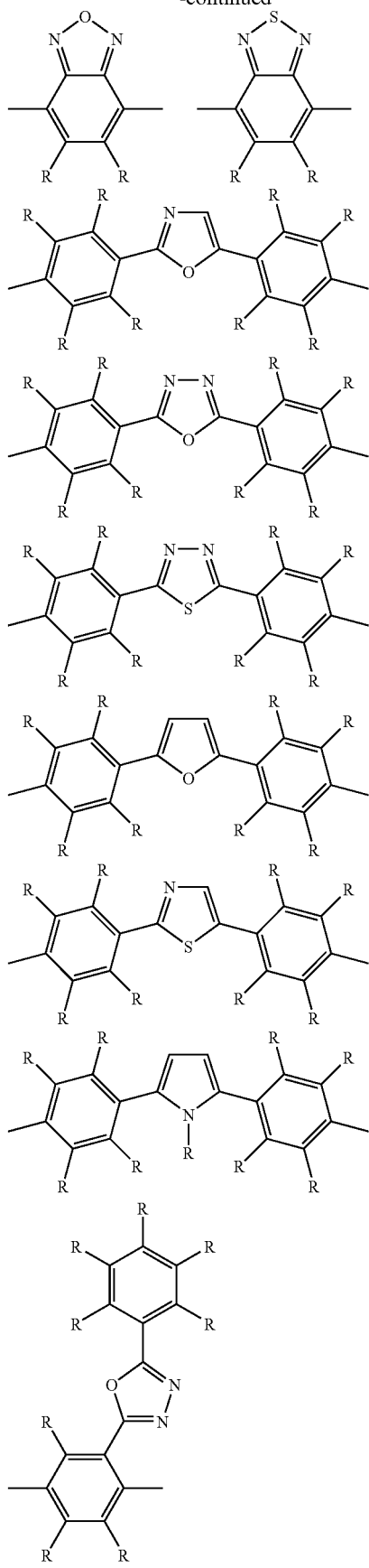

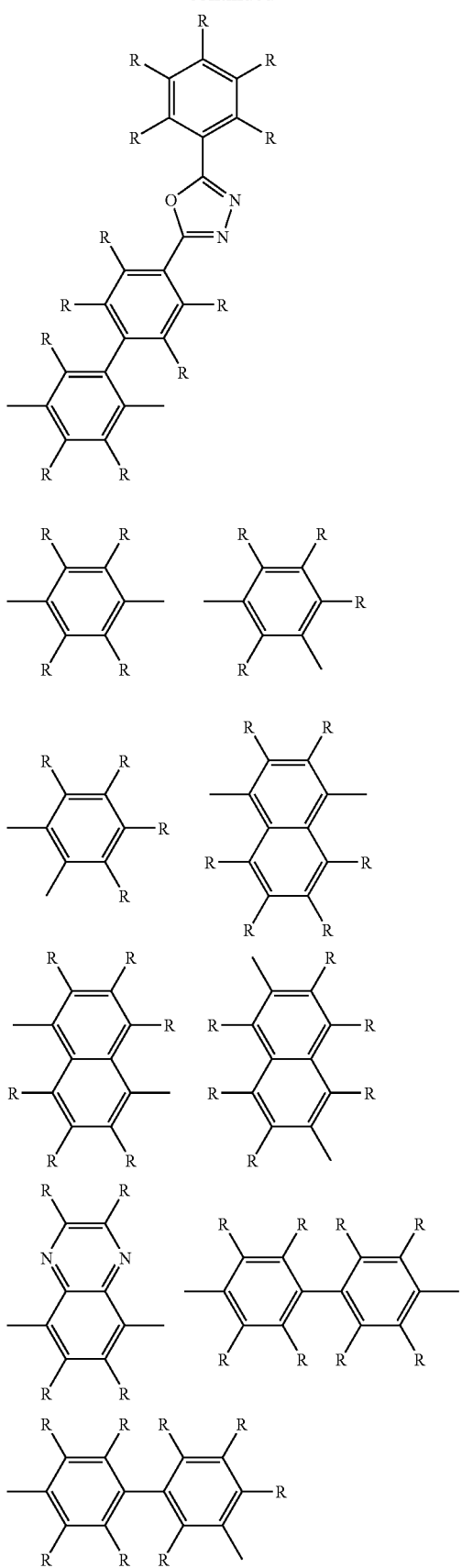
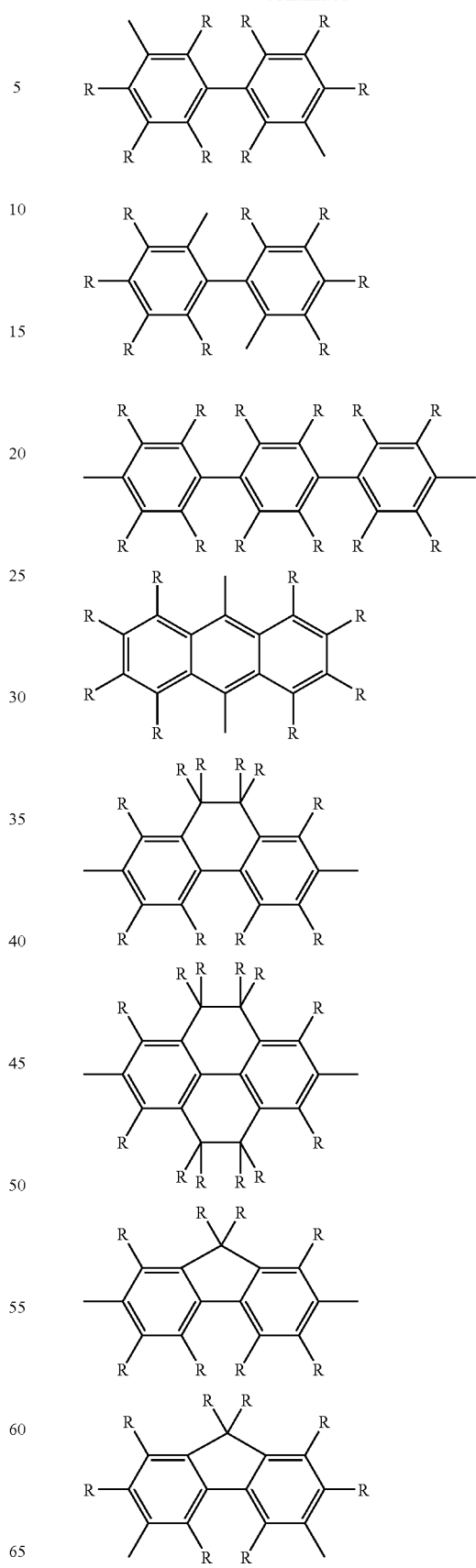

285
286
-continued
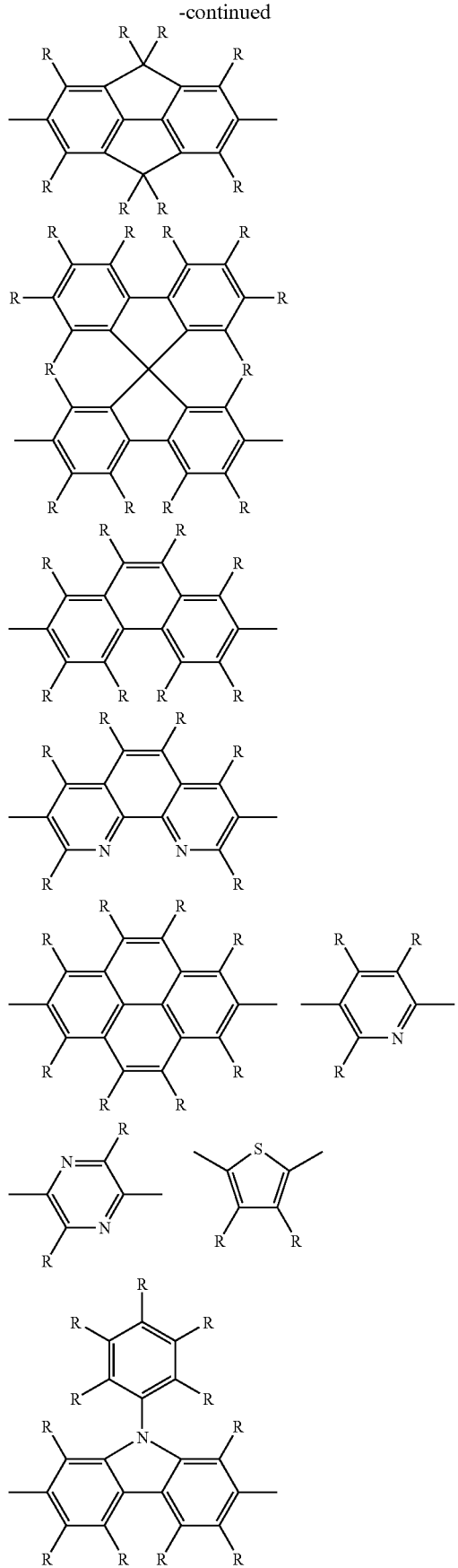
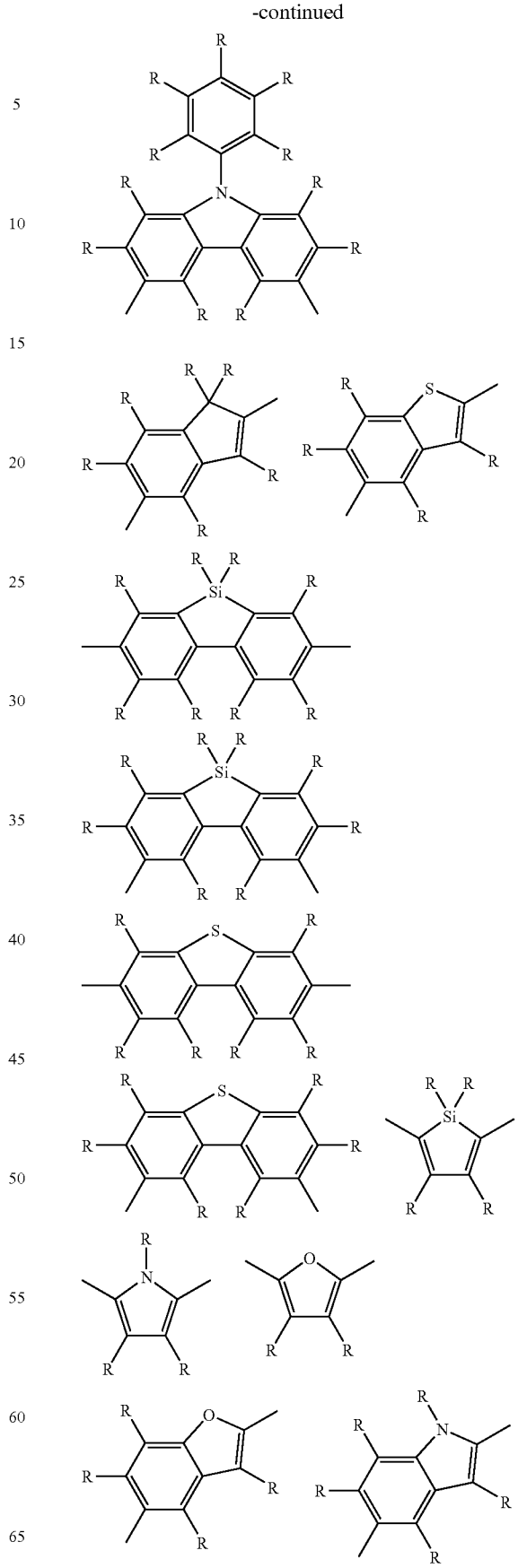

US 8,008,418 B2
287
-continued
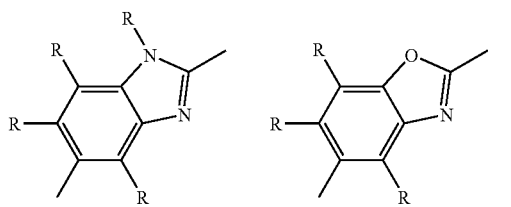
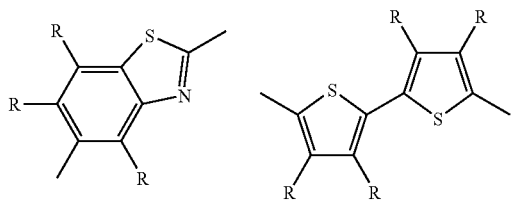
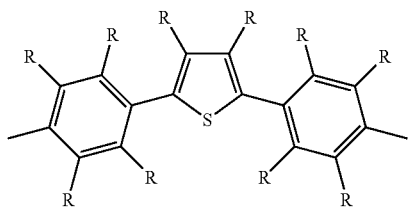
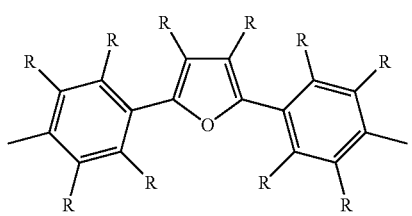
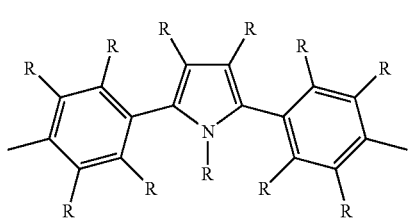
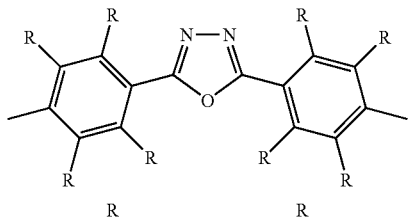
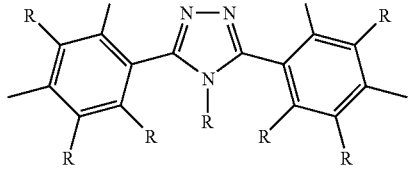
288
-continued
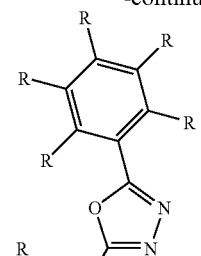
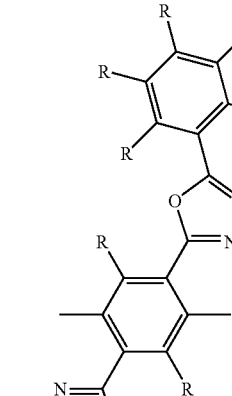
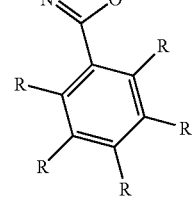
Substituents R of these arylene and/or heteroarylene monomer units are independently substituents selected from the group consisting of —R¹, —OR², —SR³, —OCOR⁴, —COOR⁵, and —SiR⁶R⁷R⁸ (here, R¹ to R⁸ are a hydrogen atom, a C1 to C22 straight-chain, cyclic, or branched alkyl group, or a C2 to C30 aryl or heteroaryl group), which may be identical to or different from each other, and are substituents that are bonded to a substitutable position of the arylene and/or heteroarylene skeleton.

Among these substituents, it is preferable from the viewpoint of polymerization reactivity and heat resistance that each R is independently a hydrogen atom in which the monomer unit is unsubstituted, —R¹ in which the monomer unit is substituted with an alkyl group, an aryl group, or a heteroaryl group, or —OR² in which the monomer unit is substituted with a hydroxyl group, an alkoxy group, an aryloxy group, or a heteroaryloxy group.

In the metal coordination compound-containing copolymer [I] of the present invention, it is preferable that the group linking the monomer units is a linking group represented by Formula (14):

-(G)b-                 (14)

(in the formula, G is a divalent group selected from the group consisting of —O—, —R—O—R—, —S—, —NR—, —CR₂—, —SiR₂—, —SiR₂—O—SiR₂—, and —SiR₂—O—SiR₂—O—SiR₂— (here, R is a C1 to C22 straight-chain, cyclic, or branched alkyl group, or a C2 to C30 aryl or heteroaryl group), and b is an integer of 0 or 1).

In the above-mentioned Formula (14), when b is 0, it means a single bond. Among these, the linking group is preferably a single bond or —O—, from the viewpoint of ease of synthesis. R in —R—O—R—, —NR—, —CR₂—, —SiR₂—, —SiR₂—O—SiR₂—, or —SiR₂—O—SiR₂—O—SiR₂— is preferably a C1 to C22 straight-chain, cyclic, or branched alkyl group from the viewpoint of imparting solubility, and particularly preferably, from the viewpoint of polymerization reactivity, a C1 to C6 straight-chain alkyl group.

The metal coordination compound-containing copolymer [I] of the present invention contains at least the above-mentioned three monomer unit components and, if necessary, may contain as a 'comonomer unit', that is, a monomer unit other than the above-mentioned monomer units, a monomer unit having a substituted or unsubstituted triphenylamine skeleton. Examples of such a monomer unit having a triphenylamine skeleton include triphenylamine, N-(4-butylphenyl)-N,N-diphenylamine, N,N'-diphenyl-N,N'-bis(3-methylphenyl)-[1,1'-biphenyl]-4,4'-diamine, and N,N'-bis(3-methylphenyl)-N,N'-bis(2-naphthyl)-[1,1'-biphenyl]-4,4'-diamine. With regard to groups that can substitute these aromatic rings, there can be cited as examples C1 to C22 alkyl and alkoxy groups.

The mole fraction of the metal coordination compound monomer unit relative to the total number of monomer units of the metal coordination compound-containing copolymer [I] of the present invention is preferably 0.1% to 30%, more preferably 0.5% to 20%, and most preferably 1% to 10%. When the metal coordination compound monomer unit is present at less than 0.1%, the luminescence chromaticity tends to deteriorate, and when it exceeds 30%, the luminance tends to decrease.

The mole fraction of the quinoline monomer unit relative to the total number of monomer units of the metal coordination compound-containing copolymer [I] of the present invention is preferably 1% to 70%, more preferably 3% to 65%, and most preferably 5% to 50%. When the quinoline monomer unit is present at less than 1%, the luminance tends to decrease, and when it exceeds 70%, the luminescence chromaticity tends to deteriorate.

The mole fraction of the arylene and/or heteroarylene unit relative to the total number of monomer units of the metal coordination compound-containing copolymer [I] of the present invention is preferably 1% to 99%, more preferably 3% to 97%, and most preferably 5% to 95%. When the arylene and/or heteroarylene unit is present at less than 1%, the luminance tends to decrease, and when it exceeds 99%, the luminescence chromaticity tends to deteriorate.

The mole fraction of the monomer unit having a substituted or unsubstituted triphenylamine skeleton that can be copolymerized with the metal coordination compound-containing copolymer [I] of the present invention is preferably 0% to 30% of the total number of monomer units of the polymer.

The metal coordination compound-containing copolymer [I] of the present invention can be produced by various synthetic methods known to a person skilled in the art. For example, when there is no group linking each of the monomer units, methods reported by T. Yamamoto et al. in Bull. Chem. Soc. Jap., Vol. 51, No. 7, p. 2091 (1978), and by M. Zembayashi et al. in Tet. Lett., Vol. 47, p. 4089 (1977) can be employed, and a method reported by Suzuki in Synthetic Communications, Vol. 11, No. 7, p. 513 (1981) is generally used for production of a copolymer. This reaction involves a Pd-catalyzed cross-coupling reaction between an aromatic boronic acid derivative and an aromatic halide (normally called the 'Suzuki reaction'), and enables the metal coordination compound-containing copolymer [I] of the present invention to be produced by a reaction that links the respective aromatic rings together.

This reaction requires a soluble Pd compound in the form of a Pd(II) salt or a Pd(0) complex. As the Pd source, 0.01 to 5 mol %, relative to the aromatic reactants, of Pd(PPh₃)₄, a complex between a tertiary phosphine ligand and Pd(OAc)₂, or a PdCl₂(dppf) complex is generally preferable. This reaction also requires a base, and an aqueous alkali carbonate or bicarbonate is most preferable. The reaction can be promoted by the use of a phase-transfer catalyst in a nonpolar solvent. As the solvent, N,N-dimethylformamide, toluene, dimethoxyethane, tetrahydrofuran, etc. can be used.

In the case of the polymer [I] of the present invention, specifically, for example, it can be produced by copolymerization of a diboronic acid ester of a quinoline derivative represented by the formulae below

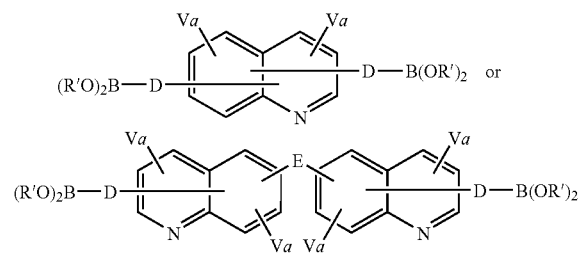

(in the formulae, R' is a lower alkyl group such as methyl, ethyl, or propyl, or a lower alkylene group such as ethylene or propylene in which two R' groups are bonded to each other to form a ring, and V, D, E, and a are as described above) with a dibromo metal coordination compound derivative monomer and a dibromoarylene and/or dibromoheteroarylene monomer in the presence of a palladium (0) catalyst using a water-soluble base.

When the group linking each of the monomer units is —O—, the metal coordination compound-containing copolymer of the present invention can be produced by a reaction, in a polar solvent in the presence of a base, between a difluoroquinoline monomer, a dihydroxy metal coordination compound derivative monomer, and a dihydroxyarylene and/or dihyroxyheteroarylene monomer, between a dibromo metal coordination compound derivative monomer, a dibromoarylene and/or dibromoheteroarylene monomer, and a dihydroxyquinoline monomer, or between a dibromoquinoline monomer, a dibromoarylene and/or dibromoheteroarylene monomer, and a dihydroxy metal coordination compound derivative monomer, as disclosed in Japanese Patent Application Laid-open No. 9-136954. This reaction is carried out by a reaction for producing the metal coordination compound-containing copolymer of the present invention in the presence of a base that can deprotonate a dihydroxy compound. Examples of such a base include alkali metal or alkaline earth metal carbonates or hydroxides such as potassium carbonate, potassium hydroxide, sodium carbonate, and sodium hydroxide. When the acidity of the dihydroxy compound is too low for it to be sufficiently deprotonated by sodium hydroxide, a stronger base such as a metal hydride, for example, sodium hydride, butyllithium, or a metal amide, for example, sodium amide, may be used. Water is generated during a reaction between this base and the dihydroxy compound. This water can be removed by azeotropic distillation.

The metal coordination compound-containing copolymer [I] of the present invention can further be copolymerized with another monomer, and examples of other dihydroxy monomers include isopropylidenediphenol (bisphenol A), 1,2-di(4-hydroxyphenyl)ethane, di(4-hydroxyphenyl)methane, N,N-bis(4-hydroxyphenyl)-N-phenylamine, and N,N'-bis(4-hydroxyphenyl)-N,N'-bis(3-methylphenyl)-[1,1'-biphenyl]-4,4'-diamine.

[II] A metal coordination compound-containing copolymer comprising
a metal coordination compound monomer unit represented by any one of the Formulae (1) to (12),
a substituted or unsubstituted quinoline monomer unit represented by Formulae (13-1):

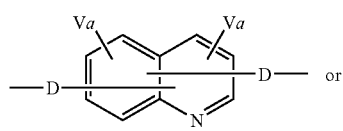  or

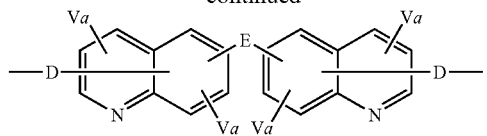

(in the formulae, a plurality of V are independently substituents selected from the group consisting of —R$^1$, —OR$^2$, —SR$^3$, —OCOR$^4$, —COOR$^5$, and —SiR$^6$R$^7$R$^8$ (here, R$^1$ to R$^8$ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene; and E is a divalent linking group selected from the group consisting of a single bond, —O—, —S—, —C(O)—, —S(O)—, —S(O$_2$)—, —W—, —(—O—W—)m-O— (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'-, —Ar'—S—Ar'—, —Ar'—S(O)—Ar'—, —Ar'—S(O$_2$)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and a substituted or unsubstituted branched monomer unit.

It is preferable that the group linking the monomer units is a linking group represented by Formula (14):

$$-(G)b-\qquad(14)$$

(in the formula, G is a divalent group selected from the group consisting of —O—, —R—O—R—, —S—, —NR—, —CR$_2$—, —SiR$_2$—, —SiR$_2$—O—SiR$_2$—, and —SiR$_2$—O—SiR$_2$—O—SiR$_2$— (here, R is a C1 to C22 straight-chain, cyclic, or branched alkyl group, or a C2 to C30 aryl or heteroaryl group), and b is an integer of 0 or 1).

The quinoline monomer unit represented by Formulae (13-1) used in the present invention is the same as the quinoline monomer unit in the above-mentioned [I].

The substituted or unsubstituted branched monomer unit used in the present invention is preferably a unit having a tri- or higher-valent branched structure, and more preferably a unit having a trivalent or tetravalent branched structure. As the branched monomer unit, branched structures represented by Formulae (15):

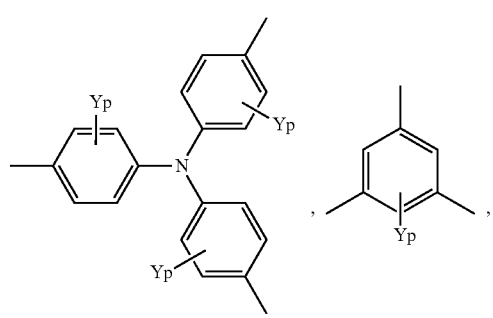

(15)
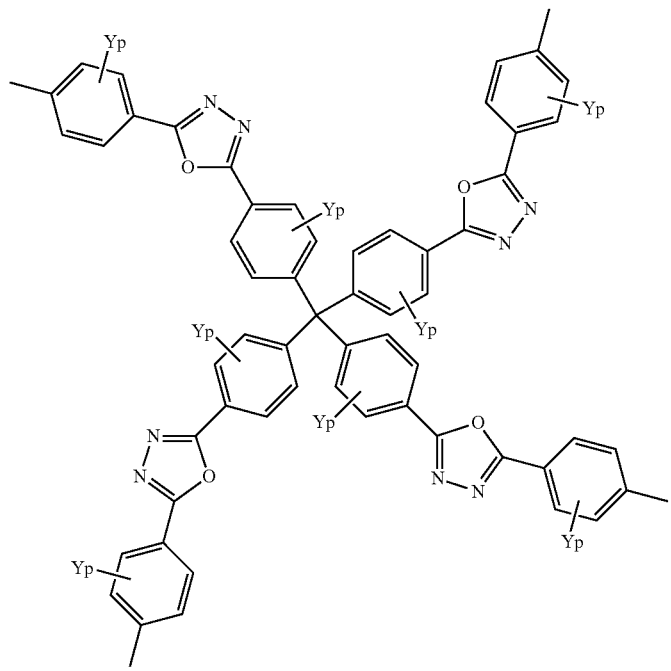
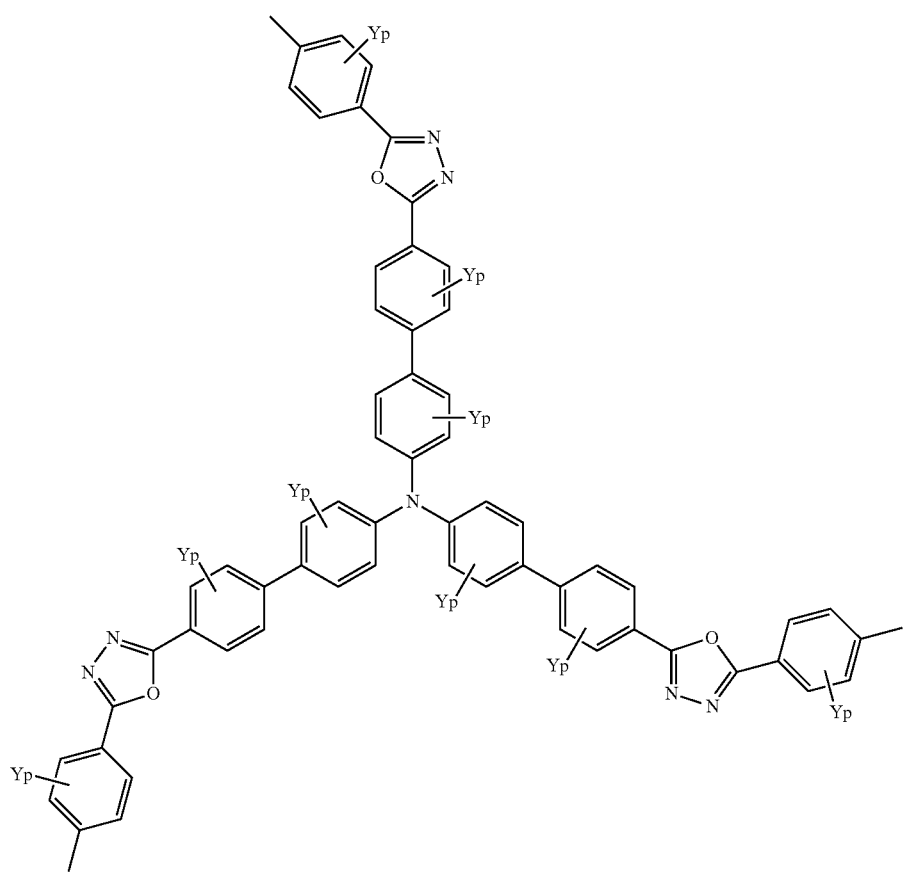
or

-continued

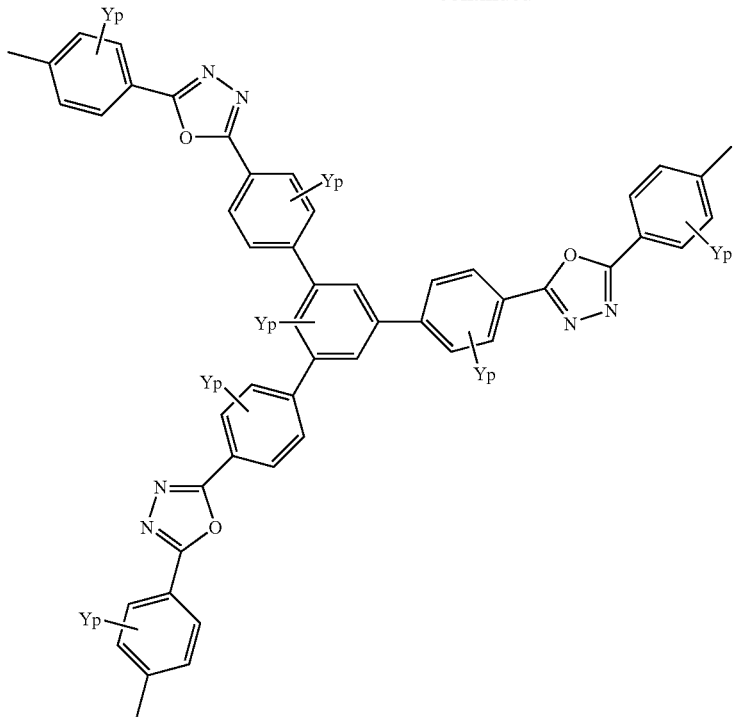

are preferable, and these branched monomer units may be used singly or in a combination of two or more types.

The substituents Y in Formulae (15) for these branched monomer units are substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of a benzene ring having a branched skeleton, and p is an integer of 0 to 4. It is preferable for p to be 0 to 2.

Furthermore, $R^1$ to $R^8$ of the substituent Y are independently a C1 to C22 straight-chain alkyl, cyclic alkyl, or branched alkyl group, or a C2 to C30 aryl or heteroaryl group. Examples of such groups include C1 to C22 straight-chain alkyl, cyclic alkyl, or branched alkyl groups such as methyl, ethyl, propyl, cyclopropyl, butyl, isobutyl, cyclobutyl, pentyl, isopentyl, neopentyl, cyclopentyl, hexyl, cyclohexyl, heptyl, cycloheptyl, octyl, nonyl, and decyl, and C2 to C30 aryl or heteroaryl groups such as phenyl, naphthyl, anthracenyl, a biphenyl residue, a terphenyl residue, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, and a quinoxaline residue.

The substituent Y may further have a substituent. Examples of the substituent on Y include a substituent represented by the above-mentioned —$R^1$, —$OR^2$, —$SR^3$, —$OCOR^4$, —$COOR^5$, or —$SiR^6R^7R^8$, and a substituent represented by —$NR^9R^{10}$ (here, $R^9$ and $R^{10}$ are independently a C1 to C22 straight-chain, cyclic, or branched alkyl group, or a C2 to C20 aryl or heteroaryl group). When there is a plurality of substituents, the plurality of substituents may be identical to or different from each other.

Among these substituents, with regard to each Yp independently, it is preferable, from the viewpoint of polymerization reactivity and heat resistance, for p to be 0, that is, the monomer unit is unsubstituted, or for Y to be an alkyl group substituent represented by —$R^1$. With regard to the number of substituents, including a case in which p is 0, that is, the monomer unit is unsubstituted, p is preferably 1 from the viewpoint of polymerization reactivity.

In the metal coordination compound-containing copolymer [II] of the present invention, a group linking each monomer unit and represented by Formula (14) is the same as the linking group in the above-mentioned [I].

The metal coordination compound-containing copolymer [II] of the present invention contains at least the above-mentioned three monomer unit components and, if necessary, may contain as a 'comonomer unit', that is, a monomer unit other than the above-mentioned monomer units, a monomer unit having a substituted or unsubstituted triphenylamine skeleton. As such a monomer unit having a triphenylamine skeleton, the same ones as the monomer units having a triphenylamine skeleton in the above-mentioned [I] can be used.

Furthermore, the metal coordination compound-containing copolymer [II] of the present invention contains at least the above-mentioned three monomer unit components and, if necessary, may contain as a 'comonomer unit', that is, a monomer unit other than the above-mentioned monomer units, a monomer unit having a substituted or unsubstituted arylene and/or heteroarylene monomer unit. As such a substituted or unsubstituted arylene and/or heteroarylene monomer unit, the same ones as the arylene and/or heteroarylene monomer units in the above-mentioned [I] can be used.

The mole fraction of the metal coordination compound monomer unit relative to the total number of monomer units of the metal coordination compound-containing copolymer [II] of the present invention is preferably 0.1% to 30%, more preferably 0.5% to 20%, and most preferably 1% to 10%. When the metal coordination compound monomer unit is present at less than 0.1%, the luminescence chromaticity tends to deteriorate, and when it exceeds 30%, the luminance tends to decrease.

The mole fraction of the quinoline monomer unit relative to the total number of monomer units of the metal coordination compound-containing copolymer [II] of the present invention is preferably 1% to 70%, more preferably 3% to 65%, and most preferably 5% to 50%. When the quinoline monomer unit is present at less than 1%, the luminance tends to decrease, and when it exceeds 70%, the luminescence chromaticity tends to deteriorate.

The mole fraction of the substituted or unsubstituted branched monomer unit relative to the total number of monomer units of the metal coordination compound-containing copolymer [II] of the present invention is preferably 0.1% to 30%, more preferably 0.5% to 20%, and most preferably 1% to 10%. When the branched monomer unit is present at less than 0.1%, the luminescence chromaticity tends to deteriorate, and when it exceeds 30%, the luminance tends to decrease.

The mole fraction of the monomer unit having a substituted or unsubstituted triphenylamine skeleton or a substituted or unsubstituted arylene and/or heteroarylene monomer unit that can be copolymerized with the metal coordination compound-containing copolymer [II] of the present invention is preferably 0% to 48% of the total number of monomer units of the polymer.

The metal coordination compound-containing copolymer [II] of the present invention can be produced by the same synthetic method as that for the above-mentioned [I].

In the case of the polymer [II] of the present invention, for example, when there is no group linking each of the monomer units, specifically, it can be produced by copolymerization of a diboronic acid ester of a quinoline derivative represented by the formulae below

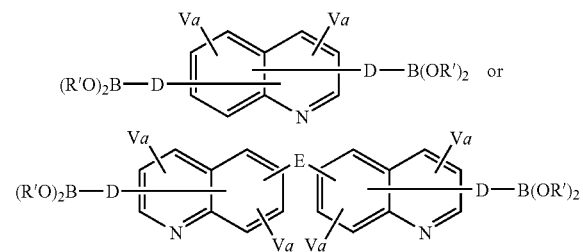

(in the formulae, R' is a lower alkyl group such as methyl, ethyl, or propyl, or a lower alkylene group such as ethylene or propylene in which two R' groups are bonded to each other to form a ring, and V, D, E, and a are as described above) with a dibromo metal coordination compound derivative monomer and a tribromo branched derivative in the presence of a palladium (0) catalyst using a water-soluble base.

When the group linking each of the monomer units is —O—, the metal coordination compound-containing copolymer of the present invention can be produced by a reaction, in a polar solvent in the presence of a base, between a difluoroquinoline monomer, a dihydroxy metal coordination compound derivative monomer, and a trihydroxy branched derivative, between a dibromo metal coordination compound derivative monomer, a tribromo branched derivative, and a dihydroxyquinoline monomer, or between a dibromoquinoline monomer, a tribromo branched derivative, and a dihydroxy metal coordination compound derivative monomer, as disclosed in Japanese Patent Application Laid-open No. 9-136954.

The metal coordination compound-containing copolymer [II] of the present invention can further be copolymerized with another monomer, and as examples of other dihydroxy monomers the same ones as the dihydroxy monomers in the above-mentioned [I] can be used.

[III] A metal coordination compound-containing copolymer comprising a metal coordination compound monomer unit represented by any one of Formulae (1) to (12), and a substituted or unsubstituted conjugated monomer unit represented by Formula (13-2):

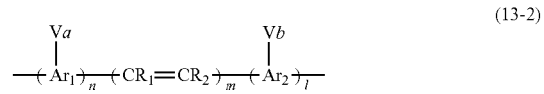

(13-2)

(in the formula, $Ar_1$ and $Ar_2$ are divalent arylene and/or heteroarylene; a plurality of V, and $R_1$ and $R_2$, are independently substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; $R_1$ and $R_2$ may independently be a hydrogen atom; n, m, and l are independently 0 or 1, and n, m, and l are not simultaneously 0).

It is preferable that the group linking the monomer units is a linking group represented by Formula (14):

-(G)b- (14)

(in the formula, G is a divalent group selected from the group consisting of —O—, —R—O—R—, —S—, —NR—, —$CR_2$—, —$SiR_2$—, —$SiR_2$—O—$SiR_2$—, and —$SiR_2$—O—$SiR_2$—O—$SiR_2$— (here, R is a C1 to C22 straight-chain, cyclic, or branched alkyl group, or a C2 to C30 aryl or heteroaryl group), and b is an integer of 0 or 1).

The conjugated monomer unit represented by Formula (13-2):

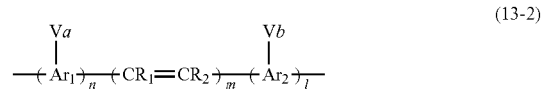

(13-2)

used in the present invention can be used singly or in a combination of two or more types.

In the monomer unit of Formula (13-2) of the present invention, $Ar_1$ and $Ar_2$ are divalent arylene and/or heteroarylene, a plurality of V, and $R_1$ and $R_2$, are independently substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater. $R_1$ and $R_2$ may independently be a hydrogen atom, n, m, and l are independently 0 or 1, and n, m, and l are not simultaneously 0). $Ar_1$ and $Ar_2$ may be identical to or different from each other, and when there is a plurality of substituents V, these substituents may be identical to or different from each other.

In the Formula (13-2), $Ar_1$ and $Ar_2$ are substituted or unsubstituted arylene and/or heteroarylene. With regard to such substituted or unsubstituted arylene and/or heteroarylene, a divalent group is preferable; examples thereof include benzene, biphenyl, terphenyl, naphthalene, anthracene, tetracene, fluorene, phenanthrene, pyrene, chrysene, pyridine, pyrazine, isoquinoline, acridine, phenanthroline, furan, pyrrole, thiophene, oxazole, oxadiazole, thiadiazole, triazole, benzoxazole, benzoxadiazole, benzothiadiazole, benzothiophene, diphenyloxadiazole, benzothiadiazole, diphenyldiazole, and diphenylthiadiazole, and they are used as $Ar_1$ and $Ar_2$ either singly or in a manner in which a plurality thereof are bonded.

Furthermore, $R^1$ to $R^8$ of the substituents V, $R_1$, and $R_2$ are independently a C1 to C22 straight-chain alkyl, cyclic alkyl, or branched alkyl group, or a C2 to C30 aryl or heteroaryl group. Examples of such groups include C1 to C22 straight-chain alkyl, cyclic alkyl, or branched alkyl groups such as methyl, ethyl, propyl, cyclopropyl, butyl, isobutyl, cyclobutyl, pentyl, isopentyl, neopentyl, cyclopentyl, hexyl, cyclohexyl, heptyl, cycloheptyl, octyl, nonyl, and decyl, and C2 to C30 aryl or heteroaryl groups such as phenyl, naphthyl, anthracenyl, a biphenyl residue, a terphenyl residue, a furan residue, a thiophene residue, a pyrrole residue, an oxazole residue, a thiazole residue, an imidazole residue, a pyridine residue, a pyrimidine residue, a pyrazine residue, a triazine residue, a quinoline residue, and a quinoxaline residue.

The substituents V, $R_1$, and $R_2$ may further have a substituent. Examples of the substituent on V, $R_1$, and $R_2$ include a substituent represented by the above-mentioned —$R^1$, —$OR^2$, —$SR^3$, —$OCOR^4$, —$COOR^5$, or —$SiR^6R^7R^8$, and a substituent represented by —$NR^9R^{10}$ (here, $R^9$ and $R^{10}$ are independently a C1 to C22 straight-chain, cyclic, or branched alkyl group, or a C2 to C20 aryl or heteroaryl group). When there is a plurality of substituents, the plurality of substituents may be identical to or different from each other.

Among the conjugated monomer units of Formula (13-2) in the present invention, it is preferable, from the viewpoint of solubility and heat resistance, for V, $R_1$, and $R_2$ to be independently a hydrogen atom, that is, the monomer unit is unsubstituted, —$R^1$ in which the monomer unit is substituted with an alkyl, aryl, or heteroaryl group, or —$OR^2$ in which the monomer unit is substituted with an alkoxy, aryloxy, or heteroaryloxy group. With regard to the number of substituents, including a case in which a or b is 0, that is, the monomer unit is unsubstituted, a or b is preferably 1 to 3 from the viewpoint of polymerization reactivity. Furthermore, the aryl group is preferably a substituted or unsubstituted phenyl group, a substituted or unsubstituted fluorene group, etc. Moreover, the heteroaryl group is preferably an oxadiazole group, a phenyloxadiazole group, a phenylthiadiazole group, a benzothiadiazole group, etc.

Representative examples of $Ar_1$ and $Ar_2$ include those represented by the structural formulae below.

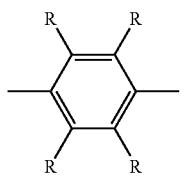
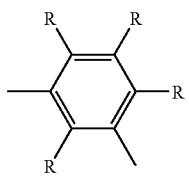

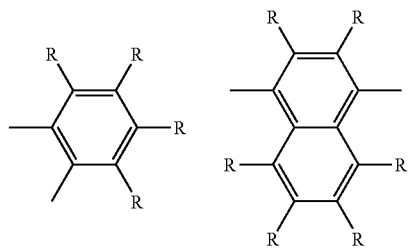

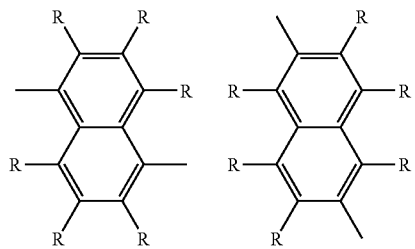

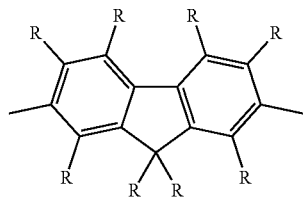

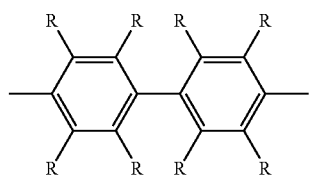

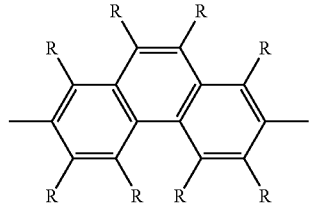

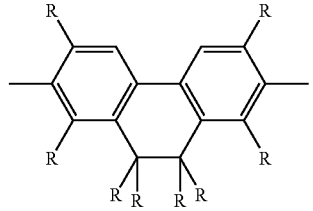

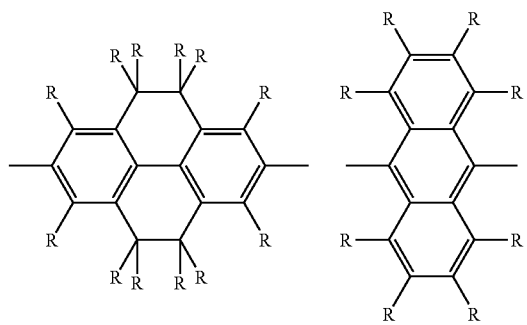

301
-continued
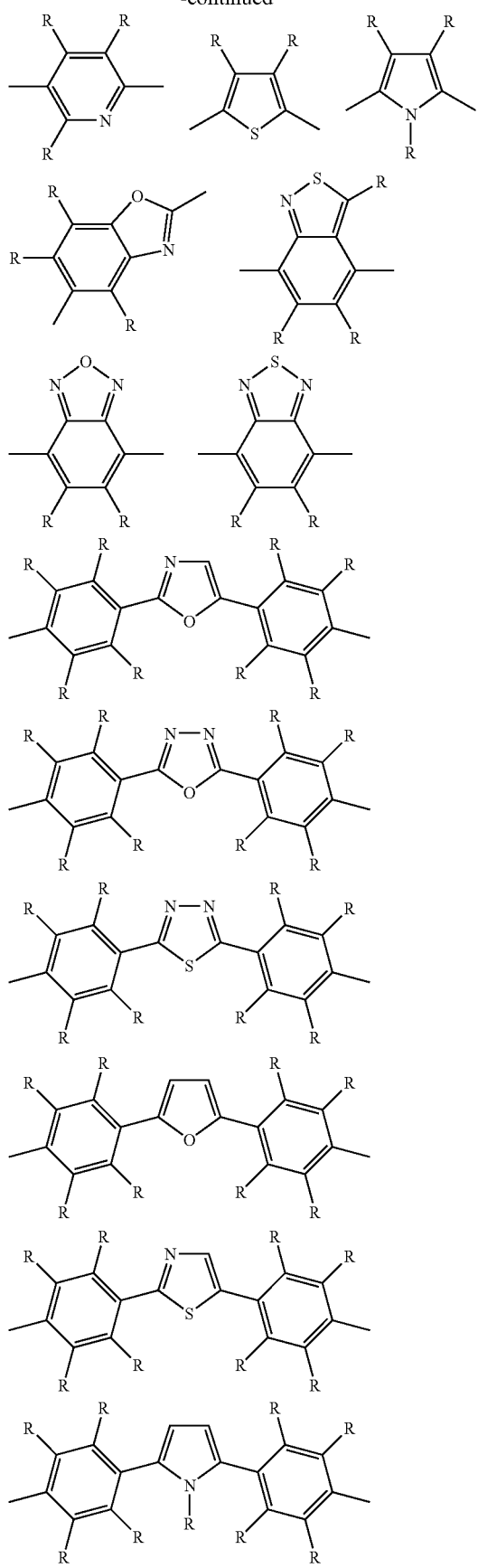
302
-continued
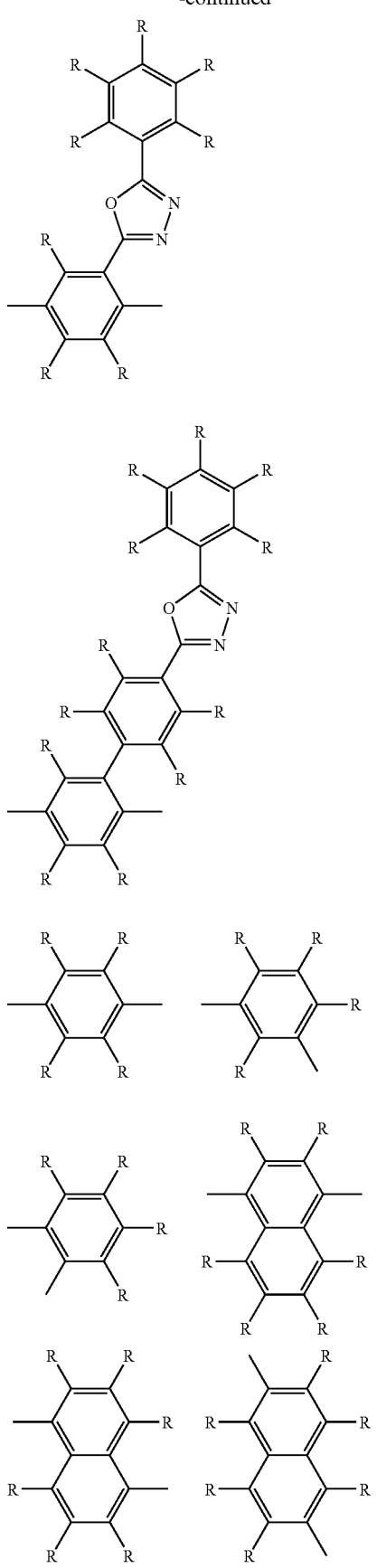

303
-continued
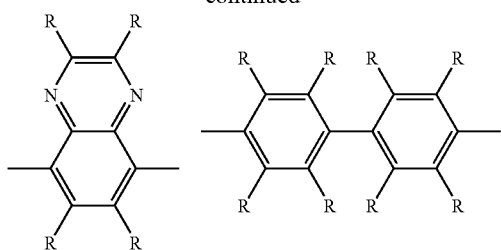
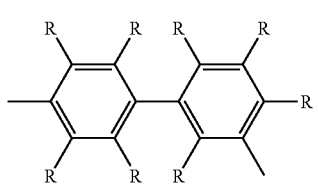
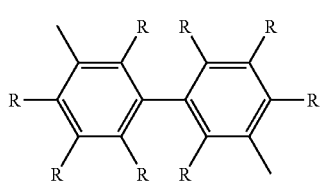
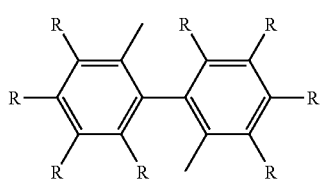
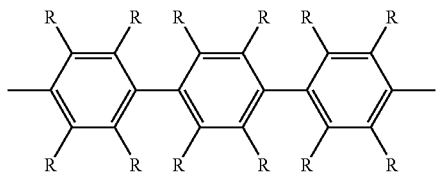
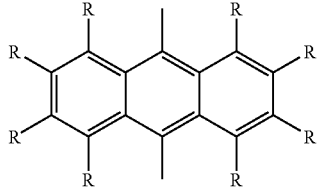
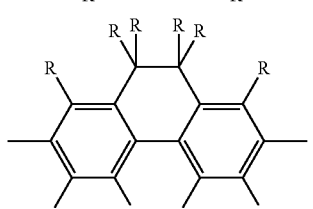
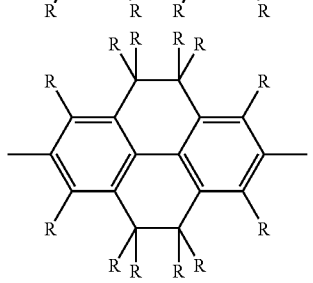
304
-continued
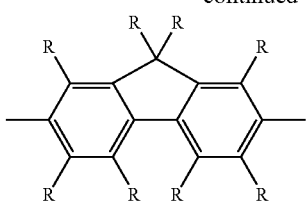
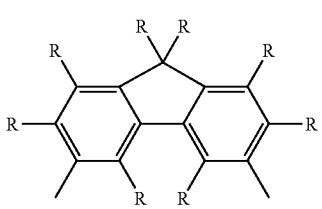
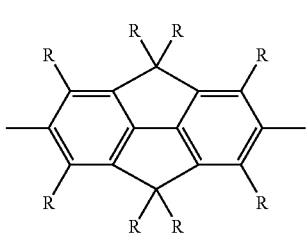
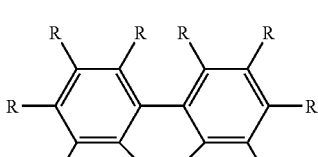
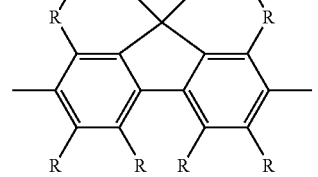
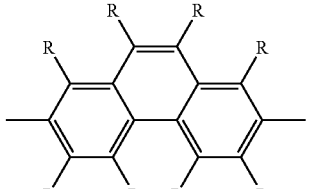
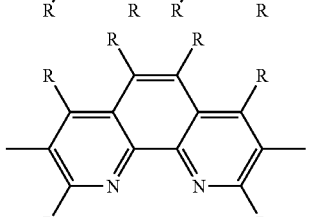
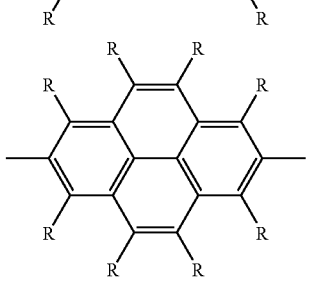 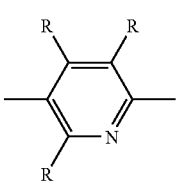

305
-continued
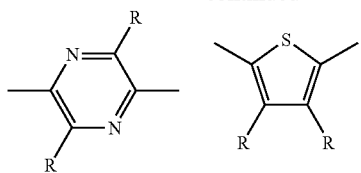
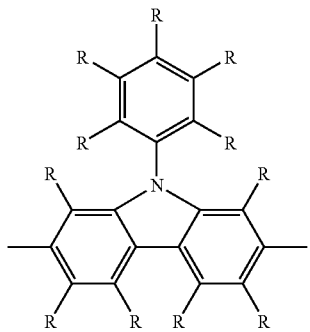
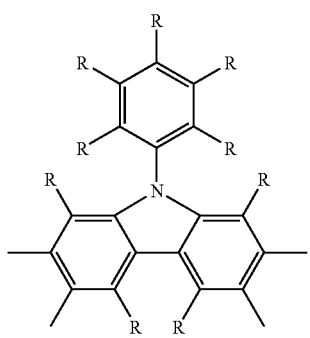
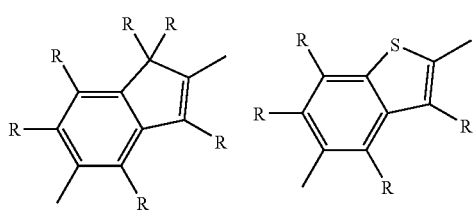
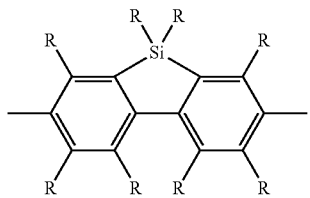
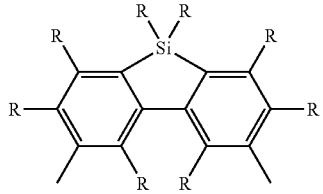
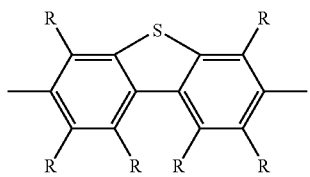
306
-continued
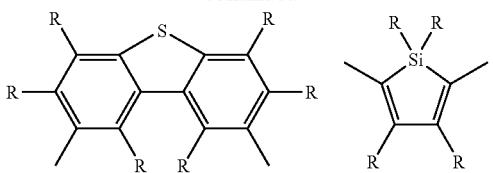
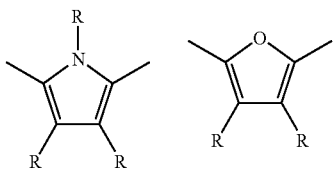
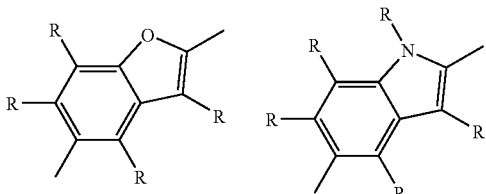
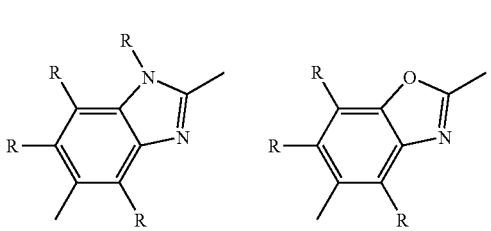
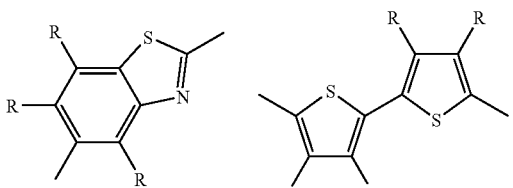
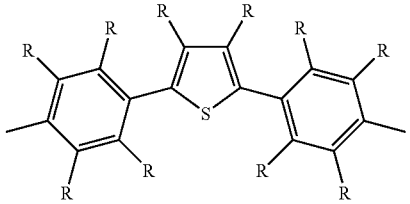
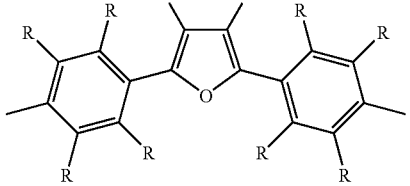
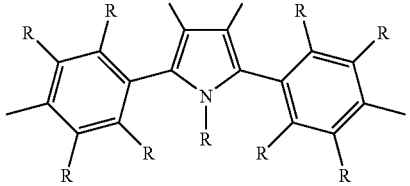

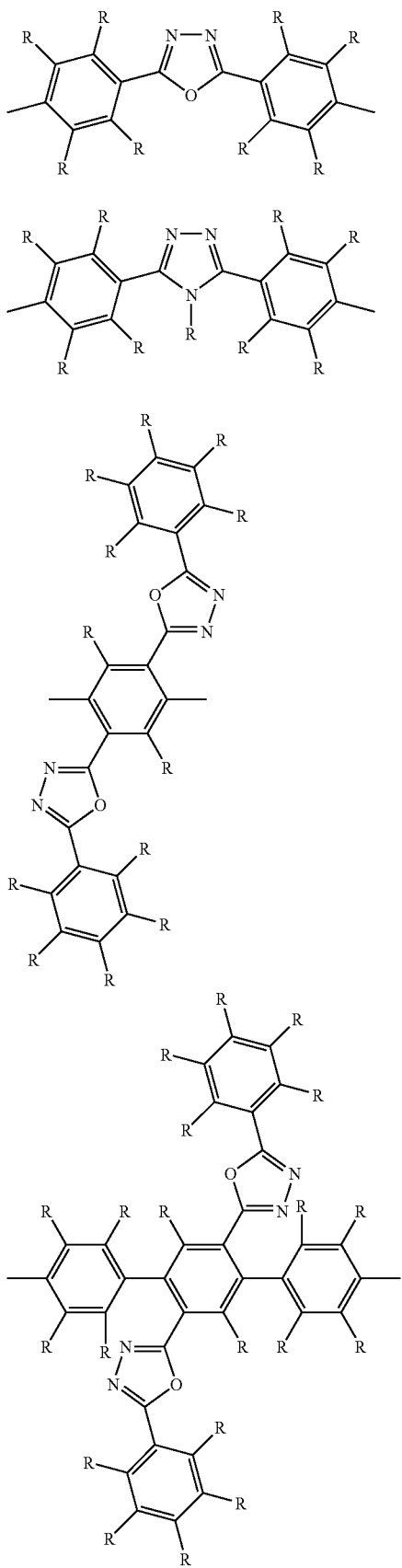

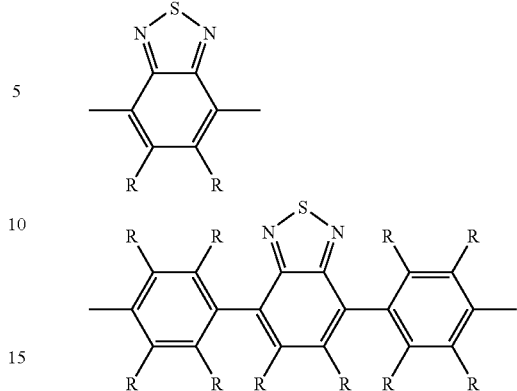

Substituents R of these arylene and/or heteroarylene are independently substituents selected from the group consisting of —$R^1$, —$OR^2$, —$SR^3$, —$OCOR^4$, —$COOR^5$, and —$SiR^6R^7R^8$ (here, $R^1$ to $R^8$ are a hydrogen atom, a C1 to C22 straight-chain, cyclic, or branched alkyl group, or a C2 to C30 aryl or heteroaryl group), which may be identical to or different from each other, and are substituents that are bonded to a substitutable position of the arylene and/or heteroarylene skeleton.

Among these substituents, it is preferable from the viewpoint of polymerization reactivity and heat resistance that each R is independently a hydrogen atom, that is, the monomer unit is unsubstituted, —$R^1$ in which the monomer unit is substituted with an alkyl group, an aryl group, or a heteroaryl group, or —$OR^2$ in which the monomer unit is substituted with a hydroxyl group, an alkoxy group, an aryloxy group, or a heteroaryloxy group.

In the metal coordination compound-containing copolymer [III] of the present invention, a group linking each monomer unit and represented by Formula (14) is the same as the linking group in the above-mentioned [I].

The metal coordination compound-containing copolymer [III] of the present invention contains at least the above-mentioned two monomer unit components and, if necessary, may contain as a 'comonomer unit', that is, a monomer unit other than the above-mentioned monomer units, a monomer unit having a substituted or unsubstituted triphenylamine skeleton. As such a monomer unit having a triphenylamine skeleton, the same ones as the monomer unit having a triphenylamine skeleton in the above-mentioned [I] can be used.

The mole fraction of the metal coordination compound monomer unit relative to the total number of monomer units of the metal coordination compound-containing copolymer [III] of the present invention is preferably 0.1% to 30%, more preferably 0.5% to 20%, and most preferably 1% to 10%. When the metal coordination compound monomer unit is present at less than 0.1%, the luminescence chromaticity tends to deteriorate, and when it exceeds 30%, the luminance tends to decrease.

The mole fraction of the conjugated monomer unit relative to the total number of monomer units of the metal coordination compound-containing copolymer [III] of the present invention is preferably 70% to 99.9%, more preferably 75% to 99.5%, and most preferably 80% to 99%. When the conjugated monomer unit is present at less than 70%, the luminance tends to decrease, and when it exceeds 99.9%, the luminescence chromaticity tends to deteriorate.

The mole fraction of the monomer unit having a substituted or unsubstituted triphenylamine skeleton that can be copolymerized with the metal coordination compound-containing copolymer [III] of the present invention is preferably 0% to 49% of the total number of monomer units of the polymer.

The metal coordination compound-containing copolymer [III] of the present invention can be produced by the same synthetic method as in the above-mentioned [I].

In the case of the polymer [III] of the present invention, for example, when there is no group linking each of the monomer units, specifically, it can be produced by copolymerization of a diboronic acid ester of a conjugated monomer derivative and/or a dibromo compound of the conjugated monomer derivative, represented by the formula below

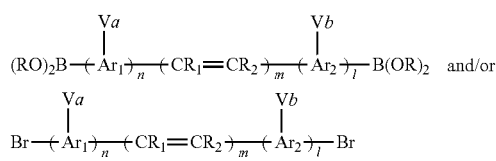

(in the formulae, R is a lower alkyl group such as methyl, ethyl, or propyl, or a lower alkylene group such as ethylene or propylene in which two R groups are bonded to each other to form a ring, and $Ar_1$, $Ar_2$, $R_1$, $R_2$, V, a, b, n, m, and l are as described above) with a dibromo metal coordination compound derivative monomer in the presence of a palladium (0) catalyst using a water-soluble base.

When the group linking each of the monomer units is —O—, the metal coordination compound-containing copolymer of the present invention can be produced by a reaction, in a polar solvent in the presence of a base, between a difluoro conjugated monomer and a dihydroxy metal coordination compound derivative monomer, between a dibromo metal coordination compound derivative monomer and a dihydroxy conjugated monomer, or between a dibromo conjugated monomer and a dihydroxy metal coordination compound derivative monomer, as disclosed in Japanese Patent Application Laid-open No. 9-136954.

The metal coordination compound-containing copolymer [III] of the present invention can further be copolymerized with another monomer, and as examples of other dihydroxy monomers the same ones as the dihydroxy monomers in the above-mentioned [I] can be used.

[IV] A metal coordination compound-containing copolymer comprising a metal coordination compound monomer unit represented by any one of the Formulae (1) to (12), a substituted or unsubstituted conjugated monomer unit represented by Formula (13-2):

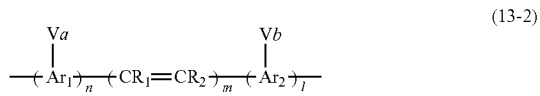 (13-2)

(in the formula, $Ar_1$ and $Ar_2$ are divalent arylene and/or heteroarylene; a plurality of V, and $R_1$ and $R_2$, are independently substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; R1 and R2 may independently be a hydrogen atom; n, m, and l are independently 0 or 1, and n, m, and l are not simultaneously 0), and a substituted or unsubstituted branched monomer unit.

It is preferable that the group linking the monomer units is a linking group represented by Formula (14):

(in the formula, G is a divalent group selected from the group consisting of —O—, —R—O—R—, —S—, —NR—, —$CR_2$—, —$SiR_2$—, —$SiR_2$—O—$SiR_2$—, and —$SiR_2$—O—$SiR_2$—O—$SiR_2$— (here, R is a C1 to C22 straight-chain, cyclic, or branched alkyl group, or a C2 to C30 aryl or heteroaryl group), and b is an integer of 0 or 1).

The conjugated monomer unit represented by Formulae (13-2) used in the present invention is the same as the conjugated monomer unit in the above-mentioned [III].

Furthermore, with regard to the substituted or unsubstituted branched monomer unit used in the present invention, ones that are the same as the branched monomer unit used in the above-mentioned [II] can be used.

In the metal coordination compound-containing copolymer [IV] of the present invention, a group linking each monomer unit and represented by Formula (14) is the same as the linking group in the above-mentioned [I].

The metal coordination compound-containing copolymer [IV] of the present invention contains at least the above-mentioned two monomer unit components and, if necessary, may contain as a 'comonomer unit', that is, a monomer unit other than the above-mentioned monomer units, a monomer unit having a substituted or unsubstituted triphenylamine skeleton. As such a monomer unit having a triphenylamine skeleton, the same ones as the monomer unit having a triphenylamine skeleton in the above-mentioned [I] can be used.

The mole fraction of the metal coordination compound monomer unit relative to the total number of monomer units of the metal coordination compound-containing copolymer [IV] of the present invention is preferably 0.1% to 30%, more preferably 0.5% to 20%, and most preferably 1% to 10%. When the metal coordination compound monomer unit is present at less than 0.1%, the luminescence chromaticity tends to deteriorate, and when it exceeds 30%, the luminance tends to decrease.

The mole fraction of the conjugated monomer unit relative to the total number of monomer units of the metal coordination compound-containing copolymer [IV] of the present invention is preferably 50% to 99.9%, more preferably 60% to 99.5%, and most preferably 75% to 99%. When the conjugated monomer unit is present at less than 50%, the luminance tends to decrease, and when it exceeds 99.9%, the luminescence chromaticity tends to deteriorate.

The mole fraction of the substituted or unsubstituted branched monomer unit relative to the total number of monomer units of the metal coordination compound-containing copolymer [IV] of the present invention is preferably 0.1% to 30%, more preferably 0.5% to 20%, and most preferably 1% to 10%. When the substituted or unsubstituted branched monomer unit is present at less than 0.1%, the luminescence chromaticity tends to deteriorate, and when it exceeds 30%, the luminance tends to decrease.

The mole fraction of a substituted or unsubstituted triphenylamine skeleton that can be copolymerized with the metal coordination compound-containing copolymer [IV] of the present invention is preferably 0% to 48% of the total number of monomer units of the polymer.

The metal coordination compound-containing copolymer [IV] of the present invention can be produced by the same synthetic method as in the above-mentioned [I].

In the case of the polymer [IV] of the present invention, for example, when there is no group linking each of the monomer units, specifically, it can be produced by copolymerization of a diboronic acid ester of a conjugated monomer derivative and/or a dibromo compound of the conjugated monomer derivative, represented by the formulae below

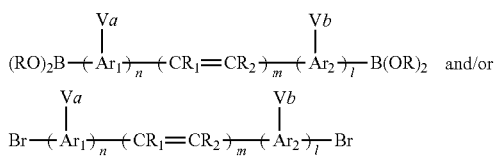

(in the formulae, R is a lower alkyl group such as methyl, ethyl, or propyl, or a lower alkylene group such as ethylene or propylene in which two R groups are bonded to each other to form a ring, and $Ar_1$, $Ar_2$, $R_1$, $R_2$, V, a, b, n, m, and l are as described above) with a dibromo metal coordination compound derivative monomer and a tribromo branched derivative in the presence of a palladium (0) catalyst using a water-soluble base.

When the group linking each of the monomer units is —O—, the metal coordination compound-containing copolymer of the present invention can be produced by a reaction, in a polar solvent in the presence of a base, between a difluoro conjugated monomer, a dihydroxy metal coordination compound derivative monomer, and a trihydroxy branched derivative, between a dibromo metal coordination compound derivative monomer, a tribromo branched derivative, and a dihydroxy conjugated monomer, or between a dibromo conjugated monomer, a tribromo branched derivative, and a dihydroxy metal coordination compound derivative monomer, as disclosed in Japanese Patent Application Laid-open No. 9-136954.

The metal coordination compound-containing copolymer [IV] of the present invention can further be copolymerized with another monomer, and as examples of other dihydroxy monomers the same ones as the dihydroxy monomers in the above-mentioned [I] can be used.

The molecular weight of the metal coordination compound-containing copolymer of the present invention is preferably 10,000 to 1,000,000, and more preferably 30,000 to 800,000. When it is less than 10,000, the film-forming properties tend to deteriorate, and when it exceeds 1,000,000, the solubility tends to decrease.

The metal coordination compound-containing copolymer of the present invention can be used as a material of an active layer of an electroluminescent device. The active layer referred to here means a layer that is able to emit light when an electric field is applied (light-emitting layer), or a layer that improves the charge injection or the charge transporting (charge injection layer or charge transporting layer). Here, the charge means a negative or a positive charge.

The thickness of the active layer can be set as appropriate while taking into consideration the luminescence efficiency, etc., and is preferably 10 to 300 nm, and more preferably 20 to 200 nm. When it is less than 10 nm, pinholes, etc. tend to occur as thin film defects, and when it exceeds 300 nm, the properties tend to deteriorate.

The copolymer of the present invention may be used as a mixture with another material. Furthermore, the electroluminescent device employing the copolymer of the present invention may further have a layer containing a material other than the above-mentioned copolymer layered with the active layer containing the copolymer of the present invention. As a material that may be used as a mixture with the copolymer of the present invention, a known material such as a positive hole injection and/or positive hole transporting material, an electron injection and/or electron transporting material, a light-emitting material, or a binder polymer can be used. The material mixed may be a high molecular weight material or a low molecular weight material.

Examples of the positive hole injection and/or positive hole transporting material that can be used include materials such as an arylamine derivative, a triphenylmethane derivative, a stilbene-based compound, a hydrazone-based compound, a carbazole-based compound, a high molecular weight arylamine, a polyaniline, and a polythiophene, and materials formed by polymerizing the above materials. Examples of the electron injection and/or electron transporting material that can be used include materials such as an oxadiazole derivative, a benzoxazole derivative, a benzoquinone derivative, a quinoline derivative, a quinoxaline derivative, a thiadiazole derivative, a benzodiazole derivative, a triazole derivative, and a metal chelate complex compound, and materials formed by polymerizing the above materials. Examples of the light-emitting material that can be used include an arylamine derivative, an oxadiazole derivative, a perylene derivative, a quinacridone derivative, a pyrazoline derivative, an anthracene derivative, a rubrene derivative, a stilbene derivative, a coumarin derivative, a naphthalene derivative, a metal chelate complex, and a metal complex containing Ir, Pt, etc. as the central metal, materials formed by polymerizing the above materials, and polymer materials such as a polyfluorene derivative, a polyphenylenevinylene derivative, a polyphenylene derivative, and a polythiophene derivative. As the binder polymer that can be used, one that does not greatly degrade the properties can be used. Examples of the binder polymer include polystyrene, polycarbonate, polyarylether, polyacrylate, polymethacrylate, and polysiloxane.

In particular, the metal coordination compound-containing copolymer of the present invention can be used as a polymer composition in which it is mixed with a conjugated or non-conjugated polymer. Examples of the conjugated or nonconjugated polymer that can be used in the polymer composition include a polyphenylene derivative, a polyfluorene derivative, a polyphenylene vinylene derivative, a polythiophene derivative, a polyquinoline derivative, a polytriphenylamine derivative, a polyvinylcarbazole derivative, a polyaniline derivative, a polyimide derivative, a polyamideimide derivative, a polycarbonate derivative, a polyacrylic derivative, and a polystyrene derivative, which may be substituted or unsubstituted. Further examples of these conjugated or non-conjugated polymers include copolymers thereof with, as necessary, another arylene and/or heteroarylene monomer unit such as benzene, biphenyl, terphenyl, naphthalene, anthracene, tetracene, fluorene, phenanthrene, pyrene, chrysene, pyridine, pyrazine, quinoline, isoquinoline, acridine, phenanthroline, furan, pyrrole, thiophene, oxazole, oxadiazole, thiadiazole, triazole, benzoxazole, benzoxadiazole, benzothiadiazole, or benzothiophene, which may be substituted or unsubstituted, and a monomer unit having a substituted or unsubstituted triphenylamine skeleton such as triphenylamine, N-(4-butylphenyl)-N-diphenylamine, N,N'-diphenyl-N,N'-bis(3-methylphenyl)-[1,1'-biphenyl]-4,4'-diamine, or N,N'-bis(3-methylphenyl)-N,N'-bis(2-naphthyl)-[1,1'-biphenyl]-4,4'-diamine.

In order to use the copolymer or the polymer composition of the present invention as a material of the active layer of the electroluminescent device, a substrate can be layered with a solution thereof or a film thereof using a method known to a person skilled in the art, such as, for example, ink jet, casting, spraying, immersion, printing, or spin coating. Examples of the printing method include relief printing, intaglio printing, offset printing, lithographic printing, reverse relief offset printing, screen printing, and gravure printing. Such a layering method can be usually carried out at a temperature in the range of −20° C. to +300° C., preferably 10° C. to 100° C., and particularly preferably 15° C. to 50° C. The layered polymer solution can usually be dried at room temperature or by heating on a hot plate.

As the solvent used for a copolymer-containing solution, chloroform, methylene chloride, dichloroethane, tetrahydrofuran, toluene, xylene, mesitylene, anisole, acetone, methyl ethyl ketone, ethyl acetate, butyl acetate, ethyl cellosolve acetate, etc. can be used.

The metal coordination compound-containing copolymer is preferably contained at 0.1 to 5 wt % relative to the total weight of the copolymer-containing solution, and more preferably 0.2 to 3 wt %. When it is less than 0.1 wt %, pinholes, etc. tend to occur as thin film defects, and when it exceeds 5 wt %, unevenness in the film thickness tends to occur. A standard structure for the electroluminescent device of the present invention comprising the polymer of the present invention is described in U.S. Pat. No. 4,539,507 and U.S. Pat. No. 5,151,629. A polymer-containing electroluminescent device is described in, for example, International Publication WO90/13148 and EP Pat. Laid-open No. 0443861.

These electroluminescent devices usually include an electroluminescent layer (light-emitting layer) between cathode and anode electrodes, at least one of which is transparent. Furthermore, at least one electron injection layer and/or electron transporting layer is inserted between the electroluminescent layer (light-emitting layer) and the cathode and, moreover, at least one positive hole injection layer and/or positive hole transporting layer is inserted between the electroluminescent layer (light-emitting layer) and the anode. As a material for the cathode, for example, a metal or metal alloy such as Li, Ca, Mg, Al, In, Cs, Mg/Ag, or LiF is preferable. As the anode, a metal (e.g. Au) or another material having metallic conductivity such as, for example, an oxide (e.g. ITO: indium oxide/tin oxide) on a transparent substrate (e.g. a glass or a transparent polymer) can be used.

Examples of an electron injection and/or electron transporting layer include layers containing materials such as an oxadiazole derivative, a benzoxazole derivative, a benzoquinone derivative, a quinoline derivative, a quinoxaline derivative, a thiadiazole derivative, a benzodiazole derivative, a triazole derivative, or a metal chelate complex compound.

Examples of a positive hole injection and/or positive hole transporting layer include layers containing materials such as copper phthalocyanine, a triphenylamine derivative, a triphenylmethane derivative, a stilbene-based compound, a hydrazone-based compound, a carbazole-based compound, a high molecular weight arylamine, a polyaniline, or a polythiophene.

The metal coordination compound-containing copolymer of the present invention is suitable as, for example, a material for an organic EL device. In particular, it exhibits good luminescence color purity, and stability and, furthermore, good film-forming properties due to ease of film formation, etc. The organic EL device of the present invention employing same therefore exhibits good luminescence color purity, and stability, and it is excellent in terms of productivity.

EXAMPLES

The present invention is explained below with reference to examples, but is not limited thereto. It is also possible, other than the examples shown below, to obtain electroluminescent devices having excellent color purity, reliability and luminescence characteristics in cases where the above-mentioned various monomer units are used.

Example 1

Synthesis of Metal Coordination Compound (1) in Table 1

A Grignard reagent was prepared by gradually adding a THF solution of 3-bromo-9-methylcarbazole (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give a boronic acid carbazole derivative as colorless crystals (40%). The boronic acid carbazole derivative (12 mmol) thus obtained and 1,2-ethanediol (30 mmol) were refluxed in toluene for 10 hours, and then recrystallized from toluene/acetone (1/4) to give a boronic acid ester carbazole derivative as colorless crystals.

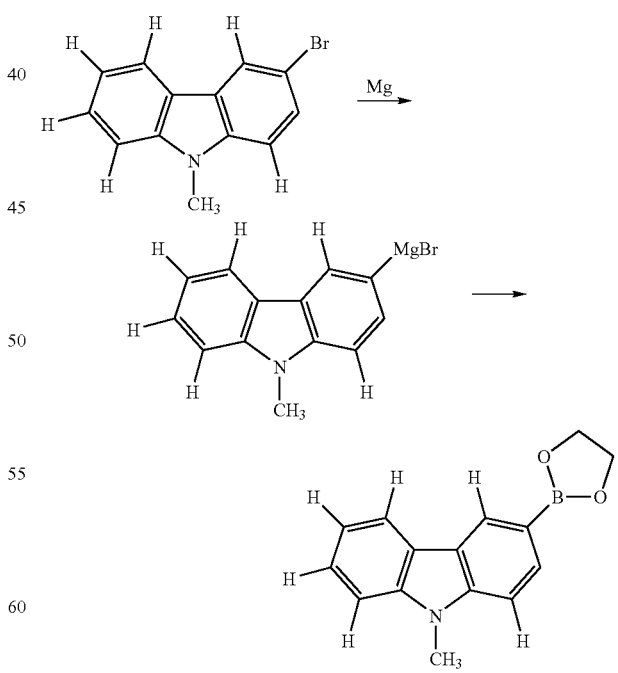

A 2M aqueous solution of $K_2CO_3$ was added to a toluene solution of 2-bromopyridine (10 mmol), the boronic acid ester carbazole derivative (10 mmol), and $Pd(0)(PPh_3)_4$ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 3-(2'-pyridyl)-9-methylcarbazole as a solid.

stirring. The reaction mixture was cooled to room temperature, and a precipitate was collected by filtration, washed with water, and then washed with ethanol and acetone in sequence. The precipitate was dried under vacuum at room temperature to give di-μ-chloro-tetrakis[3-(2'-pyridyl)-9-methylcarbazole-$N^{1'},C^2$]diiridium (III) as a pale yellow powder.

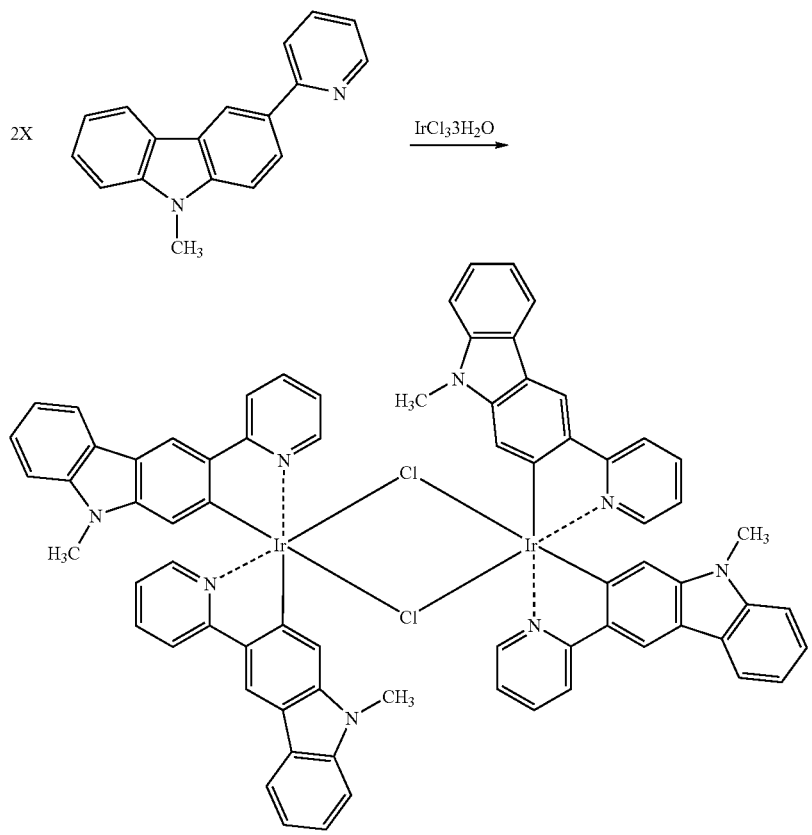

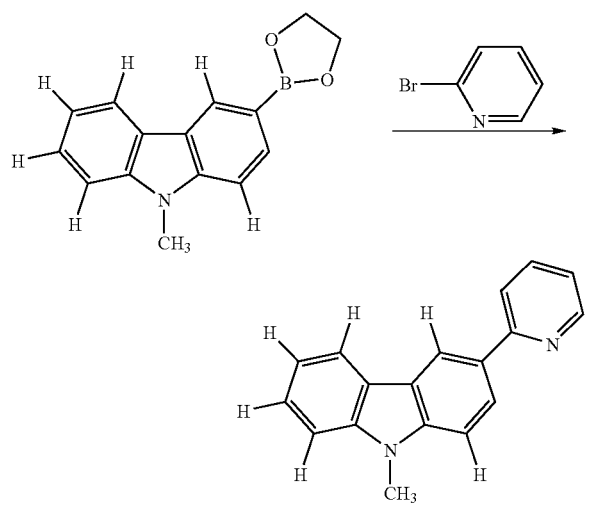

A 200 ml three-necked flask was charged with iridium (III) chloride (1.7 mmol), 3-(2'-pyridyl)-9-methylcarbazole (7.58 mmol), 50 ml of ethoxyethanol, and 20 ml of water, and the mixture was stirred under a flow of nitrogen at room temperature for 30 minutes and then refluxed for 24 hours while A 200 ml three-necked flask was charged with 70 ml of ethoxyethanol, di-p-chloro-tetrakis[3-(2'-pyridyl)-9-methylcarbazole-$N^{1'},C^2$]diiridium (III) (0.7 mmol), the acetylacetone derivative represented by the structural formula below (2.10 mmol), and sodium carbonate (9.43 mmol), and the mixture was stirred under a flow of nitrogen at room temperature and then refluxed for 15 hours while stirring.

The reaction mixture was cooled with ice, and a precipitate was collected by filtration and washed with water. This precipitate was purified by silica gel column chromatography (eluent: chloroform/methanol: 30/1) to give bis[3-(2'-pyridyl)-9-methylcarbazole-$N^{1'},C^2$](dibromobenzylacetylacetonato) iridium (III) as a pale yellow powder.

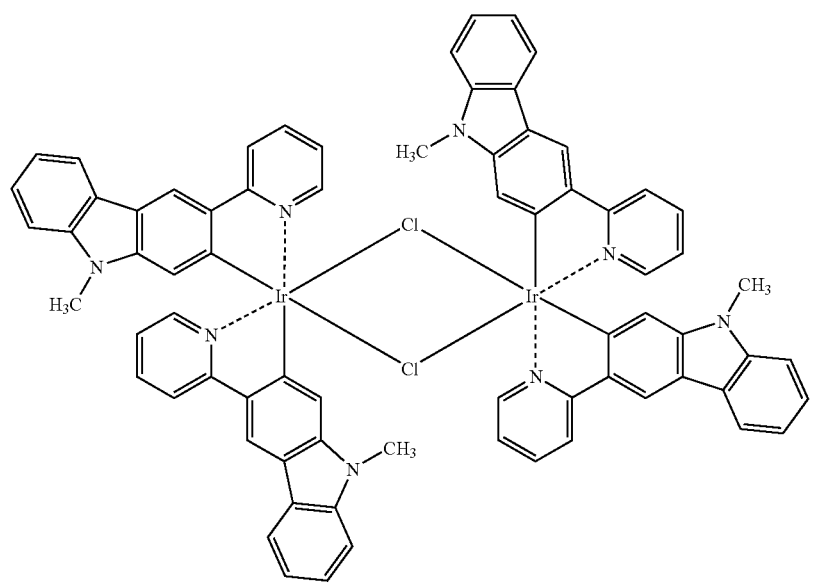
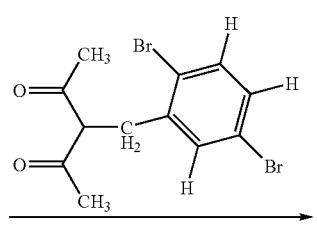
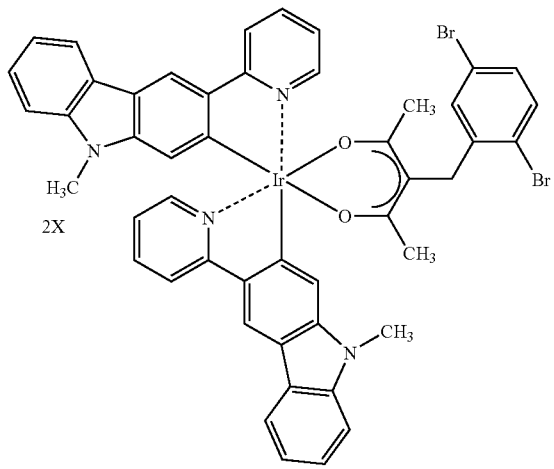

Example 2

Synthesis of Metal Coordination Compound (125) in Table 2

A Grignard reagent was prepared by gradually adding a THF solution of 2-hydroxy-6-bromo-9-methylcarbazole (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give a boronic acid carbazole derivative as colorless crystals (40%). The boronic acid carbazole derivative (12 mmol) thus obtained and 1,2-ethanediol (30 mmol) were refluxed in toluene for 10 hours, and then recrystallized from toluene/acetone (1/4) to give a boronic acid ester carbazole derivative as colorless crystals.

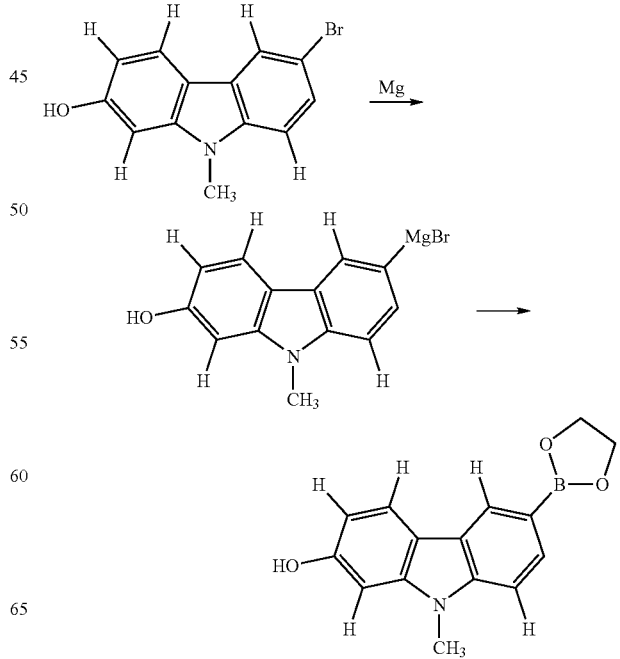

319

A 2M aqueous solution of K₂CO₃ was added to a toluene solution of 2-bromopyridine (10 mmol), the boronic acid ester carbazole derivative (10 mmol), and Pd(0)(PPh₃)₄ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 2-hydroxy-6-(2'-pyridyl)-9-methylcarbazole as a solid.

320

-continued

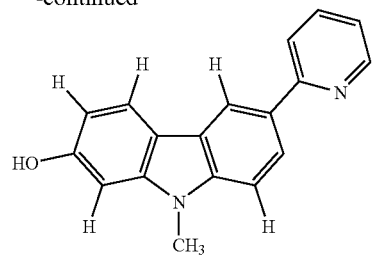

A 200 ml three-necked flask was charged with iridium (III) chloride (1.7 mmol), 2-hydroxy-6-(2'-pyridyl)-9-methylcarbazole (7.58 mmol), 50 ml of ethoxyethanol, and 20 ml of water, and the mixture was stirred under a flow of nitrogen at room temperature for 30 minutes and then refluxed for 24 hours while stirring. The reaction mixture was cooled to room temperature, and a precipitate was collected by filtration, washed with water, and then washed with ethanol and acetone in sequence. The precipitate was dried under vacuum at room temperature to give di-μ-chloro-tetrakis[2-hydroxy-6-(2'-pyridyl)-9-methylcarbazole-N¹'; C⁷]diiridium (III) as a pale yellow powder.

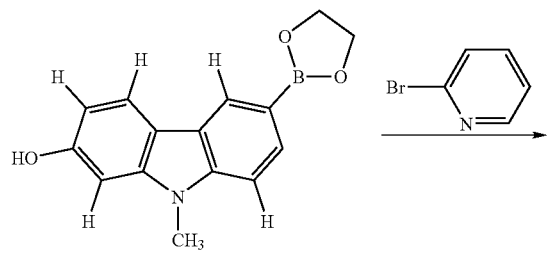

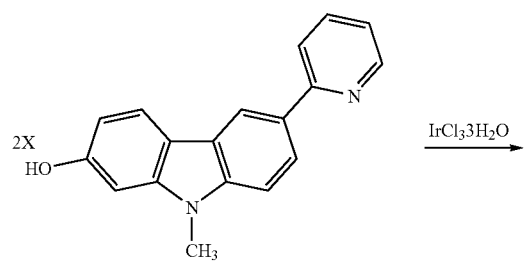

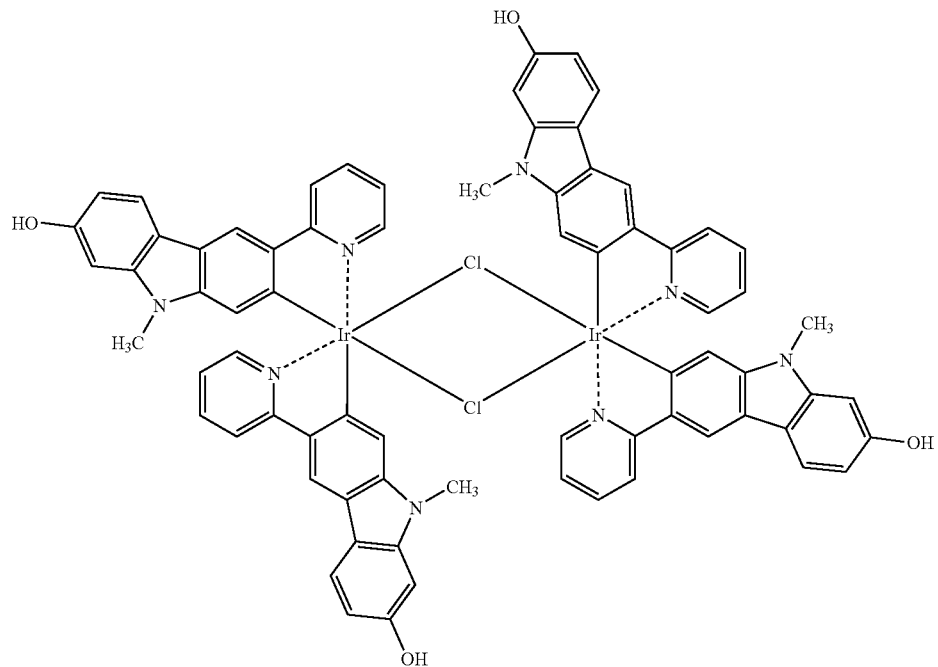

A 200 ml three-necked flask was charged with 70 ml of ethoxyethanol, di-μ-chloro-tetrakis[2-hydroxy-6-(2'-pyridyl)-9-methylcarbazole-N[1'],C[7]]diiridium (III) (0.7 mmol), the acetylacetone derivative represented by the structural formula below (2.10 mmol), and sodium carbonate (9.43 mmol), and the mixture was stirred under a flow of nitrogen at room temperature and then refluxed for 15 hours while stirring.

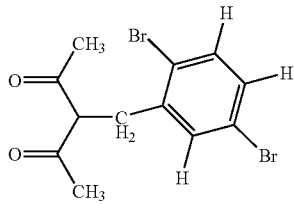

The reaction mixture was cooled with ice, and a precipitate was collected by filtration and washed with water. This precipitate was purified by silica gel column chromatography (eluent: chloroform/methanol: 30/1) to give bis[2-hydroxy-6-(2'-pyridyl)-9-methylcarbazole-N[1'],C[7]](dibromobenzylacetylacetonato)iridium (III) as a pale yellow powder.

Example 3

Synthesis of Metal Coordination Compound (253) in Table 3

A Grignard reagent was prepared by gradually adding a THF solution of 2-bromo-9-fluorenone (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give a boronic acid fluorenone derivative as colorless crystals (40%). The boronic acid fluorenone derivative (12 mmol) thus obtained and 1,2-ethanediol (30 mmol) were refluxed in

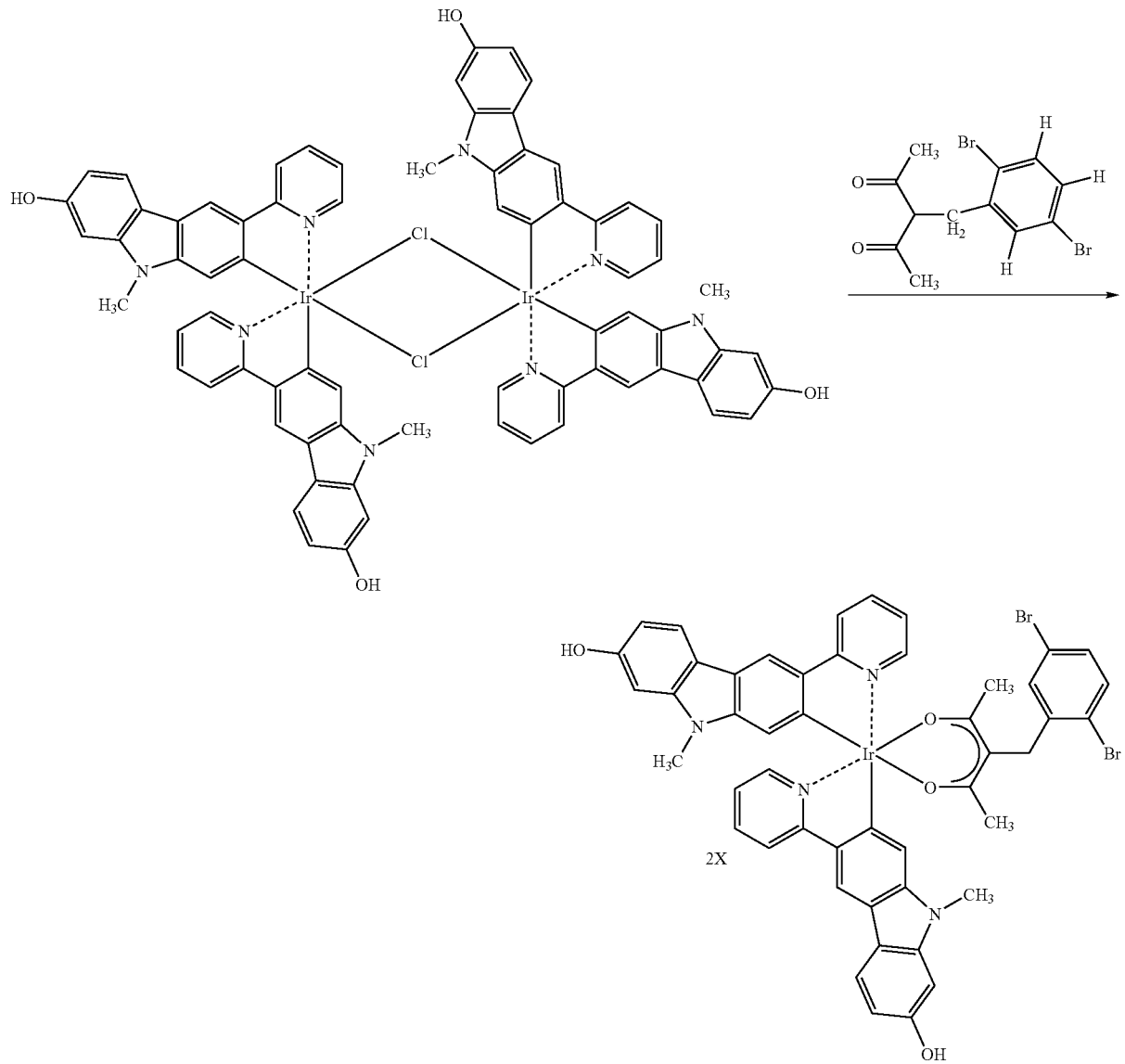

toluene for 10 hours, and then recrystallized from toluene/acetone (1/4) to give a boronic acid ester fluorenone derivative as colorless crystals.

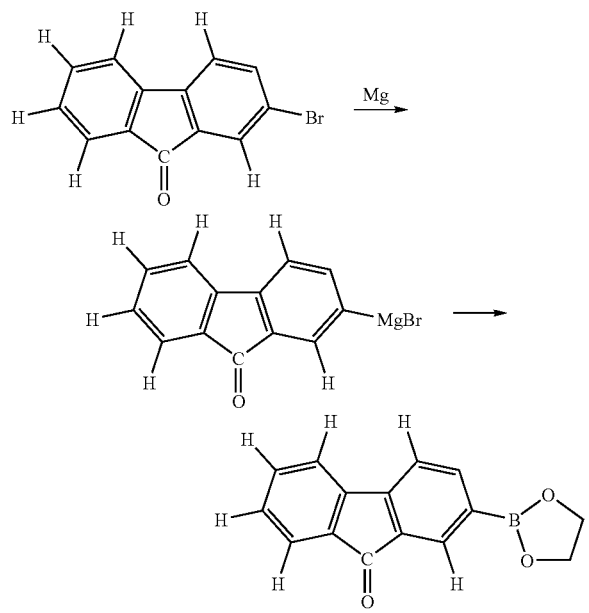

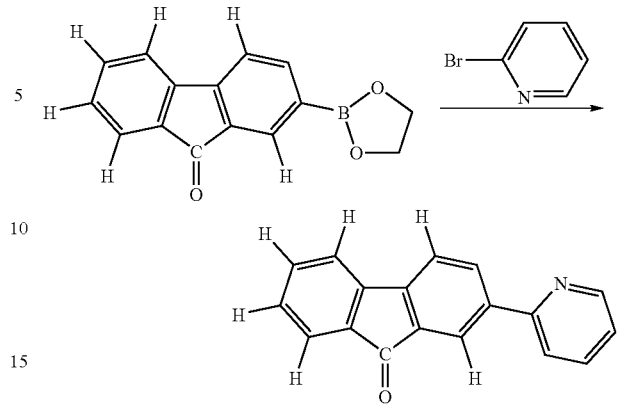

A 200 ml three-necked flask was charged with iridium (III) chloride (1.7 mmol), 2-(2'-pyridyl)-9-fluorenone (7.58 mmol), 50 ml of ethoxyethanol, and 20 ml of water, and the mixture was stirred under a flow of nitrogen at room temperature for 30 minutes and then refluxed for 24 hours while stirring. The reaction mixture was cooled to room temperature, and a precipitate was collected by filtration, washed with water, and then washed with ethanol and acetone in sequence. The precipitate was dried under vacuum at room temperature to give di-μ-chloro-tetrakis[2-(2'-pyridyl)-9-fluorenone-$N^{1'}$, $C^3$]diiridium (III) as a pale yellow powder.

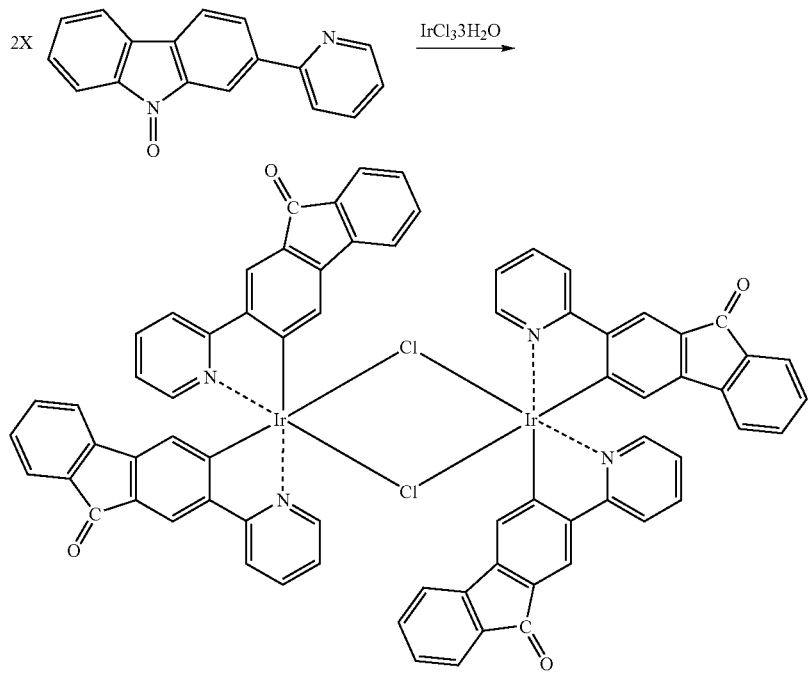

A 2M aqueous solution of $K_2CO_3$ was added to a toluene solution of 2-bromopyridine (10 mmol), the boronic acid ester fluorenone derivative (10 mmol), and $Pd(0)(PPh_3)_4$ (0.2 mmol) under a flow of argon, and the mixture was refluxed for 48 hours while stirring vigorously. The reaction mixture was cooled to room temperature and then poured into a large amount of methanol so as to precipitate a solid. The solid thus precipitated was filtered by suction and washed with methanol to give 2-(2'-pyridyl)-9-fluorenone as a solid.

A 200 ml three-necked flask was charged with 70 ml of ethoxyethanol, di-μ-chloro-tetrakis[2-(2'-pyridyl)-9-fluorenone-$N^{1'}$,$C^3$]diiridium (III) (0.7 mmol), the acetylacetone derivative represented by the structural formula below (2.10 mmol), and sodium carbonate (9.43 mmol), and the mixture was stirred under a flow of nitrogen at room temperature and then refluxed for 15 hours while stirring.

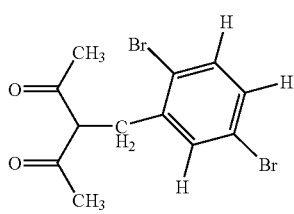

The reaction mixture was cooled with ice, and a precipitate was collected by filtration and washed with water. This precipitate was purified by silica gel column chromatography (eluent: chloroform/methanol: 30/1) to give bis[2-(2'-pyridyl)-9-fluorenone-$N^{1'},C^3$](dibromobenzylacetylacetonato) iridium (III) as a pale yellow powder.

Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give a diboronic acid quinoline derivative as colorless crystals (40%). The diboronic acid quinoline derivative (12 mmol) thus obtained and 1,2-ethanediol (30 mmol) were refluxed in toluene for 10 hours, and then recrystallized from toluene/acetone (1/4) to give a diboronic acid ester quinoline derivative as colorless crystals (83%).

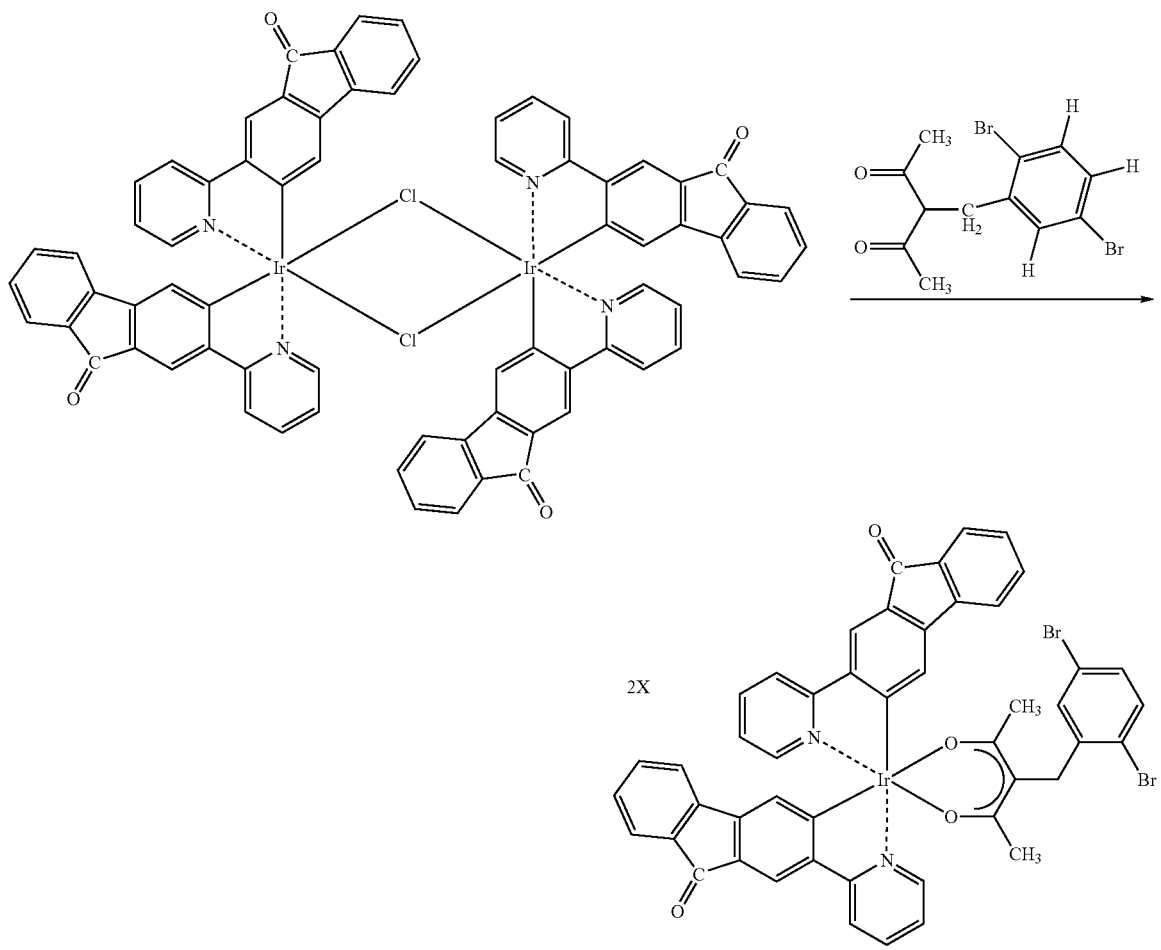

Example I-4

Synthesis of Diboronic Acid Ester Quinoline Derivative (I-Q-1)

A Grignard reagent was prepared by gradually adding a THF solution of 6,6'-bis[2-(4-bromophenyl)-3,4-diphenylquinoline] (30 mmol) to a mixture of magnesium (1.9 g, 80 mmol) and THF under a flow of argon while stirring well. The Example I-5

Synthesis of Metal Coordination Compound-Containing Copolymer (I-P-1)

A 2M aqueous solution of $K_2CO_3$ was added to a toluene solution of the metal coordination compound (1) synthesized in Example 1 (1 mmol), the dibromodiphenyloxadiazole (9 mmol) and the dicyclohexyloxydibromobenzene (5 mmol) represented by the structural formulae below, the diboronic acid ester quinoline derivative (I-Q-1) synthesized in Example I-4 (5 mmol), and Pd(0)(PPh$_3$)$_4$ (0.2 mmol) under a flow of argon, and the mixture was refluxed for 48 hours while stirring vigorously.

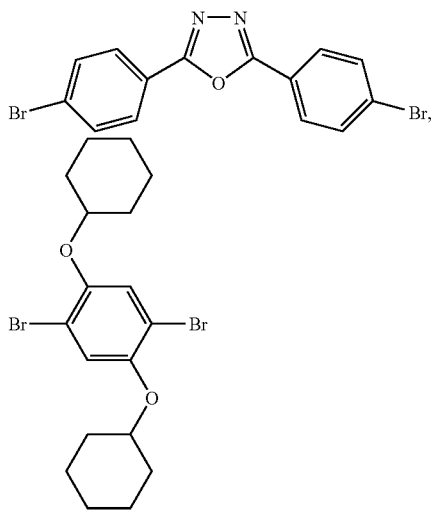

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (I-P-1).

The compound thus obtained was identified by NMR spectroscopy, IR spectroscopy, etc. The same applies to the compounds shown below.

Example I-6

Synthesis of Metal Coordination
Compound-Containing Copolymer (I-P-2)

A 2M aqueous solution of K$_2$CO$_3$ was added to a toluene solution of the metal coordination compound (125) synthesized in Example 2 (1 mmol), the dibromodiphenyloxadiazole (9 mmol) and the dicyclohexyloxydibromobenzene (5 mmol) represented by the structural formulae below, the diboronic acid ester quinoline (I-Q-1) derivative synthesized in Example I-4 (5 mmol), and Pd(0)(PPh$_3$)$_4$ (0.2 mmol) under a flow of argon, and the mixture was refluxed for 48 hours while stirring vigorously.

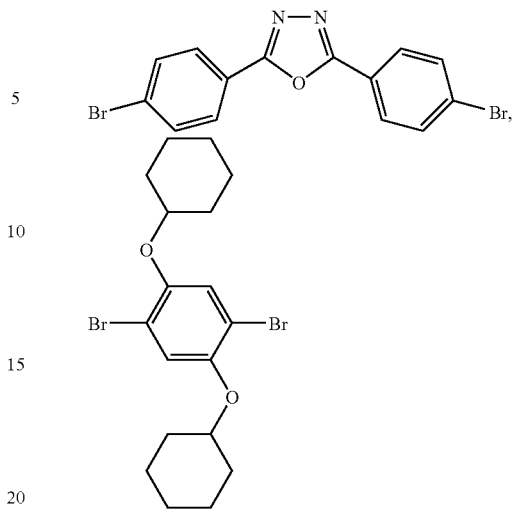

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (I-P-2).

Example I-7

Synthesis of Metal Coordination
Compound-Containing Copolymer (I-P-3)

A 2M aqueous solution of K$_2$CO$_3$ was added to a toluene solution of the metal coordination compound (253) synthesized in Example 3 (1 mmol), the dibromodiphenyloxadiazole (9 mmol) and the dicyclohexyloxydibromobenzene (5 mmol) represented by the structural formulae below, the diboronic acid ester quinoline (I-Q-1) derivative synthesized in Example I-4 (5 mmol), and Pd(0)(PPh$_3$)$_4$ (0.2 mmol) under a flow of argon, and the mixture was refluxed for 48 hours while stirring vigorously.

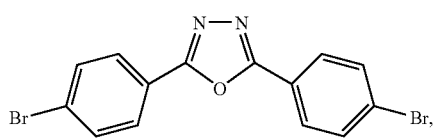

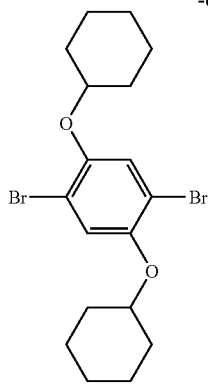

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (I-P-3).

Example I-8

Fabrication of Organic EL Device (I-1)

A toluene solution (1.0 wt %) of the metal coordination compound-containing copolymer (I-P-1) obtained in Example I-5 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order Ca (film thickness 20 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=450 nm) was observed. No change in the color of this blue light emission was observed after 500 hours at 25° C.

Example I-9

Fabrication of Organic EL Device (I-2)

A toluene solution (1.0 wt %) of the metal coordination compound-containing copolymer (I-P-2) obtained in Example I-6 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order LiF (film thickness 0.5 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 5 V emission of orange light ($\lambda$=590 nm) was observed. No change in the color of this orange light emission was observed after 500 hours at 25° C.

Example I-10

Fabrication of Organic EL Device (I-3)

An ITO/light-emitting polymer layer/Ca/Al device was fabricated in the same manner as in Example I-8 except that the metal coordination compound-containing copolymer (I-P-3) was used instead of the metal coordination compound-containing copolymer (I-P-1). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=450 nm) was observed. No change in the color of this blue light emission was observed after 500 hours at 25° C.

Comparative Example 1

An ITO/light-emitting polymer layer/Ca/Al device was fabricated in the same manner as in Example I-8 except that a polyquinoline represented by the structural formula below was used instead of the metal coordination compound-containing copolymer (I-P-1). The ITO/light-emitting polymer layer/Ca/Al device thus obtained was connected to a power supply, a voltage was applied so that the ITO was the positive electrode and the Ca/Al was the negative electrode, and at about 10 V emission of blue light ($\lambda$=430 nm) was observed, but the color of the light emission changed from blue to pale blue over time.

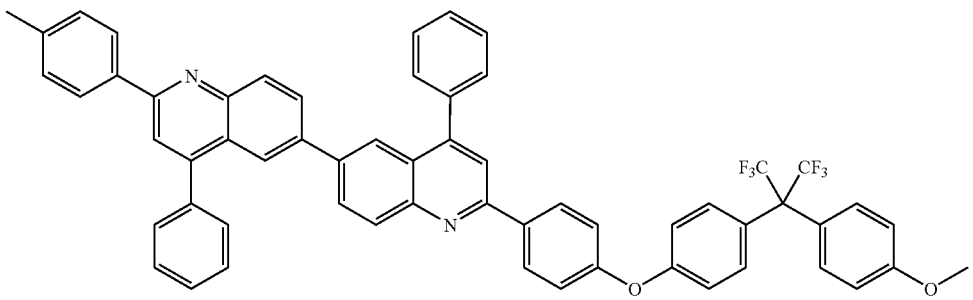

Comparative Example 2

An ITO/light-emitting polymer layer/LiF/Al device was fabricated in the same manner as in Example I-8 except that a (dioctylfluorene/benzothiazole) copolymer represented by the structural formula below was used instead of the metal coordination compound-containing copolymer (I-P-1). The ITO/light-emitting polymer layer/LiF/Al device thus obtained was connected to a power supply, a voltage was applied so that the ITO was the positive electrode and the LiF/Al was the negative electrode, and at about 8 V emission of yellow light (λ=548 nm) was observed, but the color of the light emission changed from yellow to yellowish white over time.

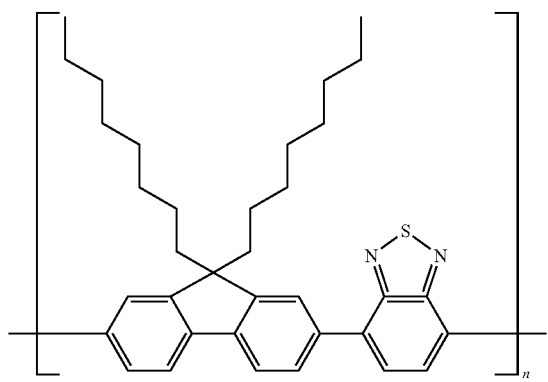

Comparative Example 3

A 40 nm film thickness of α-NPD as a hole-transporting layer was formed on a glass substrate with a 2 mm wide ITO (indium tin oxide) patterning by a vacuum vapor deposition method involving resistive heating in a vacuum chamber at $10^{-5}$ Pa. On top of this a ratio by weight of 5% of the metal coordination compound Ir(ppy)$_3$ represented by the structural formula below was vapor co-deposited with CBP.

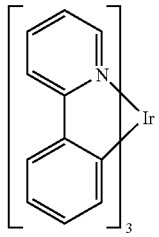

Furthermore, the above-mentioned Alq$_3$ was vapor deposited thereon as an electron-transporting layer at 30 nm. On top of this, 0.5 to 2 nm of LiF and 100 to 150 nm of Al were vapor deposited as a negative electrode layer. With regard to the characteristics of the organic EL device at room temperature, current/voltage characteristics were measured using a 4140B picoammeter manufactured by Hewlett-Packard and the luminance was measured using an SR-3 manufactured by Topcon Corporation. The device thus obtained was connected to a power supply, a voltage was applied so that the ITO was the positive electrode and the LiF/Al was the negative electrode, and at about 6 V emission of green light (λ=516 nm) was observed. The luminance half-life measured when driven at a constant current (50 mA/cm$^2$) was 100 hours.

Example II-4

Synthesis of Diboronic Acid Ester Quinoline Derivative (II-Q-1)

A Grignard reagent was prepared by gradually adding a THF solution of 6,6'-bis[2-(4-bromophenyl)-3,4-diphenylquinoline] (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give a diboronic acid quinoline derivative as colorless crystals (40%). The diboronic acid quinoline derivative (12 mmol) thus obtained and 1,2-ethanediol (30 mmol) were refluxed in toluene for 10 hours, and then recrystallized from toluene/acetone (1/4) to give a diboronic acid ester quinoline derivative as colorless crystals (83%).

Example II-5

Synthesis of Metal Coordination Compound-Containing Copolymer (II-P-1)

A 2M aqueous solution of $K_2CO_3$ was added to a toluene solution of the metal coordination compound (1) synthesized in Example 1 (1 mmol), the dibromodiphenyloxadiazole (8 mmol) and the dicyclohexyloxydibromobenzene (5 mmol) represented by the structural formulae below, the diboronic acid ester quinoline derivative (II-Q-1) synthesized in Example II-4 (5 mmol), a tribromo branched monomer (1 mmol), and $Pd(0)(PPh_3)_4$ (0.2 mmol) under a flow of argon, and the mixture was refluxed for 48 hours while stirring vigorously.

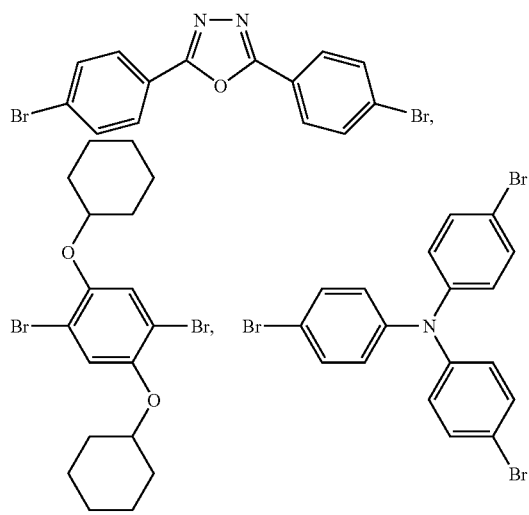

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (II-P-1).

Example II-6

Synthesis of Metal Coordination Compound-Containing Copolymer (II-P-2)

A 2M aqueous solution of $K_2CO_3$ was added to a toluene solution of the metal coordination compound (125) synthesized in Example 2 (1 mmol), the dibromodiphenyloxadiazole (8.5 mmol) and the dicyclohexyloxydibromobenzene (5 mmol) represented by the structural formulae below, the diboronic acid ester quinoline derivative (II-Q-1) synthesized in Example II-4 (5 mmol), a tribromo branched monomer (0.5 mmol), and $Pd(0)(PPh_3)_4$ (0.2 mmol) under a flow of argon, and the mixture was refluxed for 48 hours while stirring vigorously.

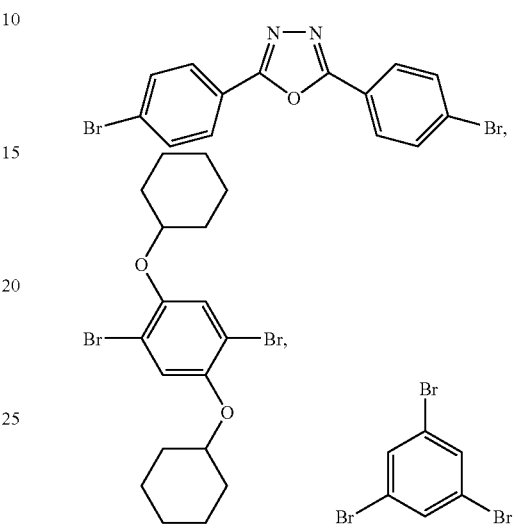

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (II-P-2).

Example II-7

Synthesis of Metal Coordination Compound-Containing Copolymer (II-P-3)

A 2M aqueous solution of $K_2CO_3$ was added to a toluene solution of the metal coordination compound (253) synthesized in Example 3 (1 mmol), the dibromodiphenyloxadiazole (8 mmol) and the dicyclohexyloxydibromobenzene (5 mmol) represented by the structural formulae below, the diboronic acid ester quinoline derivative (II-Q-1) synthesized in Example II-4 (5 mmol), a tribromo branched monomer (1 mmol), and $Pd(0)(PPh_3)_4$ (0.2 mmol) under a flow of argon, and the mixture was refluxed for 48 hours while stirring vigorously.

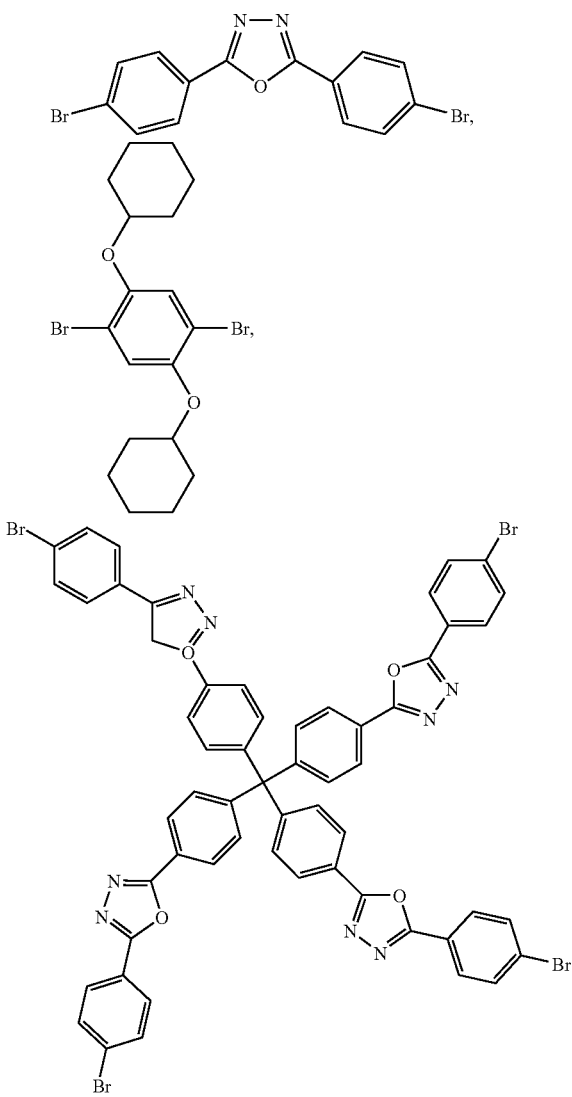

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (II-P-3).

Example II-8

Fabrication of Organic EL Device (II-1)

A toluene solution (1.0 wt %) of the metal coordination compound-containing copolymer (II-P-1) obtained in Example II-5 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order Ca (film thickness 20 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4.5 V emission of blue light ($\lambda$=440 nm) was observed. No change in the color of this blue light emission was observed after 500 hours at 25° C.

Example II-9

Fabrication of Organic EL Device (II-2)

A toluene solution (1.0 wt %) of the metal coordination compound-containing copolymer (II-P-2) obtained in Example II-6 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order LiF (film thickness 0.5 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 5.5 V emission of orange light ($\lambda$=570 nm) was observed. No change in the color of this orange light emission was observed after 500 hours at 25° C.

Example II-10

Fabrication of Organic EL Device (II-3)

An ITO/light-emitting polymer layer/Ca/Al device was fabricated in the same manner as in Example II-8 except that the metal coordination compound-containing copolymer (II-P-3) was used instead of the metal coordination compound-containing copolymer (II-P-1). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4.5 V emission of blue light (λ=447 nm) was observed. No change in the color of this blue light emission was observed after 500 hours at 25° C.

Example III-4

Synthesis of Dicyclohexyloxybenzene Diboronic Acid Ester (III-PP-1)

A Grignard reagent was prepared by gradually adding a THF solution of 2,5-dibromo-1,4-dihexyloxybenzene (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluene/acetone (1/2) to give dicyclohexyloxybenzene diboronic acid as colorless crystals (50%). The dicyclohexyloxybenzene diboronic acid (12 mmol) thus obtained and 1,2-ethanediol (30 mmol) were refluxed in toluene for 10 hours, and then recrystallized from toluene/acetone (1/4) to give a dicyclohexyloxybenzene diboronic acid ester as colorless crystals (80%).

Example III-5

Synthesis of Metal Coordination Compound-Containing Copolymer (III-P-1)

A 2M aqueous solution of K$_2$CO$_3$ was added to a toluene solution of the metal coordination compound (1) synthesized in Example 1 (1 mmol), 2,5-bis(4-bromophenyl)[1,3,4]oxadiazole (9 mmol), the dicyclohexyloxybenzene diboronic acid ester synthesized in Example III-4 (10 mmol), represented by the structural formula below, and Pd(0)(PPh$_3$)$_4$ (0.2 mmol) under a flow of argon, and the mixture was refluxed for 48 hours while stirring vigorously.

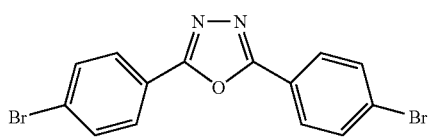

2,5-Bis-(4-bromo-phenyl)-[1,3,4]oxadiazole

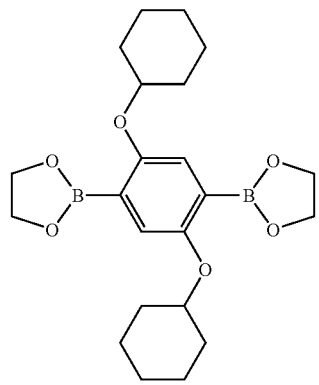

2-(4-[1,3,2]Dioxaborolan-2-yl-2,5-dicyclohexyloxy-phenyl)-[1,3,2]dioxaborolane

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (III-P-1).

Example III-6

Synthesis of Metal Coordination Compound-Containing Copolymer (III-P-2)

A 2M aqueous solution of K$_2$CO$_3$ was added to a toluene solution of the metal coordination compound (125) synthesized in Example 2 (1 mmol), 2,5-bis(4-bromophenyl)[1,3,4]oxadiazole (4 mmol), 2-(2,5-dibromophenyl)-5-phenyl[1,3,4]oxadiazole (4 mmol), the dicyclohexyloxybenzene diboronic acid ester synthesized in Example III-4 (10 mmol), represented by the structural formulae below, and Pd(0)(PPh$_3$)$_4$ (0.2 mmol) under a flow of argon, and the mixture was refluxed for 48 hours while stirring vigorously.

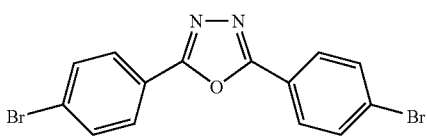

2,5-Bis-(4-bromo-phenyl)-[1,3,4]oxadiazole

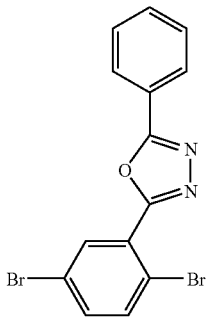

2-(2,5-Dibromo-phenyl)-5-phenyl-[1,3,4]oxadiazole,

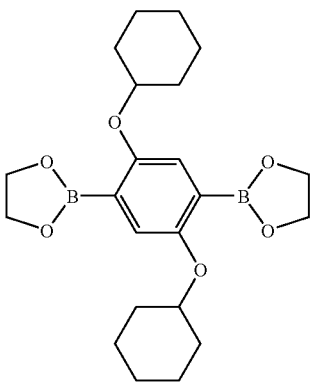

2-(4-[1,3,2]Dioxaborolan-2-yl-2,5-dicyclohexyloxy-phenyl)-[1,3,2]dioxaborolane

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (III-P-2).

Example III-7

Synthesis of Metal Coordination Compound-Containing Copolymer (III-P-3)

A 2M aqueous solution of $K_2CO_3$ was added to a toluene solution of the metal coordination compound (253) synthesized in Example 3 (1 mmol), 2,5-bis(4-bromophenyl)[1,3,4]oxadiazole (9 mmol), 9,9-dioctylfluorene-2,7-diboronic acid ester (5 mmol), the dicyclohexyloxybenzene diboronic acid ester synthesized in Example III-4 (5 mmol), represented by the structural formulae below, and $Pd(0)(PPh_3)_4$ (0.2 mmol) under a flow of argon, and the mixture was refluxed for 48 hours while stirring vigorously.

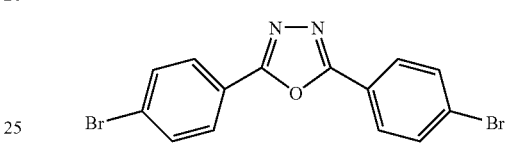

2,5-Bis-(4-bromo-phenyl)-[1,3,4]oxadiazole

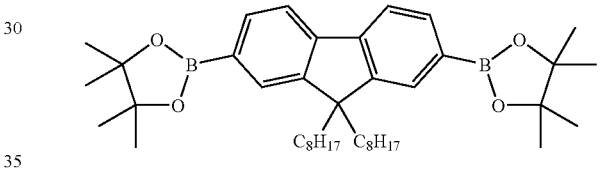

9,9-Dioctylfluorene-2,7-bis(pinacol boronate),

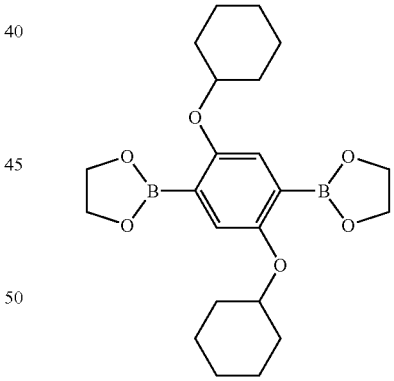

2-(4-[1,3,2]Dioxaborolan-2-yl-2,5-dicyclohexyloxy-phenyl)-[1,3,2]dioxaborolane

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (III-P-3).

Example III-8

Fabrication of Organic EL Device (III-1)

A toluene solution (1.0 wt %) of the metal coordination compound-containing copolymer (III-P-1) obtained in Example III-5 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order Ca (film thickness 20 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=455 nm) was observed. No change in the color of this blue light emission was observed after 500 hours at 25° C.

Example III-9

Fabrication of Organic EL Device (III-2)

A toluene solution (1.0 wt %) of the metal coordination compound-containing copolymer (III-P-2) obtained in Example III-6 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order LiF (film thickness 0.5 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 5 V emission of orange light ($\lambda$=588 nm) was observed. No change in the color of this orange light emission was observed after 500 hours at 25° C.

Example III-10

Fabrication of Organic EL Device (III-3)

An ITO/light-emitting polymer layer/Ca/Al device was fabricated in the same manner as in Example III-8 except that the metal coordination compound-containing copolymer (III-P-3) was used instead of the metal coordination compound-containing copolymer (III-P-1). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=460 nm) was observed. No change in the color of this blue light emission was observed after 500 hours at 25° C.

Comparative Example 4

An ITO/light-emitting polymer layer/Ca/Al device was fabricated in the same manner as in Example III-8 except that polydioctylfluorene was used instead of the metal coordination compound-containing copolymer (III-P-1). The ITO/light-emitting polymer layer/Ca/Al device thus obtained was connected to a power supply, a voltage was applied so that the ITO was the positive electrode and the Ca/Al was the negative electrode, and at about 6 V emission of blue light ($\lambda$=430 nm) was observed, but the color of the light emission changed from blue to yellowish green over time.

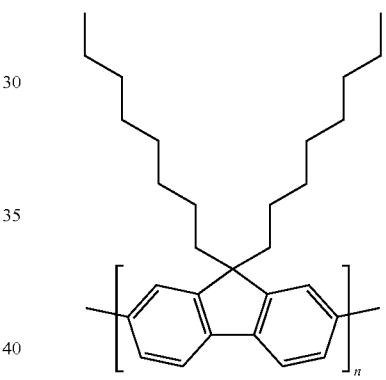

Example IV-4

Synthesis of Dicyclohexyloxybenzene Diboronic Acid Ester (IV-PP-1)

A Grignard reagent was prepared by gradually adding a THF solution of 2,5-dibromo-1,4-dihexyloxybenzene (30 mmol) to a mixture of magnesium (1.9 g, 80 mmol) and THF under a flow of argon while stirring well. The Grignard reagent thus obtained was gradually added dropwise over 2 hours to a THF solution of trimethyl borate (300 mmol) at −78° C. while stirring well, and the mixture was then stirred at room temperature for 2 days. The reaction mixture was poured into 5% dilute sulfuric acid containing crushed ice and stirred. The aqueous solution thus obtained was extracted with toluene, and the extract was concentrated to give a colorless solid. The solid thus obtained was recrystallized from toluenelacetone (1/2) to give dicyclohexyloxybenzene diboronic acid as colorless crystals (50%). The dicyclohexyloxybenzene diboronic acid (12 mmol) thus obtained and 1,2-ethanediol (30 mmol) were refluxed in toluene for 10 hours, and then recrystallized from toluene/acetone (1/4) to give a dicyclohexyloxybenzene diboronic acid ester as colorless crystals (80%).

Example IV-5

Synthesis of Metal Coordination Compound-Containing Copolymer (IV-P-1)

A 2M aqueous solution of $K_2CO_3$ was added to a toluene solution of the metal coordination compound (1) synthesized in Example 1 (1 mmol), 2,5-bis(4-bromophenyl)[1,3,4]oxadiazole (8 mmol), the dicyclohexyloxybenzene diboronic acid ester synthesized in Example IV-4 (10 mmol), a tribromo branched monomer (1 mmol), represented by the structural formulae below, and $Pd(0)(PPh_3)_4$ (0.2 mmol) under a flow of argon, and the mixture was refluxed for 48 hours while stirring vigorously.

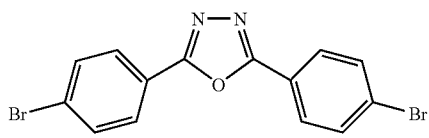

2,5-Bis-(4-bromo-phenyl)-[1,3,4]oxadiazole

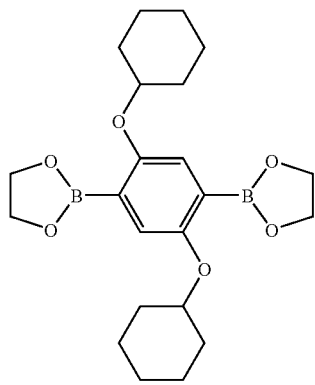

2-(4-[1,3,2]Dioxaborolan-2-yl-2,5-dicyclohexyloxy-phenyl)-[1,3,2]dioxaborolane

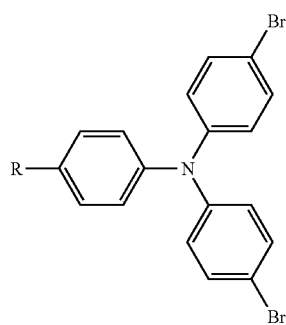

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (IV-P-1).

Example IV-6

Synthesis of Metal Coordination Compound-Containing Copolymer (IV-P-2)

A 2M aqueous solution of $K_2CO_3$ was added to a toluene solution of the metal coordination compound (125) synthesized in Example 2 (1 mmol), 2,5-bis(4-bromophenyl)[1,3,4] oxadiazole (3.5 mmol), 2-(2,5-dibromophenyl)-5-phenyl[1,3,4]oxadiazole (4 mmol), the dicyclohexyloxybenzene diboronic acid ester synthesized in Example IV-4 (10 mmol), a tribromo branched monomer (0.5 mmol), represented by the structural formulae below, and $Pd(0)(PPh_3)_4$ (0.2 mmol) under a flow of argon, and the mixture was refluxed for 48 hours while stirring vigorously.

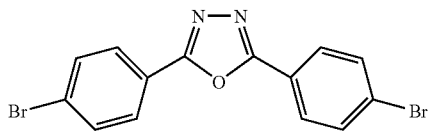

2,5-Bis-(4-bromo-phenyl)-[1,3,4]oxadiazole

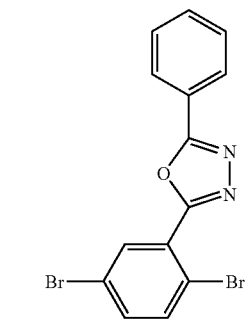

2-(2,5-Dibromo-phenyl)-5-phenyl-[1,3,4]oxadiazole

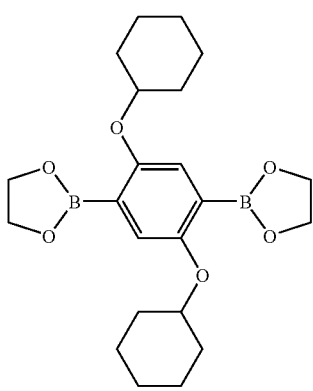

2-(4-[1,3,2]Dioxaborolan-2-yl-2,5-dicyclohexyloxy-phenyl)-[1,3,2]dioxaborolane

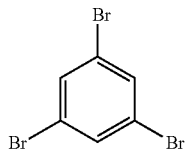

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (IV-P-2).

Example IV-7

Synthesis of Metal Coordination Compound-Containing copolymer (IV-P-3)

A 2M aqueous solution of $K_2CO_3$ was added to a toluene solution of the metal coordination compound (253) synthesized in Example 3 (1 mmol), 2,5-bis(4-bromophenyl)[1,3,4]oxadiazole (8 mmol), 9,9-dioctylfluorene-2,7-diboronic acid ester (5 mmol), the dicyclohexyloxybenzene diboronic acid ester synthesized in Example IV-4 (5 mmol), a tribromo branched monomer (1 mmol), represented by the structural formulae below, and Pd(0)(PPh$_3$)$_4$ (0.2 mmol) under a flow of argon, and the mixture was refluxed for 48 hours while stirring vigorously.

2,5-Bis-(4-bromo-phenyl)-[1,3,4]oxadiazole

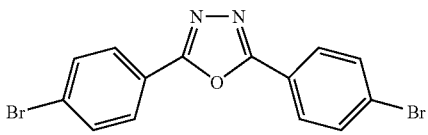

9,9-Dioctylfluorene-2,7-bis(pinacol boronate)

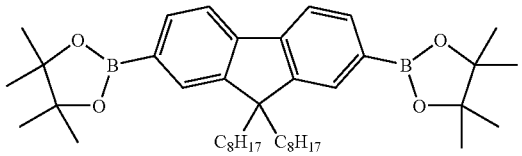

2-(4-[1,3,2]Dioxaborolan-2-yl-2,5-dicyclohexyloxy-phenyl)-[1,3,2]dioxaborolane

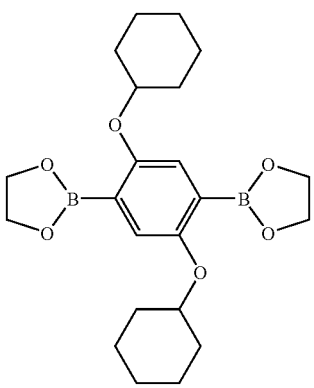

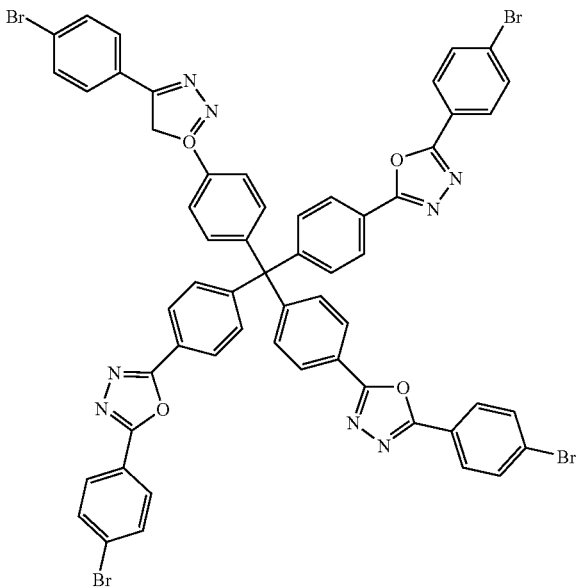

The reaction mixture was cooled to room temperature and then poured into a large amount of methanol so as to precipitate a solid. The solid thus precipitated was filtered by suction and washed with methanol to give a solid. The solid thus obtained by filtration was dissolved in toluene, and then poured into a large amount of acetone so as to precipitate a solid. The solid thus precipitated was filtered by suction, and washed with acetone to give a solid. The above-mentioned re-precipitation with acetone was repeated a further two times. Subsequently, after the solid thus obtained was dissolved in toluene, a cation/anion exchange resin (ion exchange resin manufactured by Organo Corporation) was added thereto, and the mixture was stirred for 1 hour and then filtered by suction to recover a polymer solution. The above-mentioned treatment with the ion exchange resin was repeated a further two times. The polymer solution thus recovered was poured into a large amount of methanol so as to precipitate a solid. The solid thus obtained was further extracted and washed with acetone in a Soxhlet extractor for 24 hours to give a metal coordination compound-containing copolymer (IV-P-3).

Example IV-8

Fabrication of Organic EL Device (IV-1)

A toluene solution (1.0 wt %) of the metal coordination compound-containing copolymer (IV-P-1) obtained in Example IV-5 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order Ca (film thickness 20 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=445 nm) was observed. No change in the color of this blue light emission was observed after 500 hours at 25° C.

Example IV-9

Fabrication of Organic EL Device (IV-2)

A toluene solution (1.0 wt %) of the metal coordination compound-containing copolymer (IV-P-2) obtained in Example IV-6 was applied by spin coating to a glass substrate with a 2 mm wide ITO (indium tin oxide) patterning under an atmosphere of dry nitrogen to give a light-emitting polymer layer (film thickness 70 nm). Subsequently, it was dried by heating at 80° C./5 minutes on a hot plate under an atmosphere of dry nitrogen. The glass substrate thus obtained was transferred to vacuum vapor deposition equipment, and electrodes were formed on the above-mentioned light-emitting layer in the order LiF (film thickness 0.5 nm) and Al (film thickness 100 nm). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the LiF/Al was the negative electrode, at about 5 V emission of orange light ($\lambda$=580 nm) was observed. No change in the color of this orange light emission was observed after 500 hours at 25° C.

Example IV-10

Fabrication of Organic EL Device (IV-3)

An ITO/light-emitting polymer layer/Ca/Al device was fabricated in the same manner as in Example IV-8 except that the metal coordination compound-containing copolymer (IV-P-3) was used instead of the metal coordination compound-containing copolymer (IV-P-1). With regard to the characteristics of the organic EL device at room temperature, current/voltage characteristics were measured using a 4140B picoammeter manufactured by Hewlett-Packard and the luminance was measured using an SR-3 manufactured by Topcon Corporation. When a voltage was applied so that the ITO was the positive electrode and the Ca/Al was the negative electrode, at about 4 V emission of blue light ($\lambda$=455 nm) was observed. No change in the color of this blue light emission was observed after 500 hours at 25° C.

The invention claimed is:

1. A metal coordination compound-containing copolymer comprising:

a metal coordination compound monomer unit represented by any one of Formulae (1) to (6),

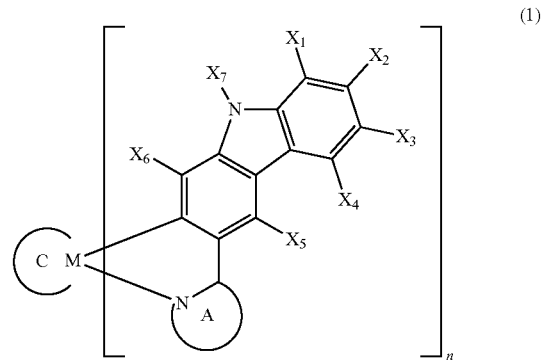

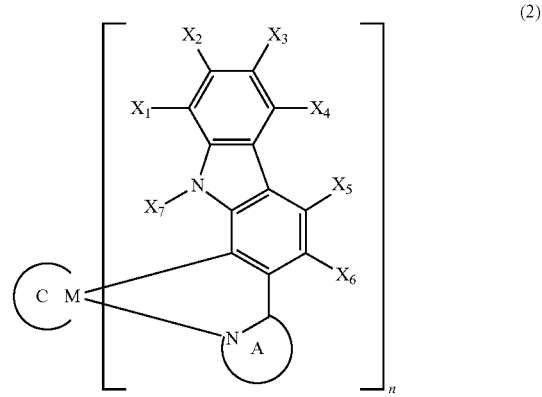

-continued

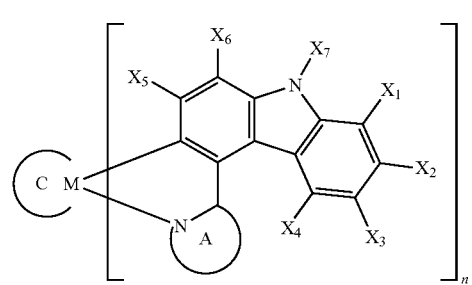

(3)

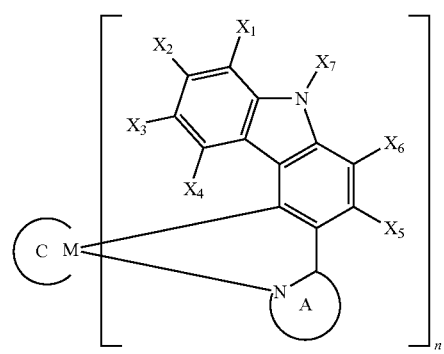

(4)

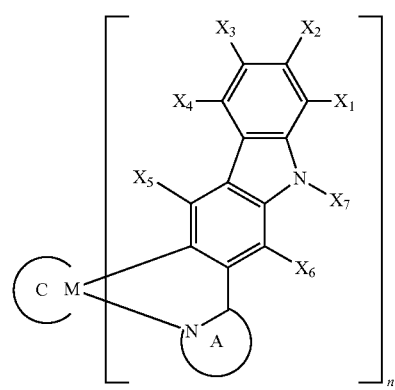

(5)

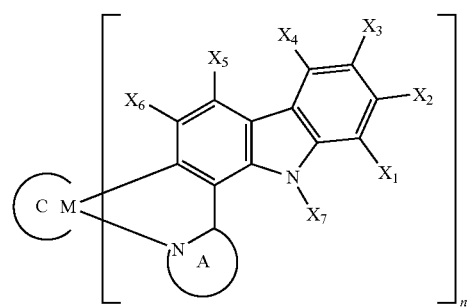

(6)

B: >O, >S, >C=O, >SO₂, >CR₂

(in the formulae, M is Ir, Rh, Ru, Os, Pd, or Pt, and n is 1 or 2; ring A is a cyclic compound containing a nitrogen atom bonded to M; $X_1$ to $X_7$ and R are independently substituents selected from the group consisting of —$R^1$, —$OR^2$, —$SR^3$, —$OCOR^4$, —$COOR^5$, —$SiR^6R^7R^8$, and —$NR^9R^{10}$ (here, $R^1$ to $R^{10}$ are a hydrogen atom, a halogen atom, a cyano group, a nitro group, a C1 to C22 straight-chain, cyclic, or branched alkyl group or a corresponding halogen-substituted alkyl group in which a part or all of the hydrogen atoms are substituted by a halogen atom, a C6 to C30 aryl group, a C2 to C30 heteroaryl group, or a C7 to C30 aralkyl group, or a corresponding halogen-substituted aryl group, halogen-substituted heteroaryl group, or halogen-substituted aralkyl group, in which a part or all of the hydrogen atoms are substituted by a halogen atom, and $R^1$ to $R^{10}$ may be identical to or different from each other), $X_1$ to $X_7$ may be identical to or different from each other, and ring A may have a substituent that is the same as the groups defined by $X_1$ to $X_7$; ring C is a compound that is bonded to M and that bonds to a linking group; and ring C may have a substituent that is the same as the groups defined by $X_1$ to $X_7$); and at least one type of monomer unit selected from the group consisting of a substituted or unsubstituted quinoline monomer unit, a substituted or unsubstituted arylene and/or heteroarylene monomer unit, a substituted or unsubstituted branched monomer unit, and a substituted or unsubstituted conjugated monomer unit.

2. The metal coordination compound-containing copolymer according to claim 1, wherein the copolymer comprises a metal coordination compound monomer unit represented by any one of the Formulae (1) to (6), a substituted or unsubstituted quinoline monomer unit represented by Formulae (13-1),

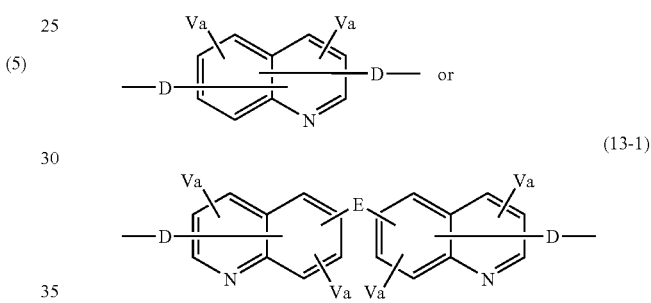

(13-1)

(in the formulae, a plurality of V are independently substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene; and E is a divalent linking group selected from the group consisting of a single bond, —O—, —S—, —C(O)—, —S(O)—, —S(O₂)—, —W—, —(—O—W—)m-O— (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'-, —Ar'—S—Ar'—, —Ar'—S(O)—Ar'—, —Ar'—S(O₂)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and a substituted or unsubstituted arylene and/or heteroarylene monomer unit, the monomer units each being bonded via a linking group represented by Formula (14), -(G)b- (14)

(in the formula, G is a divalent group selected from the group consisting of —O—, —R—O—R—, —S—, —NR—, —CR₂—, —SiR₂—, —SiR₂—O—SiR₂—, and —SiR₂—

O—SiR$_2$—O—SiR$_2$— (here, R is a C1 to C22 straight-chain, cyclic, or branched alkyl group, or a C2 to C30 aryl or heteroaryl group), and b is an integer of 0 or 1).

3. The metal coordination compound-containing copolymer according to claim 1, wherein the copolymer comprises
a metal coordination compound monomer unit represented by any one of the Formulae (1) to (6),
a substituted or unsubstituted quinoline monomer unit represented by Formulae (13-1),

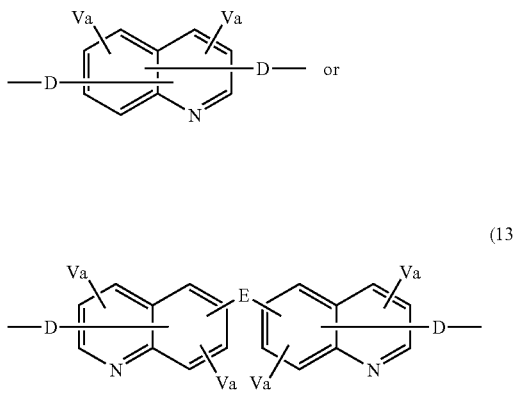

(13-1)

(in the formulae, a plurality of V are independently substituents selected from the group consisting of —R$^1$, —OR$^2$, —SR$^3$, —OCOR$^4$, —COOR$^5$, and —SiR$^6$R$^7$R$^8$ (here, R$^1$ to R$^8$ are a C1 to C22 straight-chain, cyclic, or branched alkyl group, or a C2 to C30 aryl or heteroaryl group), may be identical to or different from each other, and are bonded to a substitutable position of a quinoline residue, and each a is independently an integer of 0 to 3; D is selected from the group consisting of a single bond and arylene; and E is a divalent linking group selected from the group consisting of a single bond, —O—, —S—, —C(O)—, —S(O)—, —S(O$_2$)—, —W—, —(—O—W—)m-O- (m is an integer of 1 to 3), and -Q- [in the formulae, W is a divalent group selected from the group consisting of —Ra—, —Ar'—, —Ra—Ar'—, —Ra'—O—Ra'—, —Ra'—C(O)O—Ra'—, —Ra'—NHCO—Ra'—, —Ra—C(O)—Ra—, —Ar'—C(O)—Ar'—, -Het'-, —Ar'—S—Ar'—, —Ar'—S(O)—Ar'—, —Ar'—S(O$_2$)—Ar'—, and —Ar'-Q-Ar'—; Ra is alkylene, Ar' is arylene, each Ra' is independently a group selected from the group consisting of alkylene, arylene, and a mixed alkylene/arylene group, Het' is heteroarylene, and Q is a divalent group containing a quaternary carbon]), and
a substituted or unsubstituted branched monomer unit, the monomer units each being bonded via a linking group represented by Formula (14),

-(G)b-  (14)

(in the formula, G is a divalent group selected from the group consisting of —O—, —R—O—R—, —S—, —NR—, —CR$_2$—, —SiR$_2$—, —SiR$_2$—O—SiR$_2$—, and —SiR$_2$—O—SiR$_2$—O—SiR$_2$— (here, R is a C1 to C22 straight-chain, cyclic, or branched alkyl group, or a C2 to C30 aryl or heteroaryl group), and b is an integer of 0 or 1).

4. The metal coordination compound-containing copolymer according to claim 1, wherein the copolymer comprises
a metal coordination compound monomer unit represented by any one of the Formulae (1) to (6), and
a substituted or unsubstituted conjugated monomer unit represented by Formula (13-2),

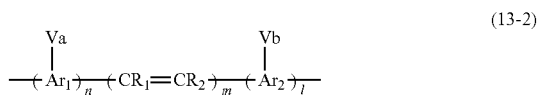

(13-2)

(in the formula, Ar$_1$ and Ar$_2$ are divalent arylene and/or heteroarylene; a plurality of V, and R$_1$ and R$_2$, are independently substituents selected from the group consisting of —R$^1$, —OR$^2$, —SR$^3$, —OCOR$^4$, —COOR$^5$, and —SiR$^6$R$^7$R$^8$ (here, R$^1$ to R$^8$ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; R$_1$ and R$_2$ may independently be a hydrogen atom; n, m, and l are independently 0 or 1, and n, m, and l are not simultaneously 0),
the monomer units each being bonded via a linking group represented by Formula (14),

-(G)b-  (14)

(in the formula, G is a divalent group selected from the group consisting of —O—, —R—O—R—, —S—, —NR—, —CR$_2$—, —SiR$_2$—, —SiR$_2$—O—SiR$_2$—, and —SiR$_2$—O—SiR$_2$—O—SiR$_2$— (here, R is a C1 to C22 straight-chain, cyclic, or branched alkyl group, or a C2 to C30 aryl or heteroaryl group), and b is an integer of 0 or 1).

5. The metal coordination compound-containing copolymer according to claim 1, wherein the copolymer comprises
a metal coordination compound monomer unit represented by any one of the Formulae (1) to (6),
a substituted or unsubstituted conjugated monomer unit represented by Formula (13-2),

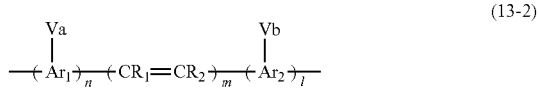

(13-2)

(in the formula, Ar$_1$ and Ar$_2$ are divalent arylene and/or heteroarylene; a plurality of V, and R$_1$ and R$_2$, are independently substituents selected from the group consisting of —R$^1$, —OR$^2$, —SR$^3$, —OCOR$^4$, —COOR$^5$, and —SiR$^6$R$^7$R$^8$ (here, R$^1$ to R$^8$ are a C1 to C22 straight-chain, cyclic, or branched alkyl group, or a C2 to C30 aryl or heteroaryl group), may be identical to or different from each other, and are bonded to a substitutable position of an arylene or heteroarylene residue, and a and b are independently an integer of 0 or greater; $R_1$ and $R_2$ may independently be a hydrogen atom; n, m, and l are independently 0 or 1, and n, m, and l are not simultaneously 0), and a substituted or unsubstituted branched monomer unit, the monomer units each being bonded via a linking group represented by Formula (14), $$-(G)_b-  \qquad (14)$$

(in the formula, G is a divalent group selected from the group consisting of —O—, —R—O—R—, —S—, —NR—, —CR$_2$—, —SiR$_2$—, —SiR$_2$—O—SiR$_2$—, and —SiR$_2$—O—SiR$_2$—O—SiR$_2$— (here, R is a C1 to C22 straight-chain, cyclic, or branched alkyl group, or a C2 to C30 aryl or heteroaryl group), and b is an integer of 0 or 1).

6. The metal coordination compound-containing copolymer according to claim 1, wherein the substituted or unsubstituted branched monomer unit is a branched monomer unit selected from the group consisting of Formulae (15):

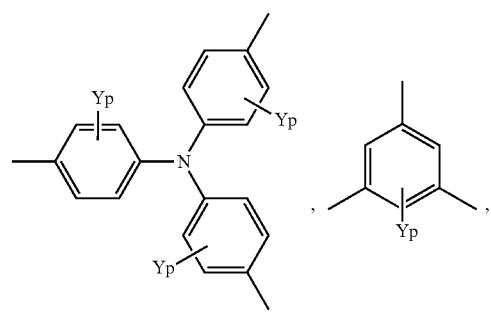

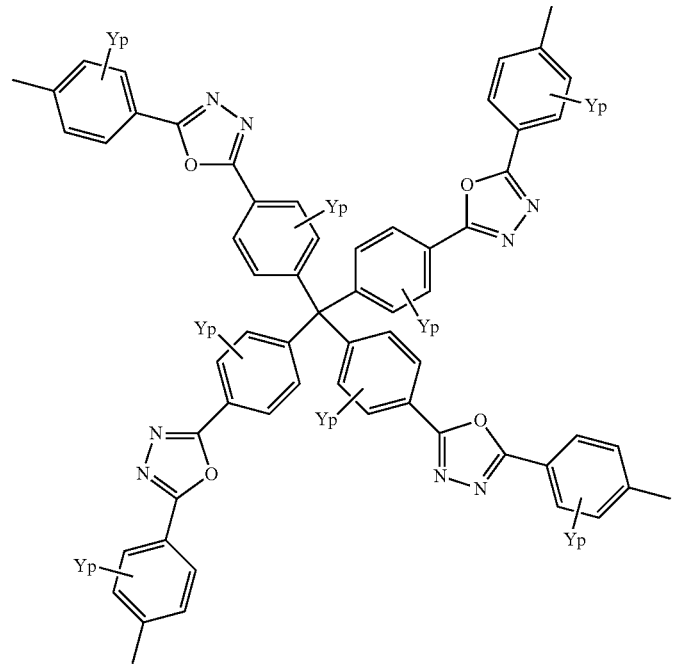

(15)

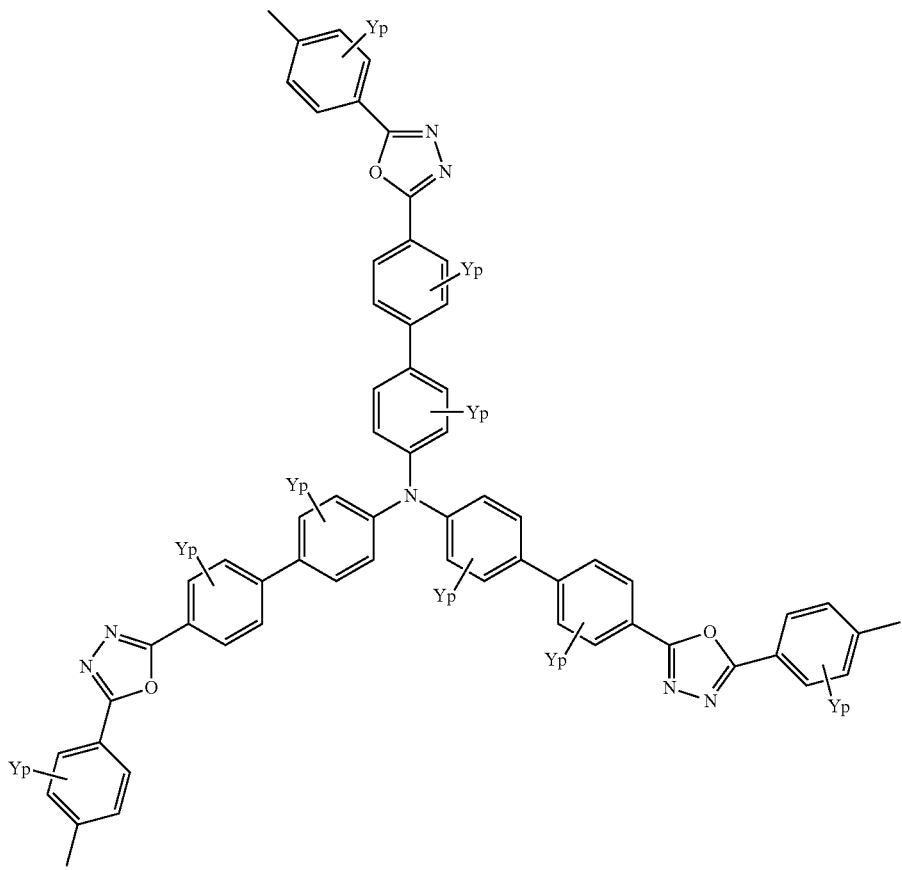
or
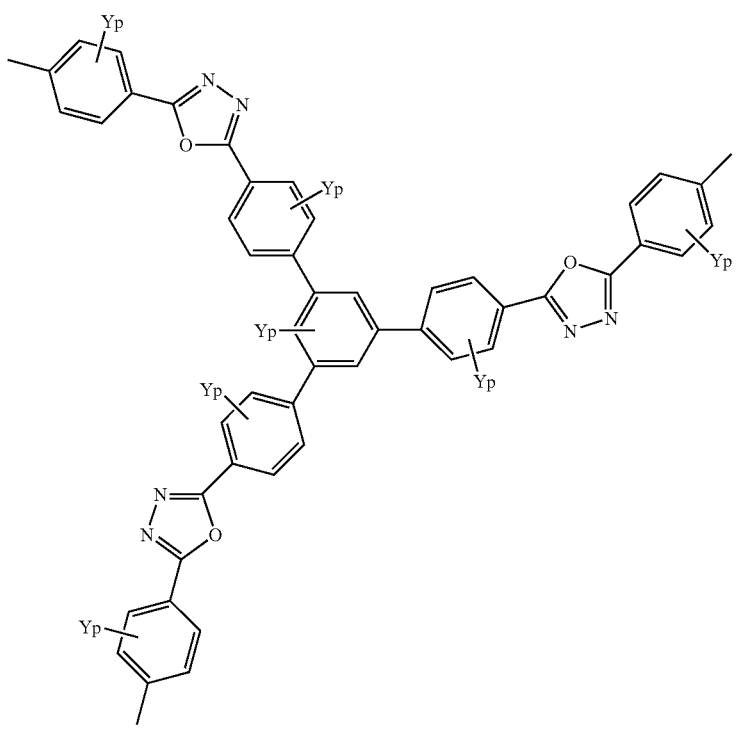

(in the formulae, a plurality of Y are substituents selected from the group consisting of —$R^1$, —$OR^2$, —$SR^3$, —$OCOR^4$, —$COOR^5$, and —$SiR^6R^7R^8$ (here, $R^1$ to $R^8$ are a C1 to C22 straight-chain, cyclic, or branched alkyl group, or a C2 to C30 aryl or heteroaryl group), may be identical to or different from each other, and are bonded to a substitutable position of a benzene ring having a branched skeleton, and p is an integer of 0 to 4).

7. The metal coordination compound-containing copolymer according to claim 1, wherein in the Formulae (I) to (6) ring A is pyridine, quinoline, benzoxazole, benzothiazole, benzimidazole, benzotriazole, imidazole, pyrazole, oxazole, thiazole, triazole, benzopyrazoletriazine, or isoquinoline, which may have a substituent that is the same as the groups defined by $X_1$ to $X_7$.

8. The metal coordination compound-containing copolymer according to claim 1, wherein in the Formulae (1) to (6) at least one of $X_1$ to $X_7$ and the substituent of ring A defined as being the same as $X_1$ to $X_7$ is a fluorine atom or a trifluoromethyl group.

9. The metal coordination compound-containing copolymer according to claim 1, wherein in the Formulae Formulae (1) to (6) M is iridium.

10. A polymer composition comprising the metal coordination compound-containing copolymer according to claim 1 and a conjugated or non-conjugated polymer.

11. An organic electroluminescent device fabricated using the metal coordination compound-containing copolymer according to claim 1.

12. An organic electroluminescent device fabricated using the polymer composition according to claim 10.

* * * * *